(12) United States Patent
Umezawa

(10) Patent No.: US 7,180,789 B2
(45) Date of Patent: Feb. 20, 2007

(54) SEMICONDUCTOR MEMORY DEVICE WITH MOS TRANSISTORS, EACH HAVING A FLOATING GATE AND A CONTROL GATE, AND MEMORY CARD INCLUDING THE SAME

(75) Inventor: Akira Umezawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 19 days.

(21) Appl. No.: 11/087,760

(22) Filed: Mar. 24, 2005

(65) Prior Publication Data

US 2005/0237817 A1 Oct. 27, 2005

(30) Foreign Application Priority Data

Apr. 23, 2004 (JP) ............................. 2004-128576

(51) Int. Cl.
*G11C 16/06* (2006.01)
(52) U.S. Cl. .................... 365/185.28; 365/185.5; 365/185.18; 365/185.23
(58) Field of Classification Search ............ 365/185.05
See application file for complete search history.

(56) References Cited

U.S. PATENT DOCUMENTS

| | | | | |
|---|---|---|---|---|
| 5,099,451 A | * | 3/1992 | Sourgen et al. .......... | 365/185.2 |
| 5,706,228 A | * | 1/1998 | Chang et al. ........... | 365/185.18 |
| 6,757,196 B1 | * | 6/2004 | Tsao et al. ............. | 365/185.17 |
| 7,006,381 B2 | * | 2/2006 | Dormans et al. ........ | 365/185.28 |
| 2005/0035393 A1 | * | 2/2005 | Lung et al. .................. | 257/314 |

OTHER PUBLICATIONS

Ton Ditewig, et al., "An Embedded 1.2V-Read Flash Memory Module in a 0.18μm Logic Process.", IEEE, ISSCC, Session 2, Non-Volatile Memories, Digest of Technical Papers, Salon-1-6, Feb. 5, 2001, 3 pages.
Kenichi Imamiya, et al., "A 125-mm² 1-Gb NAND Flash Memory With 10-MByte/s Program Speed", IEEE Journal of Solid-State Circuits, vol. 37, No. 11, Nov. 2002, pp. 1493-1501.
Wei-Hua Liu, et al., "A 2-Transistor Source-select (2TS) Flash EEPROM for 1.8V-Only Applications", Non-Volatile Semiconductor Memory Workshop 4.1, 1997, pp. 1-3.

* cited by examiner

*Primary Examiner*—Tan T. Nguyen
(74) *Attorney, Agent, or Firm*—Oblon, Spivak, McClelland, Maier & Neustadt, P.C.

(57) ABSTRACT

A semiconductor memory device comprises memory cells, and bit lines. The each of the memory cells has a first MOS transistor and a second MOS transistor. The first MOS transistor includes a floating gate and a control gate. The second MOS transistor has a drain connected to the source of a first MOS transistor. The bit lines connect electrically to drains of the first MOS transistors. In a write operation, a write inhibit voltage settable to a negative voltage is applied to the bit lines unconnected to a selected memory cell in a write operation.

21 Claims, 41 Drawing Sheets

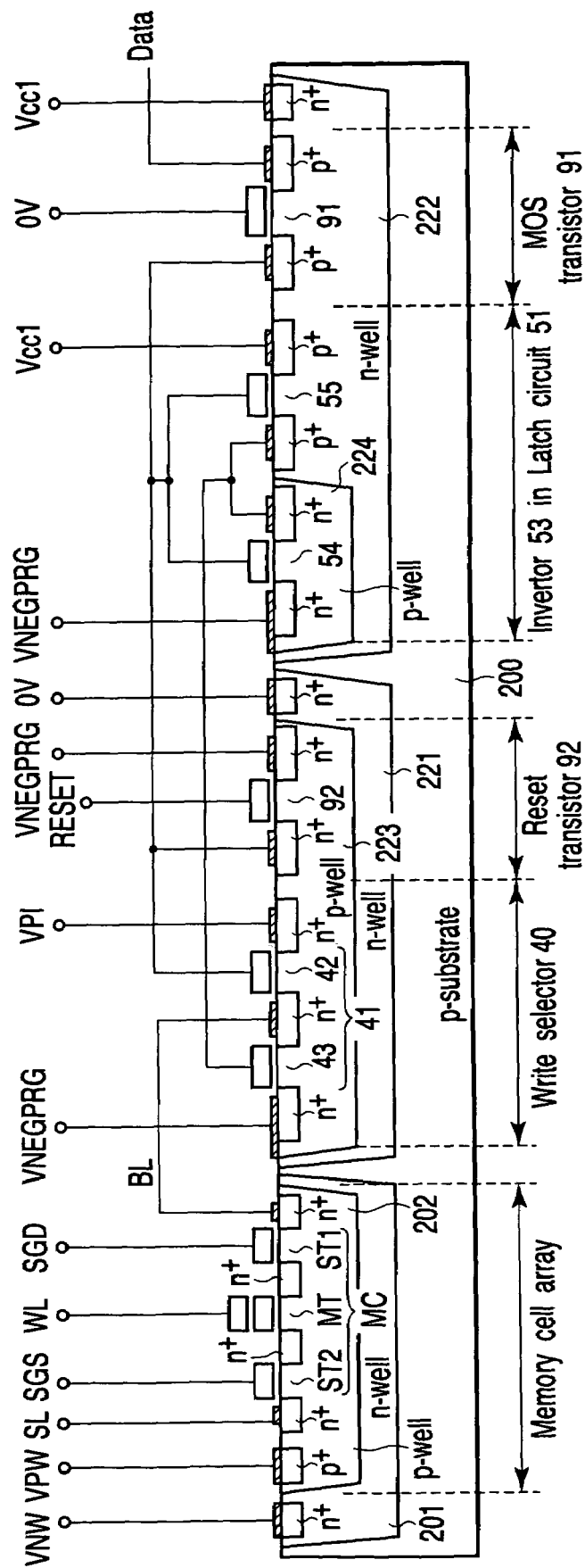
F I G. 7

FIG. 11 WRITE OPERATION

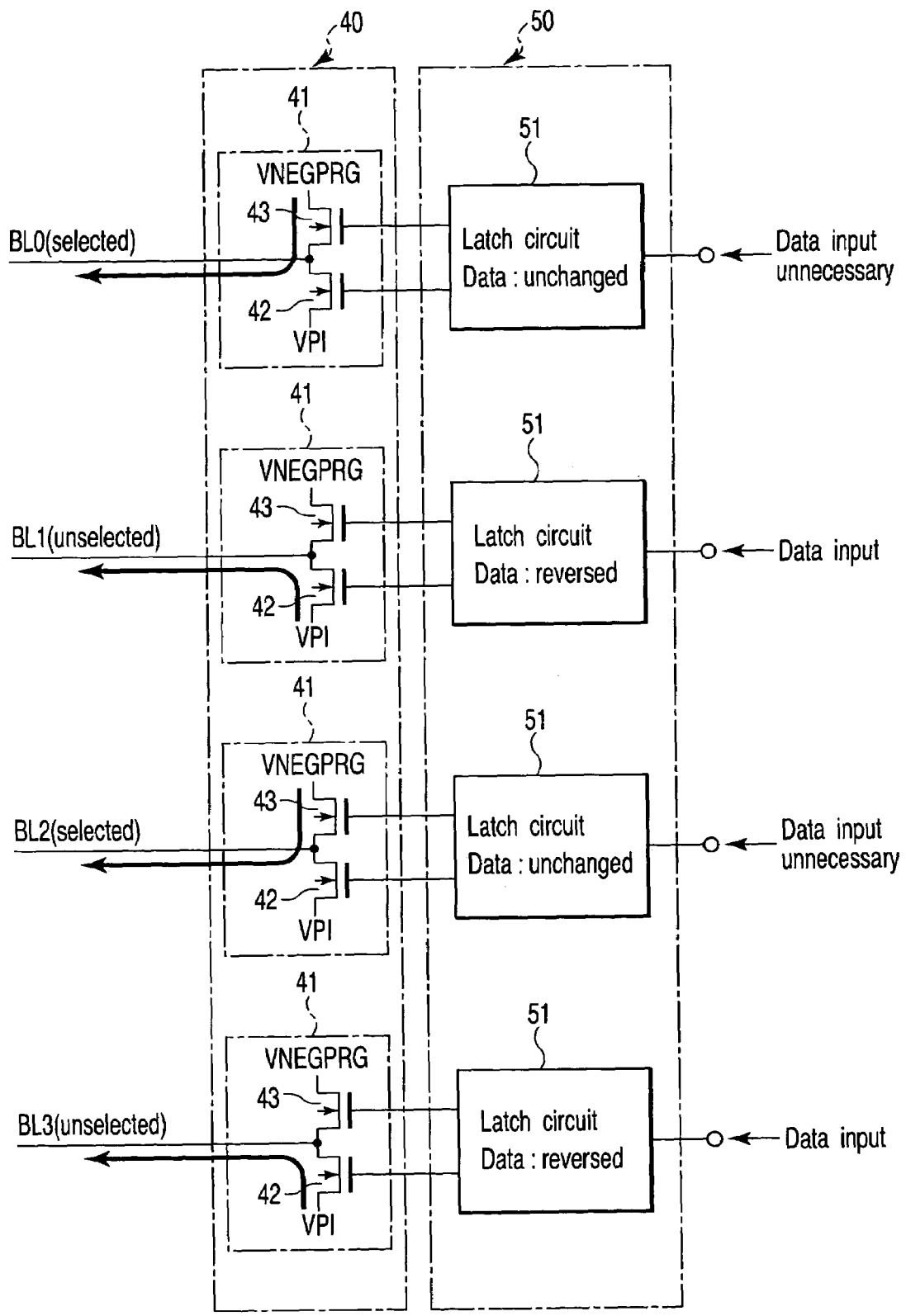
F I G. 15

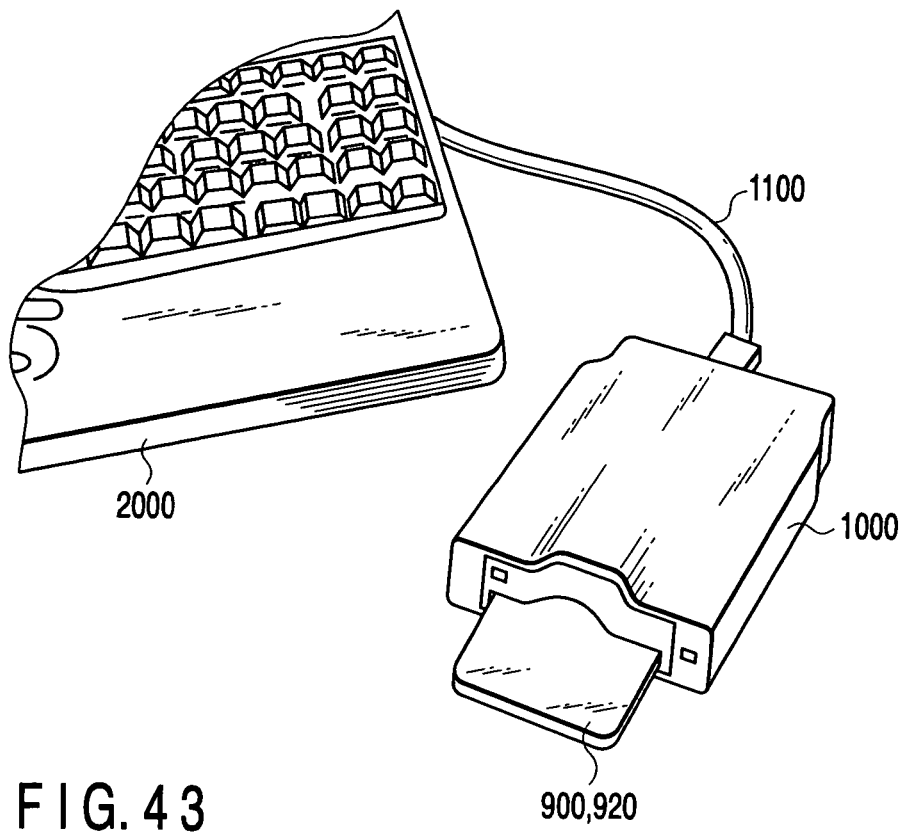
F I G. 4 3
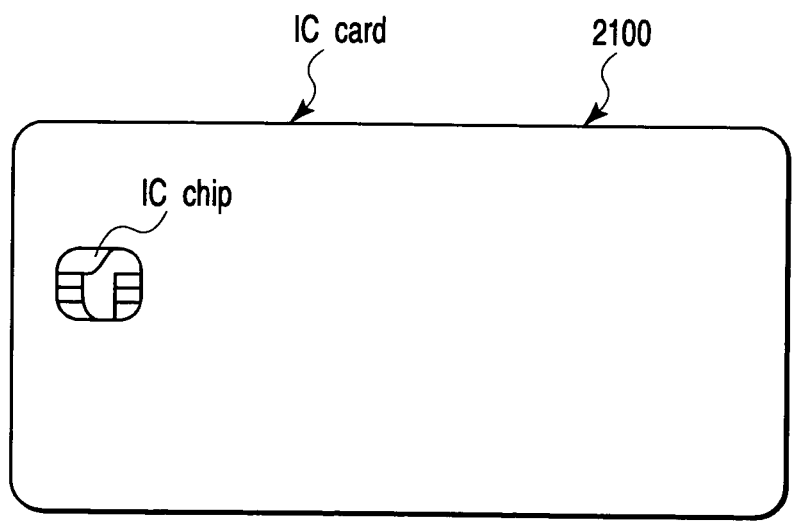
F I G. 4 4

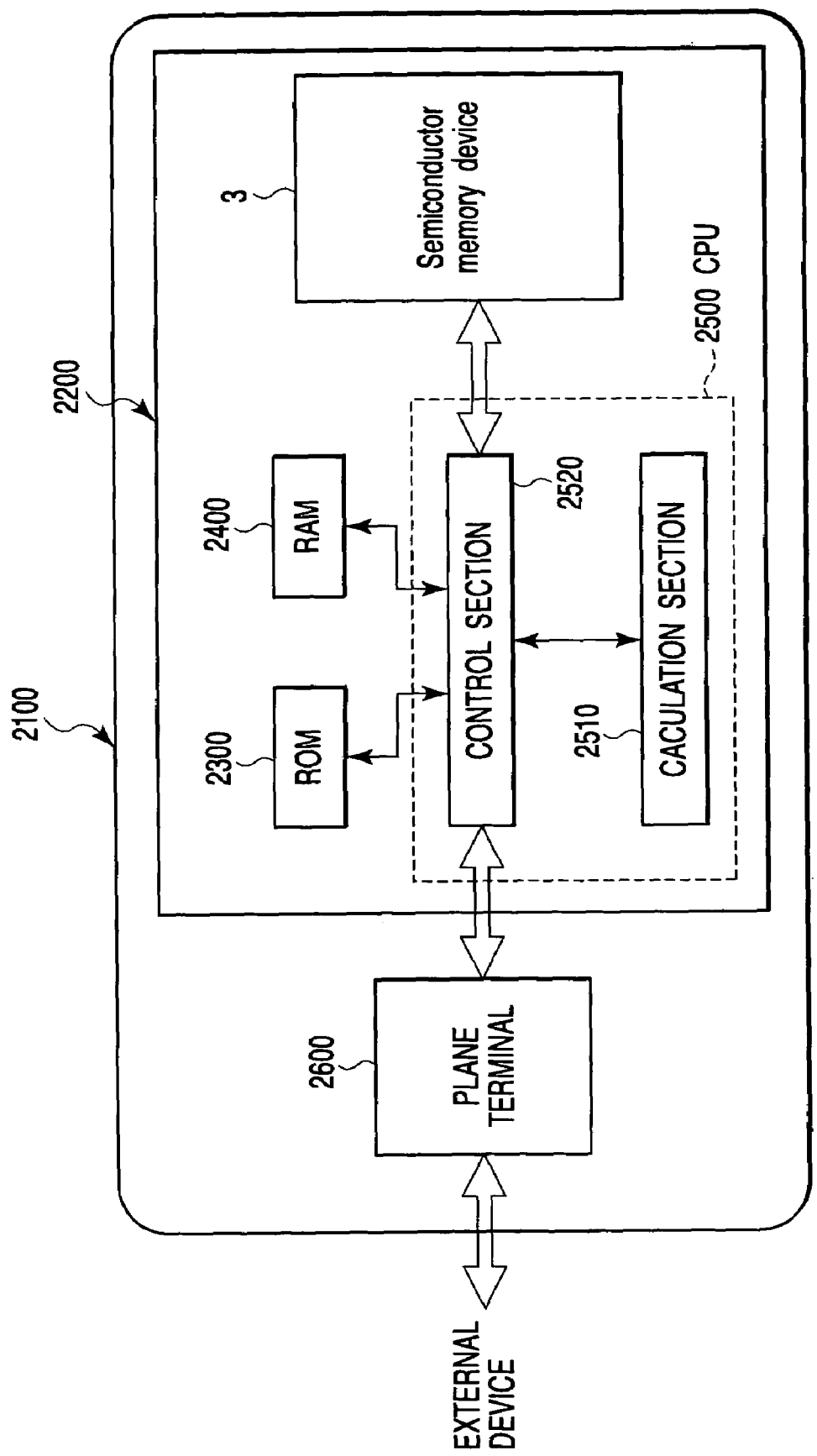
F I G. 45

SEMICONDUCTOR MEMORY DEVICE WITH MOS TRANSISTORS, EACH HAVING A FLOATING GATE AND A CONTROL GATE, AND MEMORY CARD INCLUDING THE SAME

CROSS-REFERENCE TO RELATED APPLICATIONS

This application is based upon and claims the benefit of priority from prior Japanese Patent Application No. 2004-128576, filed Apr. 23, 2004, the entire contents of which are incorporated herein by reference.

BACKGROUND OF THE INVENTION

1. Field of the Invention

This invention relates to a semiconductor memory device and a memory card including the semiconductor memory device. More particularly, this invention relates to a non-volatile semiconductor memory device including MOS transistors, each of which has a floating gate and a control gate.

2. Description of the Related Art

Various types of flash memories have been proposed for a variety of uses.

For instance, a NAND flash memory is known as a data storage memory for use in a digital camera or the like. A NAND flash memory is described in, for example, Imamiya K., et al., "A 125-mm/sup 2/1-Gb NAND Flash Memory With 10-Mbytes/s Program Speed," IEEE Journal of Solid-State Circuits, Vol. 37, No. 11, November, 2002, pp. 1493–1501.

Another known flash memory is a NOR flash memory which writes and erases data by using FN tunneling. A NOR flash memory is described in, for example, Ditewig T., et al., "An Embedded 1.2-V Read Flash Memory Module in a 0.18-µm Logic Process," Solid-State Circuits Conference, 2001 Digest of Technical Papers ISSCC. 2001 IEEE International 5–7, Feb. 2001, pp. 34–35, 425. The NOR flash memory is such that a memory cell has one memory cell transistor and two select transistors (hereinafter, referred to as a 3Tr-NAND flash memory).

Furthermore, in recent years, a flash memory combining the features of the NOR flash memory and the NAND flash memory has been proposed in, for example, Wei-Hua Liu, "A 2-Transistor Source-select (2TS) Flash EEPROM for 1.8-V-Only Application," Non-Volatile Semiconductor Memory Workshop 4.1, 1997. A flash memory of this type has memory cells, each including one memory cell transistor and one select transistor (hereinafter, referred to as a 2Tr flash memory).

In the flash memory, when the data is written, a write inhibit voltage is applied to the unselected bit lines, thereby preventing electrons from being injected into the floating gates (or preventing erroneous writing).

BRIEF SUMMARY OF THE INVENTION

A semiconductor memory device according to an aspect of the present invention comprises: memory cells each of which has a first MOS transistor including a floating gate and a control gate and a second MOS transistor which has a drain connected to the source of a first MOS transistor; and bit lines which are connected electrically to drains of the first MOS transistors, with a write inhibit voltage settable to a negative voltage being applied to the bit lines unconnected to a selected memory cell in a write operation.

A memory card according to an aspect of the present invention comprises a semiconductor memory device which includes: memory cells each of which has a first MOS transistor including a floating gate and a control gate and a second MOS transistor which has a drain connected to the source of a first MOS transistor; and bit lines which are connected electrically to drains of the first MOS transistors, with a write inhibit voltage settable to a negative voltage being applied to the bit lines unconnected to a selected memory cell in a write operation.

BRIEF DESCRIPTION OF THE SEVERAL VIEWS OF THE DRAWING

FIG. 7 is a sectional view taken in the column direction of the 3Tr-NAND flash memory in the first embodiment;

FIG. 12 is a circuit diagram of the memory cell array, write selector, write circuit, and switch group when the 3Tr-NAND flash memory of the first embodiment is erased from;

FIG. 13 is a circuit diagram of the memory cell array when the 3Tr-NAND flash memory of the first embodiment is read from;

FIG. 15 is a circuit diagram of the write selector and write circuit of the 3Tr-NAND flash memory of the first embodiment;

FIG. 22 is a circuit diagram of the memory cell array, write selector, write circuit, and switch group when the NAND flash memory of the second embodiment is erased from;

FIG. 23 is a circuit diagram of the memory cell array when the NAND flash memory of the second embodiment is read from;

FIG. 31 is a circuit diagram of the memory cell array, write selector, write circuit, and switch group when the 2Tr flash memory of the third embodiment is erased from;

FIG. 32 is a circuit diagram of the memory cell array when the 2Tr flash memory of the third embodiment is read from;

FIG. 43 shows the outward appearance of a connection unit which connects with a memory card including a flash memory according to the first to fifth embodiments;

FIG. 44 shows the outward appearance of an IC card including a flash memory according to the first to fifth embodiments; and FIG. 45 is a block diagram of an IC card including a flash memory according to the first to fifth embodiments.

DETAILED DESCRIPTION OF THE INVENTION

A semiconductor memory device according to a first embodiment of the present invention will be explained by reference to FIG. 1.

Figure 1:
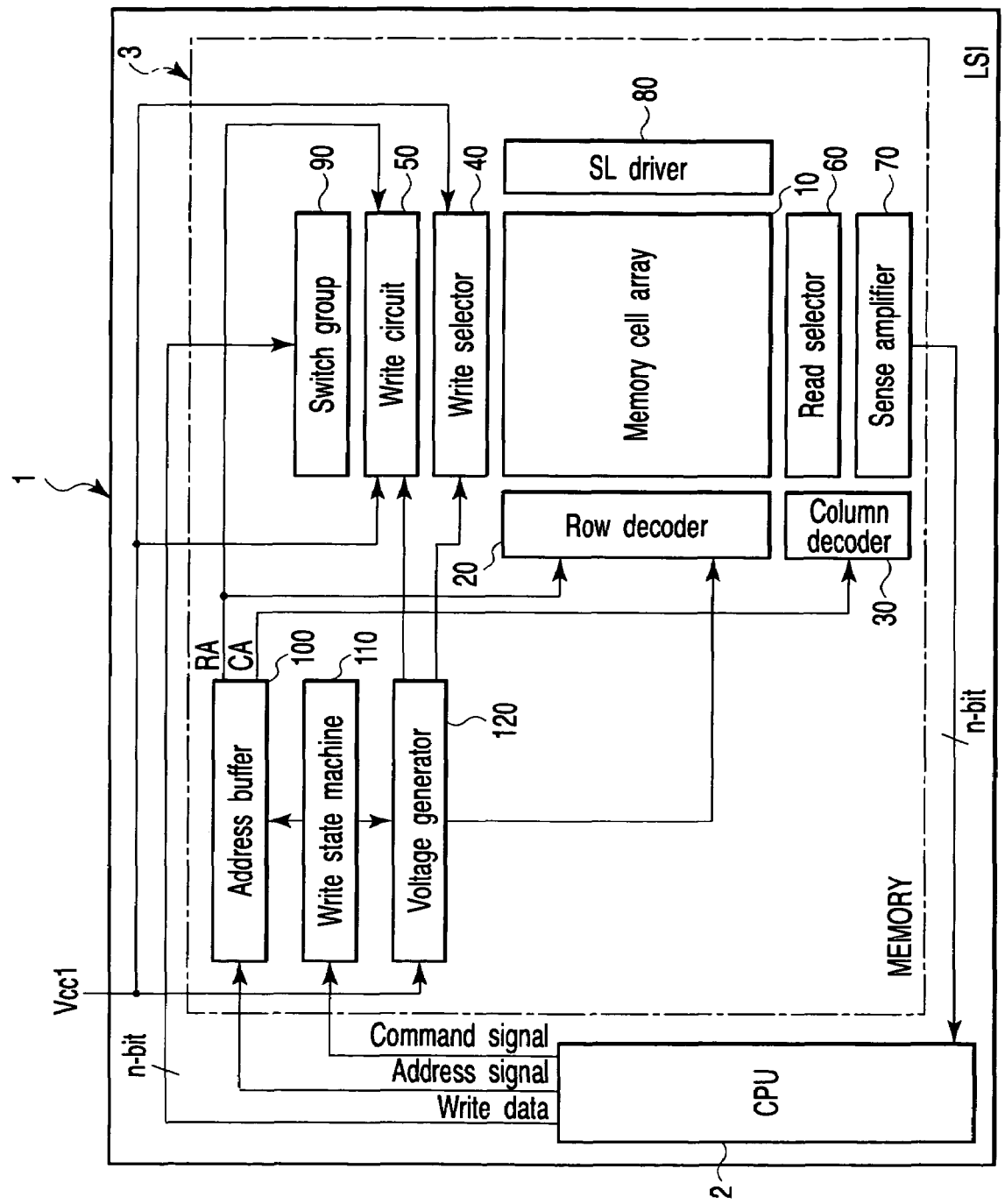
FIG. 1 is a block diagram of a system LSI according to a first embodiment of the present invention.

FIG. 1 is a block diagram of a system LSI according to the first embodiment.

As shown in FIG. 1, the system LSI 1 comprises a CPU 2 and a 3Tr-NAND flash memory 3. The CPU 2 receives/transmits data with the flash memory 3. The flash memory 3 comprises a memory cell array 10, a row decoder 20, a column decoder 30, a write selector 40, a write circuit 50, a read selector 60, a sense amplifier 70, a source line driver 80, a switch group 90, an address buffer 100, a write state machine 110, and a voltage generator circuit 120. A voltage of Vcc1 (for example, 3V) is externally applied to the LSI 1. The voltage Vcc is applied to the voltage generator circuit 120, write circuit 50, and write selector 40.

Figure 2:
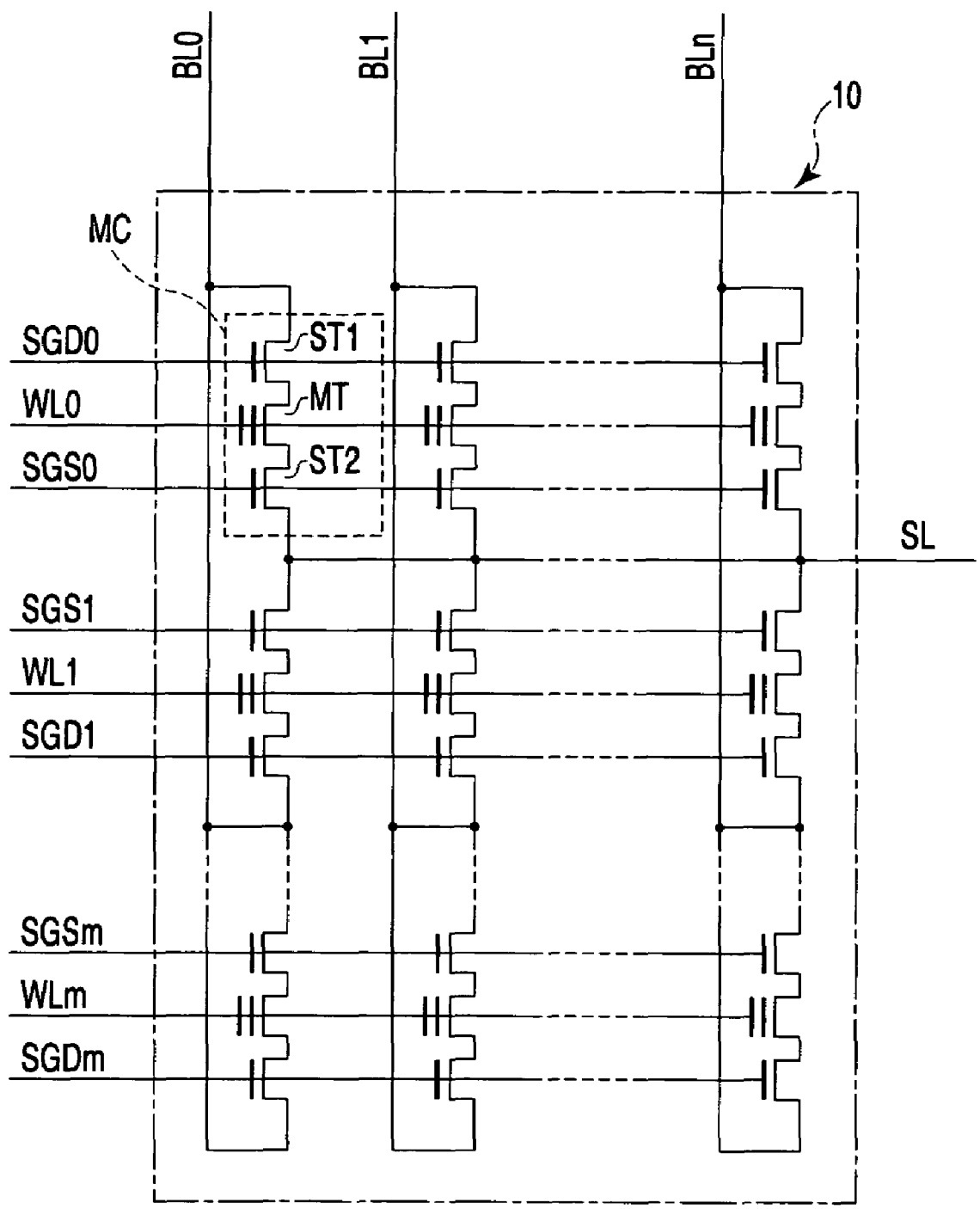
FIG. 2 is a circuit diagram of a memory cell array of a 3Tr-NAND flash memory according to the first embodiment.

The memory cell array 10 has a plurality of memory cells arranged in a matrix. The configuration of the memory cell array 10 will be explained by reference to FIG. 2. FIG. 2 is a circuit diagram of a part of the memory cell array 10.

As shown in FIG. 2, the memory cell array 10 has a a plurality of ((m+1)×(n+1)) memory cells MCs (m and n are natural numbers) arranged in a matrix. Each of the memory cell MCs includes a memory cell transistor MT and select transistors ST1, ST2, which have their current paths connected in series. The current path of the memory cell transistor MT is connected between the current paths of the select transistors ST1, ST2. The memory cell transistor MT has a stacked gate structure that includes a floating gate formed on a semiconductor substrate with a gate insulating film interposed therebetween and a control gate on the floating gate with an inter-gate insulating film interposed therebetween. The source region of the select transistor ST1 is connected to the drain region of the memory cell transistor MT. The source region of the memory cell transistor MT is connected to the drain region of the select transistor ST2. Memory cells adjoining each other in the column direction share the drain region of the select transistor ST1 or the source region of the select transistor ST2.

The control gates of the memory cell transistors MTs of the memory cells MCs in a same row are connected commonly to any one of the word lines WL0 to WLm. The gates of the select transistors ST1 of the memory cells in a same row are connected commonly to any one of select gate lines SGD0 to SGDm. The gates of the select transistors ST2 of the memory cells in a same row are connected commonly to any one of select gate lines SGS0 to SGSm. The drain regions of the select transistors ST1 of the memory cells MCs in a same column are connected commonly to any one of bit lines BL0 to BLn. The sources of the select transistors ST2 of the memory cells MCs are connected commonly to a source line SL and then connected to the source line driver 80.

Referring to FIG. 1, the explanation of the LSI 1 will be continued.

The row decoder 20 decodes a row address signal, thereby producing a row address decode signal. Then, the row decoder 20 selects any one of the word lines WL0 to WLm and select gate lines SGS0 to SGDm.

The column decoder 30 decodes a column address signal, thereby producing a column address decode signal.

The read selector 60 selects any one of the bit lines BL0 to BLn on the basis of the column address decode signal in a read operation.

The sense amplifier 70 amplifies the data read from the memory cell MC selected by the row decoder 20 and column decoder 30.

The write circuit 50 latches write data.

The write selector 40 applies a write voltage to the selected bit line and a write inhibit voltage to the unselected bit lines.

The switch group 90 transfers the write data supplied from the CPU 2 to the write circuit 50.

Figure 3:
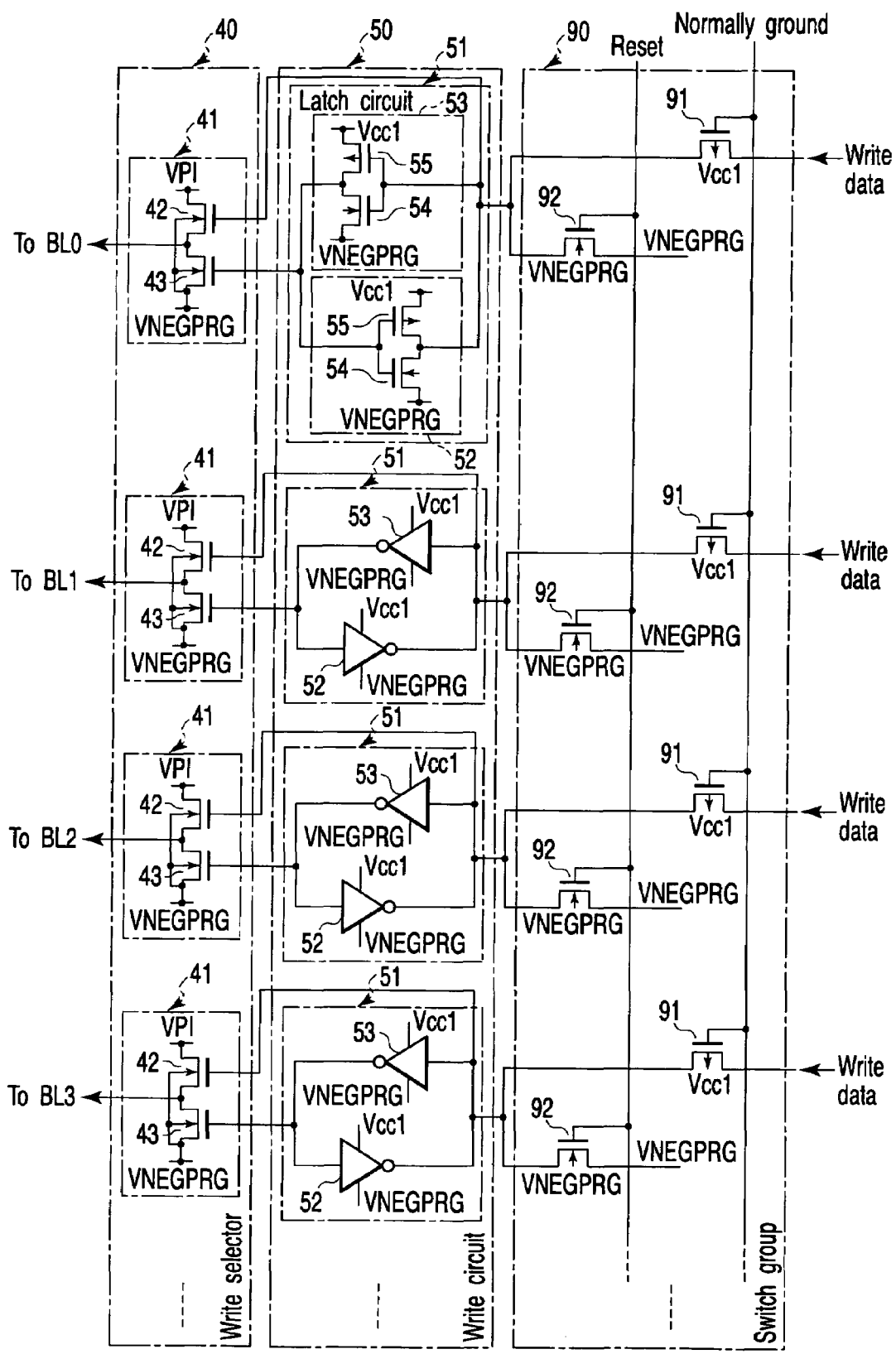
FIG. 3 is a circuit diagram of a write selector, a write circuit, and a switch group of the 3Tr-NAND flash memory according to the first embodiment.

The configuration of the write circuit 50, write selector 40, and switch group 90 will be explained by reference to FIG. 3. FIG. 3 is a circuit diagram of the write circuit 50, write selector 40, and switch group 90.

First, the write selector 40 will be explained. The write selector 40 has select circuits 41 provided for the bit lines BL0 to BLn in a one-to-one correspondence. Each of the select circuits 41 includes two n-channel MOS transistors 42, 43. A write inhibit voltage of VPI is applied to the source of the n-channel MOS transistor 42. The drain of the n-channel MOS transistor 42 is connected to the corresponding bit line. A write voltage of VNEGPRG is applied to the source of the n-channel MOS transistor 43. The drain of the n-channel MOS transistor 43 is connected to the corresponding bit line and to the drain of the n-channel MOS transistor 42. The write voltage VNEGPRG is applied to the back gates of the n-channel MOS transistors 42, 43.

Next, the write circuit 50 will be explained. The write circuit 50 has latch circuits 51 provided for the bit lines BL0 to BLn in a one-to-one correspondence. Each of the latch circuits 51 includes two inverters 52, 53. The input terminal of the inverter 52 is connected to the output terminal of the inverter 53. The output terminal of the inverter 52 is connected to the input terminal of the inverter 53. The junction node of the input terminal of the inverter 52 and the output terminal of the inverter 53, which is the output node of the latch circuit 51, is connected to the corresponding bit line. Each of the inverters 52, 53 includes an n-channel MOS transistor 54 and a p-channel MOS transistor 55 whose current paths are connected in series. The write voltage VNEGPRG is applied to the source of the n-channel MOS transistor 54. Vcc1 (=3V constant) is applied to the source of the p-channel MOS transistor 55. That is, the inverters 52, 53 operate using Vcc1 and VNEGPRG as a low-voltage-side and high-voltage-side power-supply voltages, respectively. The gate of the n-channel MOS transistor 54 and the gate of the p-channel MOS transistor 55 are connected to each other. The junction node of the drain of the p-channel MOS transistor 55 and the drain of the n-channel MOS transistor 54 in the inverter 53 is connected to the junction node of the gate of the p-channel MOS transistor 55 and the gate of the n-channel MOS transistor 54 in the inverter 52 and is further connected to the corresponding bit line. The junction node of the drain of the p-channel MOS transistor 55 and the drain of the n-channel MOS transistor 54 in the inverter 52 is connected to the junction node of the gate of the p-channel MOS transistor 55 and the gate of the n-channel MOS transistor 54 in the inverter 53. The junction node is the input node of the latch circuit 51.

The switch group 90 has p-channel MOS transistors 91 and n-channel MOS transistors 92 (hereinafter, the MOS transistors 92 are referred to as the reset transistors) provided for the latch circuits 51 in a one-to-one correspondence. Write data is inputted to one end of the current path of each of the p-channel MOS transistors 91. The other end of the current path is connected to the input node of the corresponding latch circuit 51. The gate of the MOS transistor 91 is constantly grounded. Vcc1 is applied to the back gate of the MOS transistor 91. The write voltage VNEGPRG is applied to one end of the current path of the reset transistor and its back gate. The other end of the current path of the reset transistor is connected to the input node of the corresponding latch circuit and the other end of the current path of the p-channel MOS transistor 91. The gates of all the reset transistors 92 are connected commonly and supplied with a reset signal RESET. The one ends of current paths of all the reset transistors 92 are connected commonly and applied with VNEGPRG.

Referring to FIG. 1, the explanation of LSI 1 will be continued.

The source line driver 80 supplies a voltage to the source line SL.

The address buffer 100 holds an address signal supplied from the CPU 2. Then, the address buffer 100 supplies a column address signal CA to the column decoder 30 and a row address signal RA to the row decoder 20 and to the write circuit 50.

The write state machine 110 controls the operation of each circuit included in the flash memory 3 on the basis of a command signal supplied from the CPU 2, thereby performing timing control in writing, erasing, or reading data, and executing a specific algorithm determined for each operation.

Figure 4:
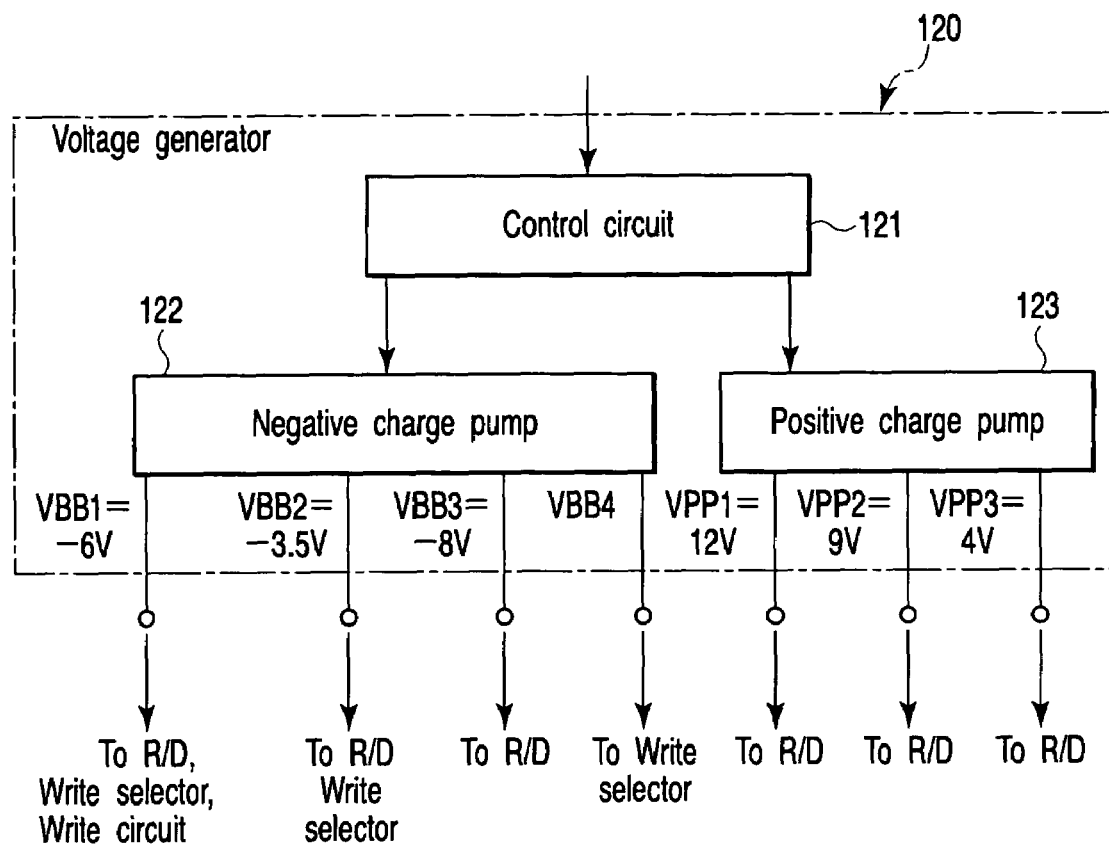
FIG. 4 is a block diagram of a voltage generator circuit of the 3Tr-NAND flash memory according to the first embodiment.

The voltage generator circuit 120 generates a plurality of internal voltages on the basis of the voltage Vcc1 externally inputted. FIG. 4 is a circuit diagram of the voltage generator circuit 120. As shown in FIG. 4, the voltage generator circuit 120 includes a control circuit 121, a negative charge pump circuit 122, and a positive charge pump circuit 123. The control circuit 121 controls the charge pump circuits 122, 123. The charge pump circuit 122 generates negative voltages of VBB1 (=−6V), VBB2 (=−3.5V), VBB3 (=−8V), and VBB4. The charge pump circuit 123 generates positive voltages of VPP1 (=12V), VPP2 (=9V), and VPP3 (=4V). The negative voltages VBB1 to VBB3 and the positive voltages VPP1 to VPP3 are supplied to the row decoder 20. The negative voltages VBB1, VBB2, and VBB4 are supplied to the write selector 40. The negative voltage VBB1 is also supplied to the write circuit 50.

Figure 5:
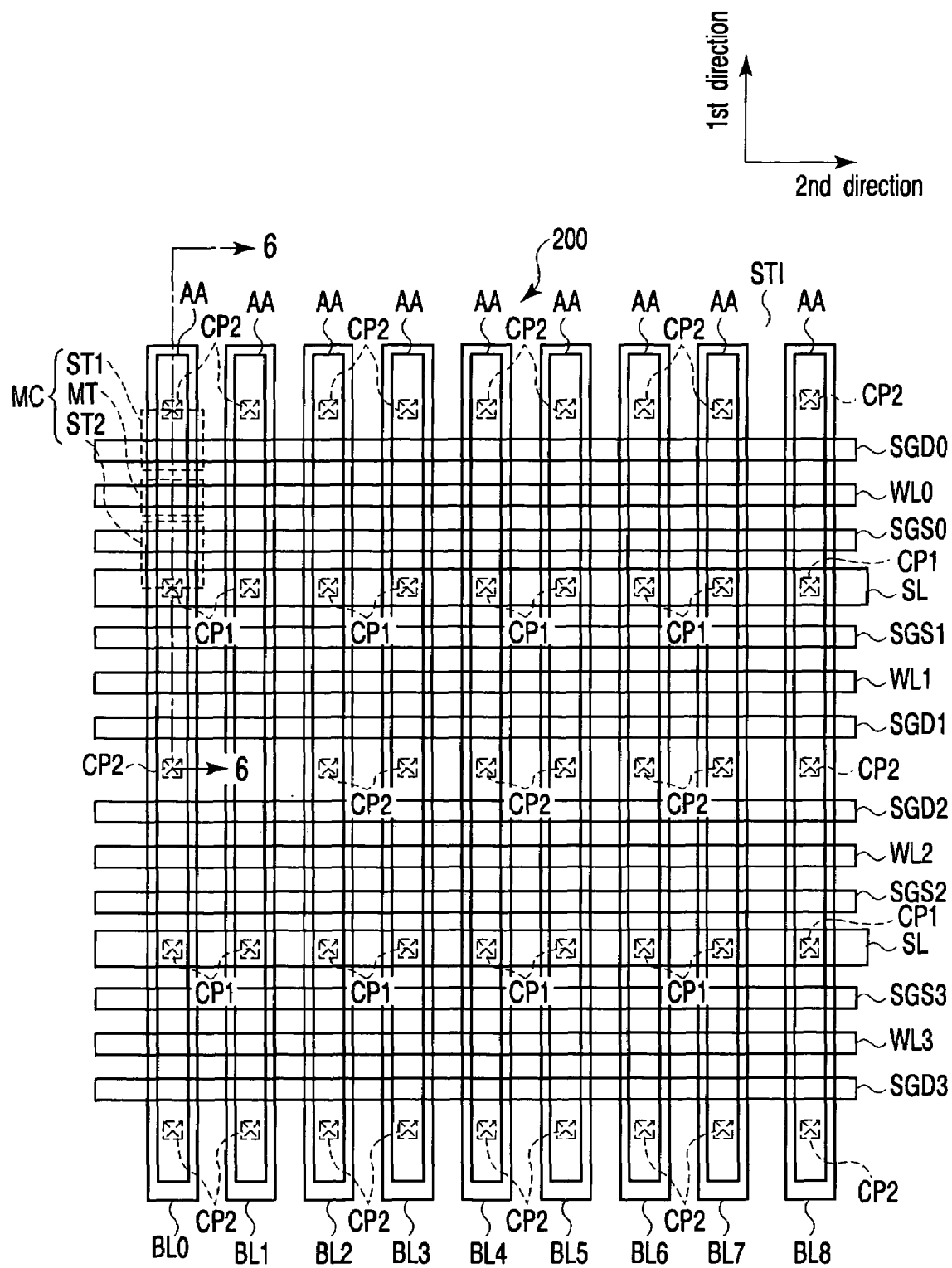
FIG. 5 is a plan view of the memory cell array of the 3Tr-NAND flash memory according to the first embodiment.

Next, a plane configuration and a sectional configuration of the memory cell array 10 included in the 3Tr-NAND flash memory 3 will be explained. FIG. 5 is a plan view of a part of the memory cell array 10.

As shown in FIG. 5, in the semiconductor substrate 200, a plurality of strip-shaped element regions AAs extending in a first direction are formed in a second direction. Strip-shaped word lines WL0 to WLm and select gate lines SGD0 to SGDm, SGS0 to SGSm, which extend in the second direction, are formed so as to cross the plurality of element regions AAs. That is, one of the word lines WL0 to WLm is sandwiched between any one of the select gate lines SGD0 to SGDm and any one of the select gate lines SGS0 to SGSm. In the regions where the word lines WL0 to WLm cross the element regions AAs, memory cell transistors MTs are formed. In the regions where the select gate lines SGD0 to SGDm cross the element regions AAs, select transistors ST1 are formed. In the regions where the select gate lines SGS0 to SGSm cross the element regions AAs, select transistors ST2 are formed. Furthermore, in the regions where the word lines WL0 to WLm cross the element regions AAs, floating gates (not shown) isolated on a memory cell transistor MT basis are formed. Like the memory cell transistor MT, each of the select transistors ST1, ST2 has a control gate and a floating gate. However, differently from the memory cell transistor MT, the floating gate is connected to both of the select transistors STs adjacent to each other in the second direction. Then, in a shunt region (not shown), the floating gate of the select transistors STs is connected to their control gates.

On the source region of each of the select transistors ST2, a strip-shaped source line SL extending in the second direction is formed. The source line SL is connected to the source regions of the select transistors ST2 via contact plugs CP1. The individual source lines SLs are connected to one another in a region (not shown). The common connection is further connected to a source line driver 80.

On the element regions AAs, strip-shaped bit lines BL0 to BLn extending in the first direction are formed. The bit line BL0 to BLn are connected to the drain regions of the select transistors ST1 via contact plugs CP2.

Figure 6:
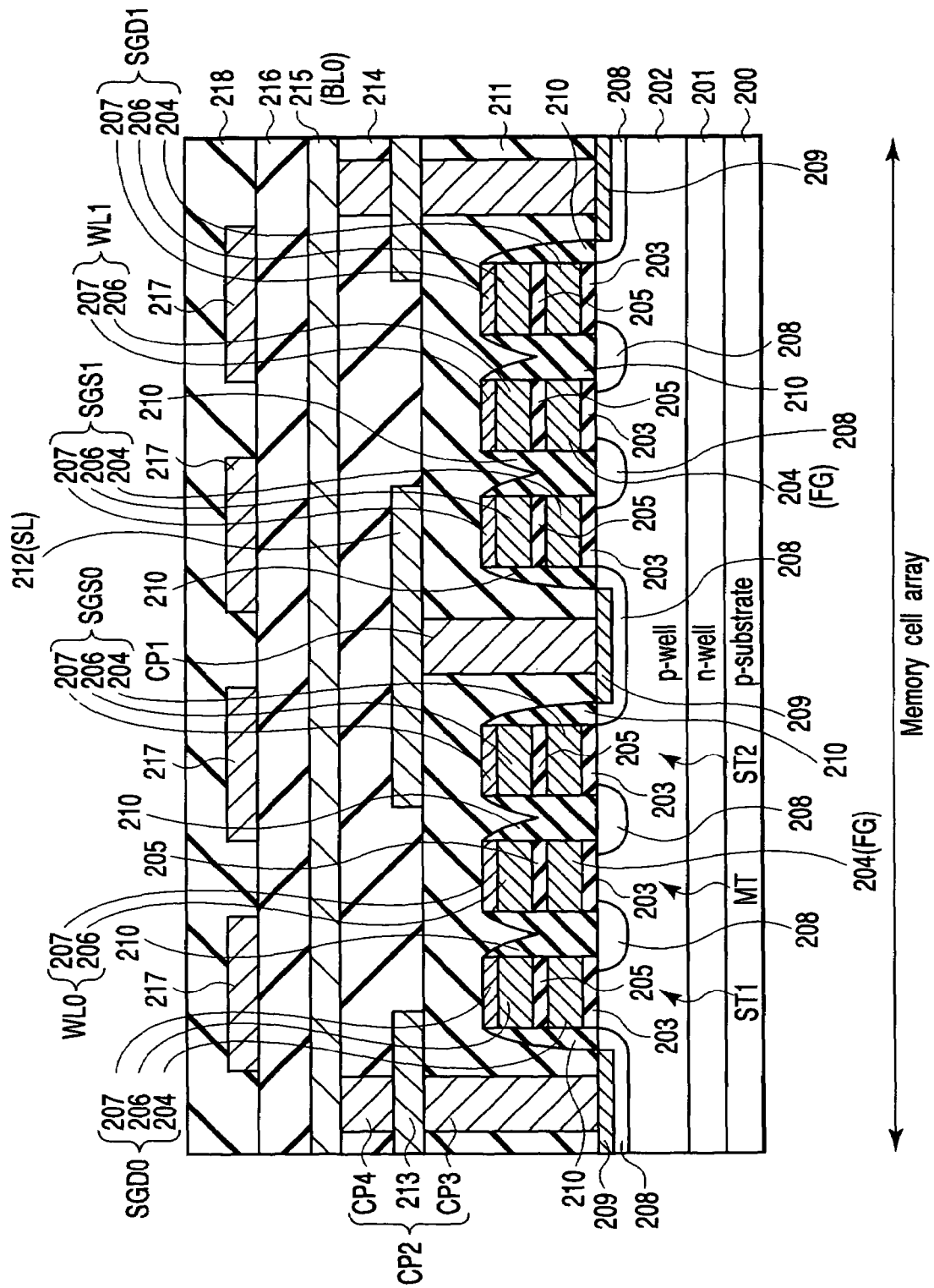
FIG. 6 is a sectional view taken along line 6—6 of FIG. 5.

FIG. 6 is a sectional view taken along line 6—6 of FIG. 5.

As shown in FIG. 6, at the surface of the element region AA of the p-type semiconductor (silicon) substrate 200, an n-well region 201 is formed. At the surface of the n-well region 201, a p-well region 202 is formed. On the p-well region 202, a gate insulating film 203 is formed. On the gate insulating film 203, the gate electrodes of memory cell transistors MTs and select transistors ST1, ST2 are formed. Each of the gate electrodes of the memory cell transistors MT and select transistors ST1, ST2 includes a polysilicon layer 204 formed on the gate insulating film 203, an inter-gate insulating-film 205 formed on the polysilicon layer 204, a polysilicon layer 206 formed on the inter-gate insulating film 205, and a silicide layer 207 formed on the polysilicon layer 206. The inter-gate insulating film 205 is formed of, for example, an ON film, an NO film, or an ONO film. In the memory cell transistor MT, the polysilicon layers 204, which are separated from one another between element regions AAs adjoining in the word line direction, function as floating gates (FG). In addition, the polysilicon layer 206 and silicide layer 207 function as control gates (word lines WLs). The polysilicon layers 206 are connected to one another between element regions AAs adjoining in the word line direction. In the select transistors ST1, ST2, a part of the inter-gate insulating film 205 is removed in a shunt region (not shown) and the polysilicon layers 204, 206 are connected electrically in the shut region. Then, the polysilicon layers 204, 206 and the silicide layer 207 function as select gate lines SGS, SGD. In the select transistors ST1, ST2, the polysilicon layer 204 and polysilicon layer 206 are not separated between element regions AAs adjoining in the word line direction and are connected to each other. That is, the floating gates are not separated on a cell basis differently from the memory cell transistor MT, but are all connected to one another.

At the surface of the semiconductor substrate 200 located between adjoining gate electrodes, impurity diffused layers 208 functioning as source or drain region are formed. Each impurity diffused layer 608 is shared by adjoining transistors. Specifically, an impurity diffused layer 208 between two adjoining select transistors ST1 functions as a drain region for the two select transistors ST1. An impurity diffused layer 208 between two adjoining select transistors ST2 functions as a source region for the two select transistors ST2. An impurity diffused layer 208 between a memory cell transistor MT and a select transistor ST1 adjacent to each other functions as the drain region of the memory cell transistor MT and the source region of the select transistor ST1. Moreover, an impurity diffused layer 208 between a memory cell transistor MT and a select transistor ST2 adjacent to each other functions as the source region of the memory cell transistor MT and the drain region of the select transistor ST2. At the surface of the drain region of the select transistor ST1 and at the surface of the source region 35 of the select transistor ST2, a silicide layer 209 is formed. In the source and drain regions 208 of the memory cell transistor MT, in the source region 208 of the select transistor ST1, and in the drain region 208 of the select transistor ST2, no silicide layer is formed. On the side of the gate electrode (stacked gate) of each of the memory cell transistor MT and select transistors, a sidewall insulating film 210 is formed. The sidewall insulating film 210 is formed on the side facing the source region 208 of the stacked gate and on the side facing its drain region 208. The region between the stacked gates of the memory cell transistor MT and select transistors STs is filled with the sidewall insulating film 210. Thus, the top of the source and drain regions of the memory cell transistor MT, the top of the source region of the select transistor ST1, and the top of the drain region of the select transistor ST2 are covered with the sidewall insulating film 210.

On the semiconductor substrate 200, an interlayer insulating film 211 is formed so as to cover the memory cell transistors MTs and select transistors ST1, ST2. In the interlayer insulating film 211, a contact plug CP5 is formed which reaches the silicide layer 209 formed in the source region 208 of the select transistor ST2. On the interlayer insulating film 211, a metal wiring layer 212 to be connected to the contact plug CP5 is formed. The metal wiring layer 212 functions as a source line SL. In the interlayer insulating film 211, a contact plug CP3 is formed which reaches the silicide layer 209 formed in the drain region 208 of the select transistor ST1. On the interlayer insulating film 211, a metal wiring layer 213 to be connected to the contact plug CP3 is formed.

On the interlayer insulating film 211, an interlayer insulating film 214 is formed so as to cover the metal wiring layers 212, 213. In the interlayer insulating film 214, a contact plug CP4 reaching the metal wiring layer 213 is formed. On the interlayer insulating film 214, a metal wiring layer 215 connected commonly to a plurality of contact plugs CP4 is formed. The metal wiring layer 215 functions as a bit line BL. The contact plugs CP3, CP4, and metal wiring layer 213 correspond to the contact plugs CP2 in FIG. 5.

On the interlayer insulating film 214, an interlayer insulating film 216 is formed so as to cover the metal wiring layer 215. On the interlayer insulating film 216, a metal wiring layer 217 is formed. The metal wiring layer 217, which is connected to the silicide layers 207 of the select transistors ST1, ST2 in a region (not shown), functions as the shunt wiring lines of the select gate lines SGD, SGS. On the interlayer insulating film 216, an interlayer insulating film 218 is formed so as to cover the metal wiring layer 217.

Next, a sectional configuration in the column direction of the memory cell array 10, write selector 40, latch circuit 50, and switch group 90 will be explained briefly. FIG. 7 is a sectional view of the memory cell array 10, write selector 40, latch circuit 50, and switch group 90. FIG. 7 particularly shows only one memory cell MC, one select circuit 41, one inverter 53, and MOS transistors 91, 92.

As shown in FIG. 7, at the surface of the semiconductor substrate 200, n-well regions 201, 220, 221 isolated from one another are formed. The n-well region 201 is for forming a memory cell array 10. The n-well 221 is for forming a write selector 40 and a reset transistor 92. The n-well region 222 is for forming a latch circuit 51 and a MOS transistor 91.

At the surface of the n-well region 201, a p-well region 202 is formed. Then, on the p-well region 202, a memory cell MC is formed. Although each of the select transistors ST1, ST2 in the memory cell is shown as a single-layer gate, it may have a stacked gate structure as does the memory cell transistor MT. A potential of VPW is applied to the p-well region 202 and a potential of VNW is applied to the n-well region 201.

At the surface of the n-well region 221, a p-well region 223 is formed. On the p-well region 223, MOS transistors 42, 43 in the select circuit 41 are formed and a reset transistor 92 is also formed. The potential VNEGPRG is applied to the p-well region 223 and 0V is applied to the n-well region 221.

At the surface of the n-well region 222, a p-well region 224 is formed. On the p-well region 224, a MOS transistor 54 is formed. On the n-well region 222, MOS transistors 55, 91 are formed. The MOS transistors 54, 55 form inverters 52, 53. The potential VNEGPRG is applied to the p-well region 224 and the potential Vcc1 is applied to the n-well region 222.

Figure 8:
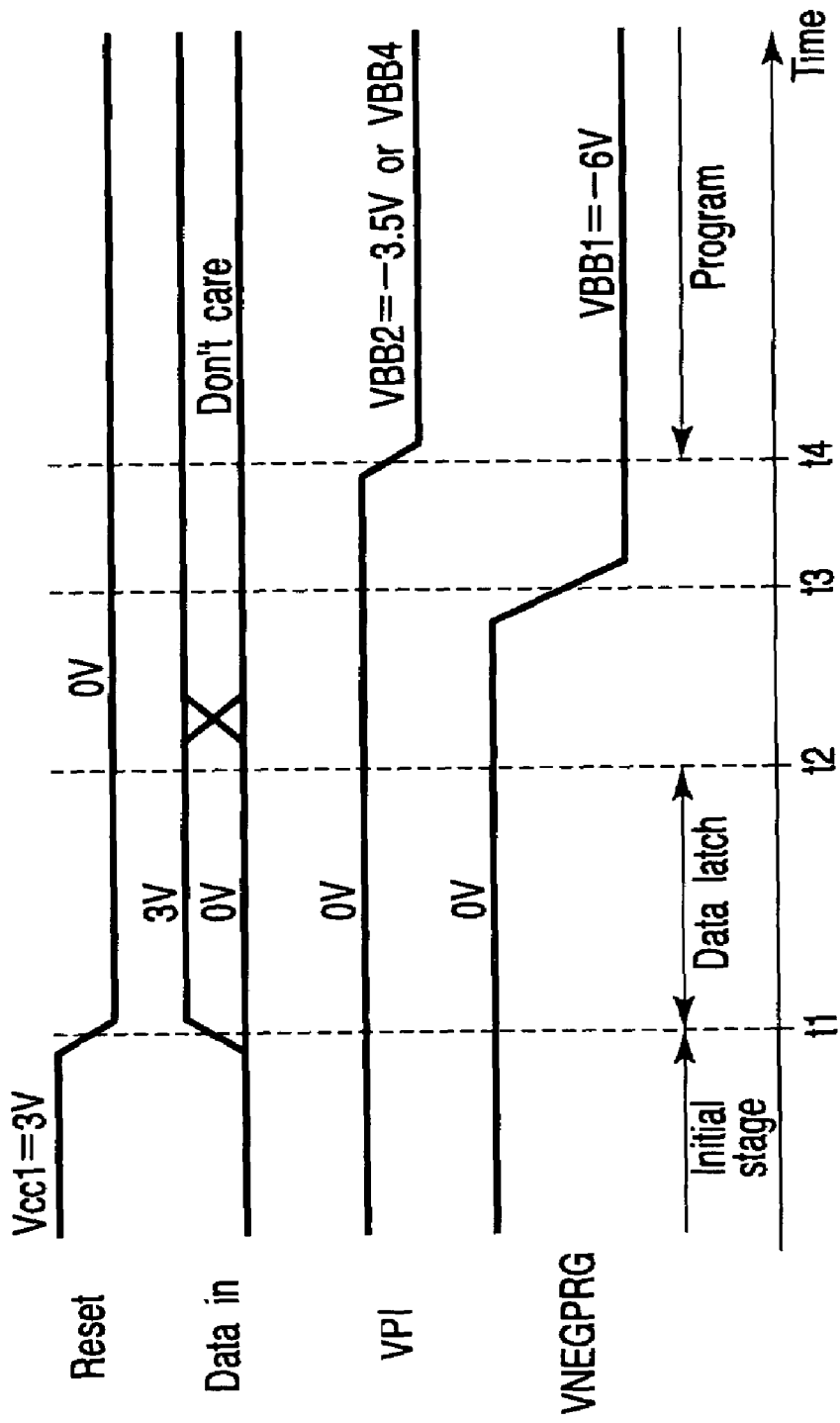
FIG. 8 is a timing chart for various signals when the 3Tr-NAND flash memory of the first embodiment is in operation.

Next, the operation of the 3Tr-NAND flash memory 3 will be explained by reference to FIG. 8. FIG. 8 is a timing chart of a reset signal RESET, a data signal, VPI, and VNEGPRG. Hereinafter, a state where no electrons are injected into the floating gate and the threshold voltage is negative is defined as a state where "1" data has been written and a state where electrons are injected into the floating gate and the threshold voltage is positive is defined as a state where "0" data has been written.

<Initial Operation>

Figure 9:
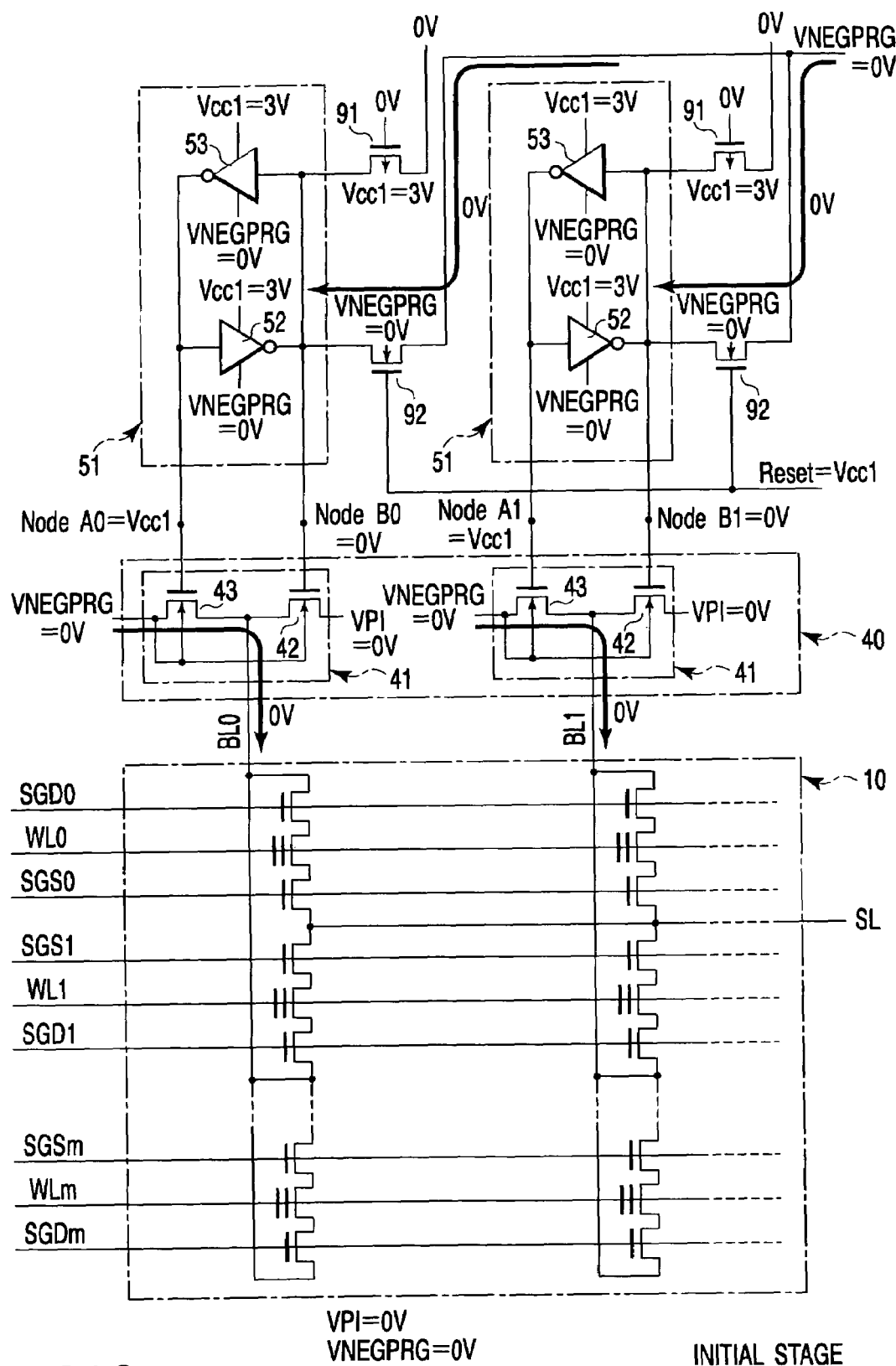
FIG. 9 is a circuit diagram of the memory cell array, write selector, write circuit, and switch group in the initial state of the 3Tr-NAND flash memory according to the first embodiment.

First, an initial operation will be explained by reference to FIG. 9. An initial operation is an operation carried out at the start of a write operation, a read operation, or a erase operation. In FIG. 8, an initial operation is carried out by time t1. FIG. 9 is a circuit diagram of the memory cell array 10, write selector 40, write circuit 50, and switch group 90 in the initial operation. Hereinafter, the gates of the MOS transistors 43, 42 in the select circuits 41 corresponding to the bit lines BL0 to BLn are referred as nodes B0 to Bn and node A0 to An, respectively.

Before the initial operation, VPI and VNEGPRG are set to 0V. The reset signal RESET is set to Vcc (=3V). Then, the reset transistors 92 in the switch group 90 are turned on. Therefore, VNEGPRG=0V is applied to the input nodes of all of the latch circuits 51. Since the power supply voltages on the low-voltage side of the inverters 52, 53 are at VNEGPRG=0V, the input nodes of all of the latch circuits 51 are at 0V and their output nodes are at Vcc1. That is, nodes B0 to Bn are at 0V and nodes A0 to An are at Vcc1. Therefore, in all of the select circuits 41, the MOS transistors 42 are in the off state and the MOS transistors 43 are in the on state. As a result, 0V is supplied from the sources of the MOS transistors 43 to the corresponding bit lines BL0 to BLn.

As described above, in the initial operation, 0V is applied to the input nodes of the latch circuits.

<Data Latch Operation>

Figure 10:
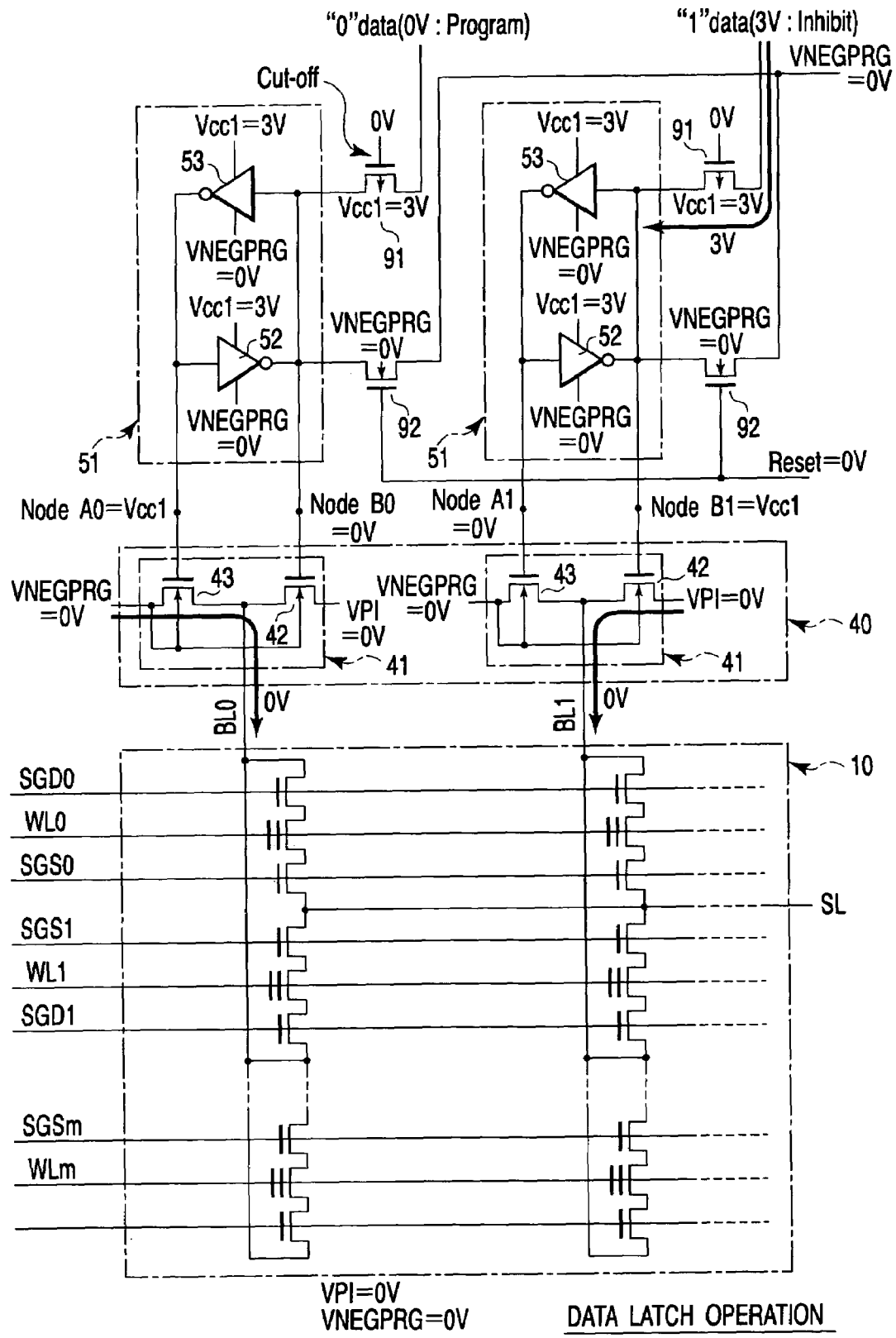
FIG. 10 is a circuit diagram of the memory cell array, write selector, write circuit, and switch group when the 3Tr-NAND flash memory of the first embodiment latches data.

Next, a data latch operation will be explained by reference to FIG. 10. A data latch operation is the operation of inputting the write data to each latch circuit 51. A data latch operation is carried out between time t1 to time t2. FIG. 10 is a circuit diagram of the memory cell array 10, write selector 40, write circuit 50, and switch group 90 in a data latch operation.

First, before a data latch operation, the reset signal RESET is set to 0V and the write data corresponding to the respective bit lines is inputted to one end of the current paths of the MOS transistors 91. When "0" is written (or when electrons are injected into the floating gate), 0V is applied to one end of the current path of the MOS transistor 91. When "1" is written (or when no electrons are injected into the floating gate), 3V is applied to one end of the current path of the MOS transistor 91. VPI and VNEGPRG remain at 0V. Setting the reset signal RESET to 0V brings all of the MOS transistors 92 into the off state.

The example of FIG. 10 shows a case where "0" data is written into the memory cell connected to bit line BL0 and "1" data is written into the memory cell connected to the bit line BL1.

First, a case where "0" data is written will be explained, centering on the bit line BL0. As shown in FIG. 10, 0V is applied to the one end of the current path of the MOS transistor 91. Since the gate potential of the MOS transistor 91 is also 0V, the MOS transistor 91 is in the cut off state. As a result, the data in the latch circuit 51 remains in the initial state. Therefore, node A0 is at Vcc1 and node B0 is at 0V. Consequently, in the select circuit 41 corresponding to the bit line BL0, the MOS transistor 43 is in the on state, the MOS transistor 42 is in the off state, and VNEGPRG=0V is applied from the source of the MOS transistor 43 to the bit line BL0.

Next, a case where "1" data is written will be explained, centering on the bit line BL1.

As shown in FIG. 10, 3V is applied to one end of the current path of the MOS transistor 91. Since the MOS transistor 91 is in the on state, the 3V reaches the input node of the latch circuit. Because of VNEGPRG=0V, the potential at node A1 changes from Vcc1 to 0V and the potential of node B1 changes from 0V to Vcc1. Thus, in the select circuit 41 corresponding to the bit line BL1, the MOS transistor 43 is turned off and the MOS transistor 42 is turned on. As a result, VPI=0V is applied from the source of the MOS transistor 42 to the bit line BL1.

As described above, in the data latch operation, the data in the latch circuit corresponding to the memory cell into which "1" data is to be written is reversed from its initial state. That is, when "0" is written (or when electrons are injected), no data is inputted from the outside. When "1" is written (or when no electrons are injected=the memory is unselected), the data is input from the outside.

<Write Operation>

Figure 11:
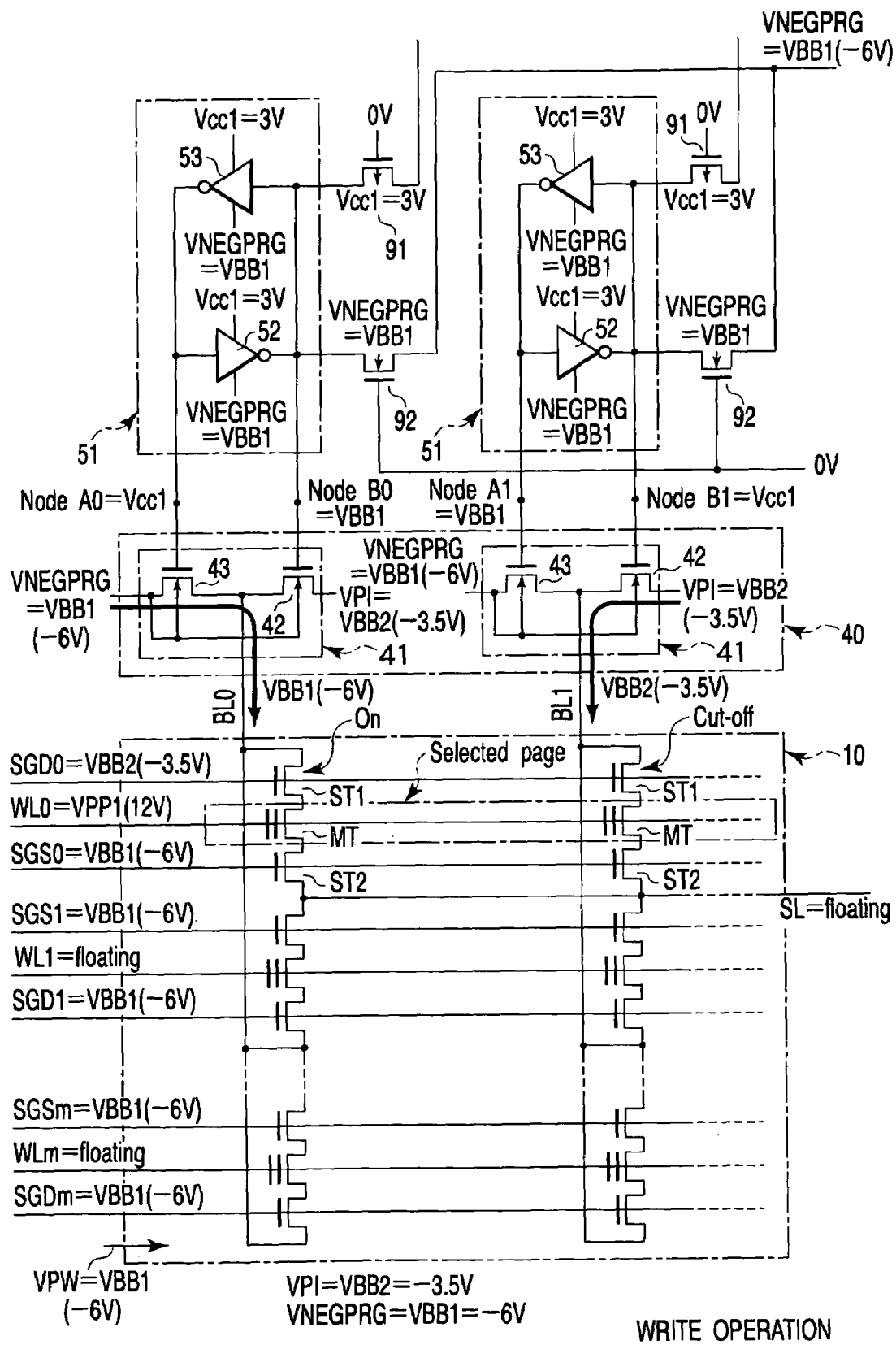
FIG. 11 is a circuit diagram of the memory cell array, write selector, write circuit, and switch group when the 3Tr-NAND flash memory of the first embodiment is written into.

A write operation will be explained by reference to FIG. 11. Data is written simultaneously into all of the memory cell transistors connected to any one of the word lines. Either "0" data or "1" data is written, depending on whether electrons are injected into the floating gate of the memory cell transistor MT. Electrons are injected into the floating gate by Fowler-Nordheim (FN) tunneling. In FIG. 8, a write operation is carried out at time t4 or later. FIG. 11 is a circuit diagram of the memory cell array 10, write selector 40, write circuit 50, and switch group 90 in a write operation. In FIG. 11, it is assumed that data is written into the memory cell transistors MTs connected to the word line WL0 and that, of the memory cell transistors MTs, "0" data is written into the one connected to the bit line BL0 and "1" data is written into the one connected to the bit line BL1. In other words, the memory cell connected to the bit line BL0 is selected and the memory cell connected to the bit line BL1 is unselected.

First, before a write operation, the reset signal RESET remains at 0V. Then, VNEGPRG is set to VBB1 (=−6V) at time t3 and VPI is set to VBB2 (=−3.5V) at time t4. The charge pump circuit 122 outputs the negative potentials VBB1 and VBB2 under the control of the write state machine 110. VPI may be another negative voltage of VBB4, not VBB2. In this case, the charge pump circuit 122 outputs the negative potential VBB4 under the control of the write state machine 110.

Then, the low-voltage-side power supply voltage of the inverters 52, 53 in the latch circuit 51 changes from 0V to VBB1, with the result that the potentials of node B0 and node A1 change from 0V to VBB1. Then, in the select circuit 41 corresponding to the bit line BL0, the MOS transistor 43 is in the on state. In the select circuit 41 corresponding to the bit line BL1, the MOS transistor 42 is in the on state. Since the source potentials of the MOS transistors 42, 43 are VPI=VBB2 and VNEGPRG=VBB1, respectively, VBB1 and VBB2 are supplied to the bit lines BL0 and BL1, respectively.

Then, the row decoder 20 selects the select gate line SGD0, applies VBB2 to the selected select gate line SGD0 and VBB1 to the unselected select gate lines SGD1 to SGDm and to all of the select gate lines SGS0 to SGSm. Then, of the select transistors ST1 connected to the selected select gate line SGD0, the one ST1 connected to the bit line BL1 applied with VBB2 is cut off. On the other hand, the select transistor ST1 connected to the bit line BL0 applied with VBB1 is turned on.

In addition, the row decoder 20 selects the word line WL0 and applies the positive potential VPP1 to the selected word line WL0. Moreover, the row decoder 20 brings all of the unselected word lines WL1 to WLm into the floating state. The charge pump circuit 123 outputs the positive potential VPP1 under the control of the write state machine 110. As a result, a channel region is formed in the memory cell transistors MTs connected to the selected word line WL0. Since the select transistor ST1 connected to the selected select gate line SGD0 and bit line BL1 is in the cut-off state, the channel potential of the memory cell transistor MT connected to the select transistor ST1 is floating. As a result of coupling with the word line WL, the channel potential rises to about VPP1. On the other hand, since the select transistor ST1 connected to the selected select gate line SGD0 and bit line BL0 is in the on state, the channel potential of the memory cell transistor MT connected to the select transistor ST1 is VBB1.

Furthermore, the row decoder 20 applies VBB1 to the substrate (p-well region 202) in which memory cells are formed.

As a result, in the memory cell transistor MT in the memory cell including the select transistor ST1 in the cut off state, since the potential difference between the gate and channel is insufficient, no electrons are injected into the floating gate. That is, "1" data is written. In the example of FIG. 11, the threshold value of the memory cell connected to the bit line BL1 and the selected word line WL0 (or the memory cell into which "1" data is to be written) remains negative.

On the other hand, in the memory cell transistor MT in the memory cell including the select transistor ST1 connected to the selected select gate line SGD0 and to the bit line BL0, since the potential difference between the gate and channel is 18V (=VPP1−VBB1), electrons are injected into the floating gate by FN tunneling. As a result, the threshold value of the memory cell transistor MT changes to positive. That is, "0" data is written.

As described above, the data is written into one page of memory cell transistors simultaneously.

<Erase Operation>

Figure 12:
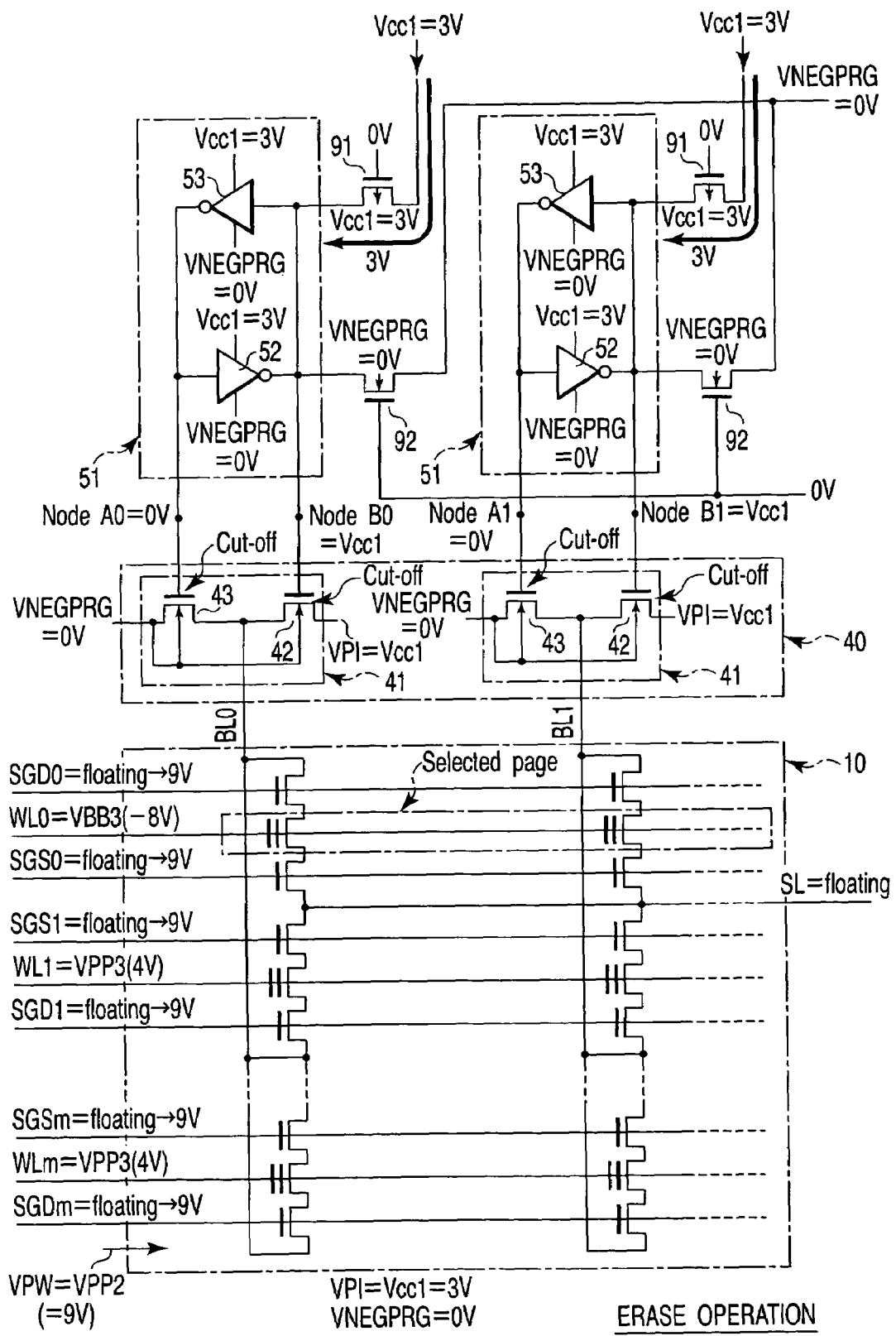

Next, an erase operation will be explained by reference to FIG. 12. FIG. 12 is a circuit diagram of the memory cell array 10, write selector 40, write circuit 50, and switch group 90 in an erase operation. Data is erased in pages as in a write operation. An erase operation is carried out by pulling electrons out of the floating gate by FN tunneling. FIG. 12 shows a case where the data is erased from the memory cell transistors connected to the word line WL0.

Before an erase operation, the reset signal RESET is set to 0V and 3V is applied to one end of the current path of each of the MOS transistors 91 corresponding to all the bit lines. VPI is at Vcc1 and VNEGPRG remains at 0V. Then, setting the reset signal RESET to 0V brings all of the MOS transistors 92 into the off state. All of the MOS transistors 91 are in the on state. As a result, 3V is applied to the input nodes of the latch circuits 51. Since VNEGPRG=0V, the potentials of nodes A0 to An are 0V and the potentials of nodes B0 to Bn are Vcc1. Accordingly, in all of the select circuits 41, the MOS transistors 42, 43 are cut off. Therefore, the bit lines BL0 to BLn are separated electrically from the latch circuits 51 and VNEGPRG and VPI and therefore go into the floating state.

Then, the row decoder 20 brings all of the select gate lines SGD0 to SGDm, SGS0 to SGSm into the floating state. In addition, the row decoder 20 selects the word line WL0 and applies VBB3 (=−8V) to the selected word line WL0 and VPP3 (=4V) to the unselected word lines WL1 to WLm. Furthermore, the row decoder 20 applies VPP2 (=9V) to the semiconductor substrate (p-well region 202) in which memory cells are formed. The charge pump circuits 122, 123 output the negative potential VBB3 and the positive potential VPP3 under the control of the write state machine 110.

Then, the potential difference between the memory cell transistor MT connected to the selected word line WL0 and the semiconductor substrate is 17V (=VPP2−VBB3), causing electrons in the floating gate to be pulled out into the semiconductor substrate by FN tunneling. As a result, the data is erased from the memory cell transistors MTs connected to the selected word line WL0, with the result that the threshold values of the memory cell transistors MTs become negative.

In the memory cell transistors MTs connected to the unselected word lines WL1 to WLm, VPP3 is applied to the word lines WL1 to WLm. Since the potential difference between the memory cell transistor MT and the well region is insufficient, no electrons are pulled out of the floating gate, with the result that the data is not erased.

As described above, the data is erased from the selected page simultaneously. While in the example of FIG. 12, the data has been erased from (one page of) the memory cell transistors connected to one word line, the data may be erased from the memory cell transistors MTs connected to a plurality of word lines. In this case, the row decoder 20 applies VBB3 to a plurality of word lines.

<Read Operation>

Figure 13:
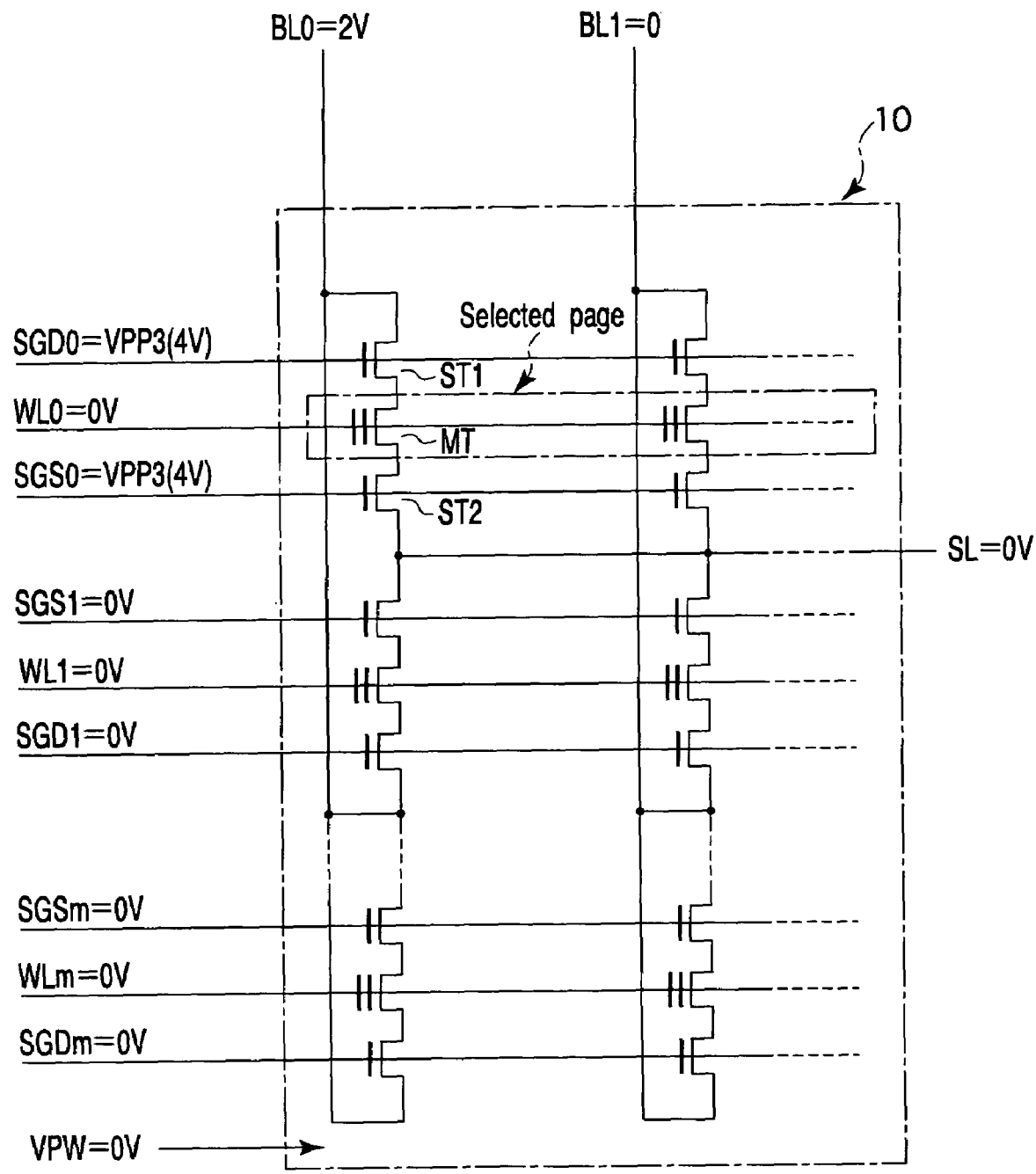

Next, a read operation will be explained by reference to FIG. 13. FIG. 13 is a circuit diagram of the memory cell array 10 of the 3Tr-NAND flash memory 3. FIG. 13 shows a case where the data is read from the memory cell transistor MT connected to the bit line BL0 and to the word line WL0.

First, the row decoder 20 selects the select gate lines SGD0, SGS0 connected to the memory cell from which the data is to be read and applies VPP3 to the selected select gate lines SGD0, SGS0. In addition, the row decoder 20 makes unselected the other select gate lines SGD1 to SGDm and SGS1 to SGSm and applies 0V to the unselected select gate lines. As a result, the select transistors ST1, ST2 connected to the selected select gate lines SGD0, SGS0 are brought into the on state. Then, the row decoder 20 applies 0V to all of the word lines WL0 to WLm.

Since the threshold value is negative if the written data is "1", the memory cell transistor MT is in the on state. Since the threshold value is positive if the written data is "0", the memory cell transistor MT is in the off state.

In this state, the bit lines are connected to the sense amplifier 70 via the read selector 60, with the result that, for example, 2.0V is applied to the selected bit line BL0. Then, if the data written in the memory cell transistors MTs connected to the select transistors ST1, ST2 connected to the selected select gate lines SGD0, SGS0 is "1," current flows from the bit line to the source line. In contrast, if the written data is "0," no current flows.

As described above, the bit line potential varying with the current flowing from the bit line to the source line is amplified by the sense amplifier 70, thereby reading the data. While in the example of FIG. 13, the data has been written from one bit line, the data may be read simultaneously from a plurality of memory cell transistors by applying a potential to a plurality of bit lines. In the read operation, the MOS transistors 42, 43 in all of the select circuits 41 are turned off and the bit lines BL0 to BLn are separated electrically from the latch circuits 51 and VPI and VNEGPRG.

As described above, the flash memory of the first embodiment produces the following effects:

(1) The Occurrence of Erroneous Writing can be Suppressed without Decreasing the Writing Speed.

In the configuration of the first embodiment, the flash memory 3 has the select circuits provided for the bit lines in a one-to-one correspondence. According to the data held in the latch circuit 51, the negative write voltage VNEGPRG (VBB1) is applied to the bit line via the current path of the MOS transistor 43 when "0" is written (to the selected bit line). On the other hand, when "1" is written (to the unselected bit lines), the write inhibit voltage VPI is applied to the unselected bit lines via the current paths of the corresponding MOS transistors 42. The voltage value of the write inhibit voltage VPI can be changed by the charge pump circuit 122.

Figure 14:
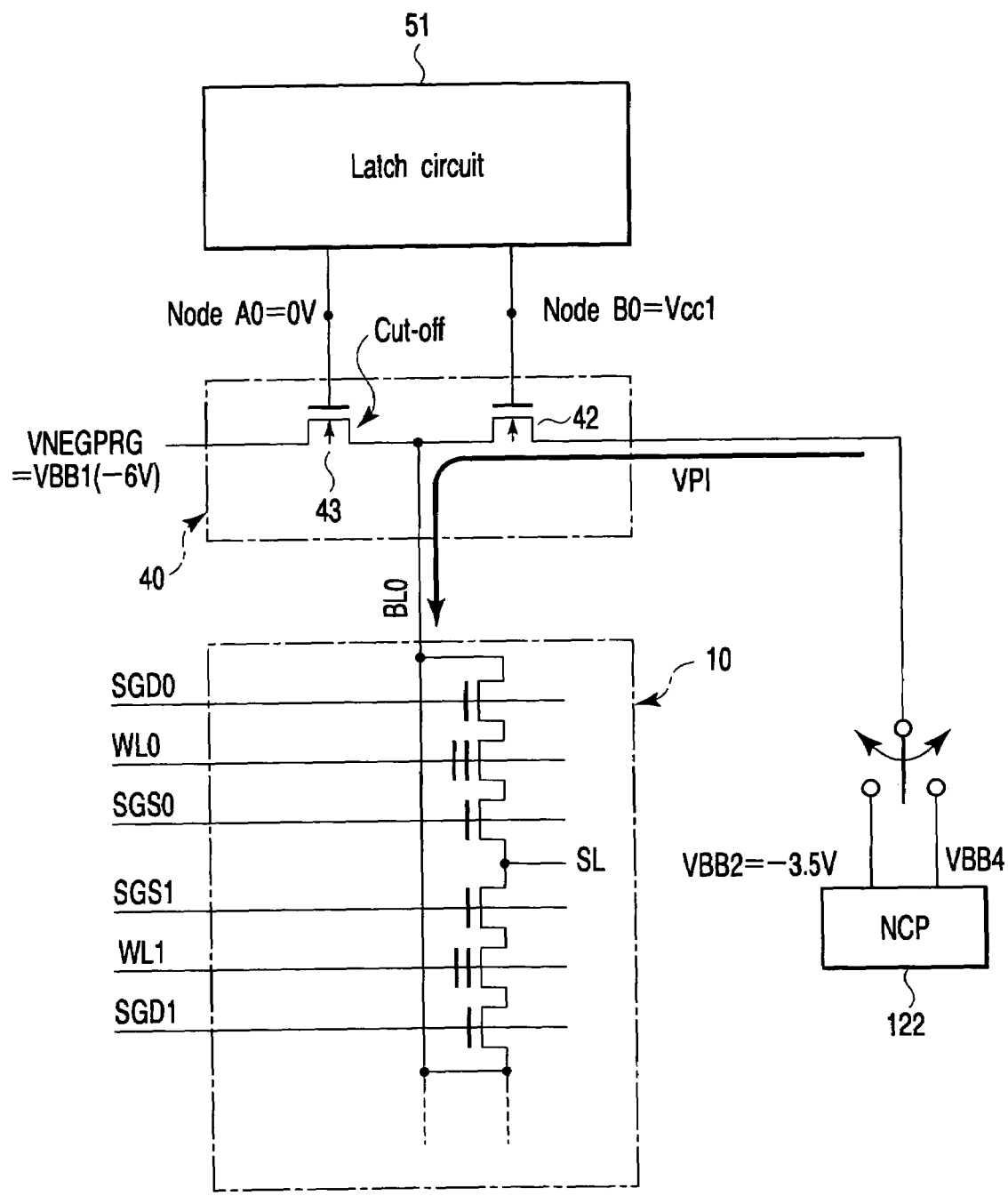
FIG. 14 is a circuit diagram of the memory cell array, a select circuit, a latch circuit, and a charge pump circuit of the 3Tr-NAND flash memory of the first embodiment, which helps explain the way of applying a write inhibit voltage to the bit lines.

FIG. 14 shows the way the memory cell array 10, select circuit 40, latch circuit 51, and charge pump circuit 122 operate in a write operation. As shown in FIG. 14, the charge pump generates, for example, VBB2 and VBB4 as negative potentials. VBB4 may be higher or lower than VBB2. The one of VBB2 and VBB4 to prevent erroneous writing is used as the write inhibit voltage VPI.

Then, to use a negative voltage as the write inhibit voltage VPI, the select circuits 41 are provided. For example, if the power supply voltages on the low-voltage side and high-voltage side of the latch circuit were made negative, a forward bias would be applied between the n-well region of the p-channel MOS transistor forming an inverter and the semiconductor substrate, making the circuit operation unstable. In the first embodiment, however, the select circuit 41 including two n-channel MOS transistors 42, 43 formed on the same p-well region is used. Therefore, the select circuit 41 can apply VNEGPRG and VPI to the bit line. Both of VNEGPRG and VPI can become negative voltages.

Therefore, it is not necessary to change another voltage, such as the potential of the word line, to prevent erroneous writing differently from in the prior art. Erroneous writing can be suppressed just by selecting either VBB2 or VBB4 as the write inhibit voltage and setting the voltage to the optimum value.

Accordingly, erroneous writing can be suppressed without decreasing the writing speed. Since the value of the write inhibit voltage VPI can be changed to a plurality of values, the degree of freedom in the circuit configuration can be increased.

(2) The Write Operation can be Simplified.

With the configuration of the first embodiment, before a write or erase operation, the data in the latch circuits 51 is initialized in the initial operation. As a result, the input to each of the latch circuits 51 is at the low level and its output is at the high level.

Then, in a data latch operation, 0V is applied to the MOS transistor 91 when "0" is written (to the selected bit line) and 3V is applied to the MOS transistor when "1" is written (to the unselected bit lines). Since the MOS transistor 91 is cut off when "0" is written, externally supplied "0" data is actually not transferred to the latch circuits 51. That is, the data in the latch circuits 51 remains unchanged. On the other hand, when "1" is written, "1" data is transferred to the latch circuits 51 via the current paths of the MOS transistors 91.

Specifically, as shown in FIG. 15, in the first embodiment, the initial operation is carried out, thereby initializing the data in the latch circuits 51. Then, when "0" is written (to the selected bit line), the select circuit 41 applies the write voltage VNEGPRG to the selected bit line on the basis of the initialized data. On the other hand, when "1" is written (to the unselected bit lines), the select circuit 41 applies the write inhibit voltage VPI to the unselected bit lines on the basis of the externally inputted data, not the initialized data.

Therefore, "the latch circuits 51 are initialized in the initial operation" can be paraphrased as "0 data is inputted to all of the latch circuits." Thus, in a write operation, when "1" data is written, or when no electrons are injected into the floating gate, or in other words, only when writing is done to the unselected bit lines, data is externally inputted. In contrast, when "0" data is written, or when electrons are injected into the floating gate, or in other words, when writing is done to the selected bit line, there is no need to input data from the outside. Therefore, the write operation can be simplified.

(3) The Reliability of the Erase Operation can be Improved.

Figure 16:
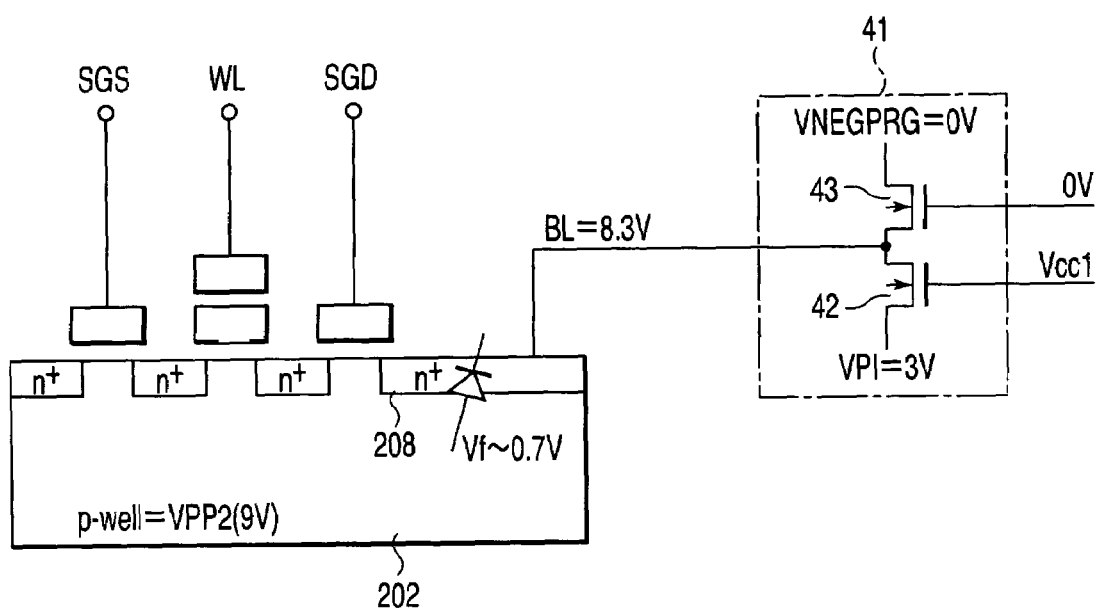
FIG. 16 schematically shows the relationship between a memory cell and a select circuit in the 3Tr-NAND flash memory according to the first embodiment.

With the configuration of the first embodiment, in an erase operation, the positive voltage VPP2 (=9V) is applied to the p-well region 202 in which a memory cell array is formed. Therefore, a forward bias is applied between the drain region 208 of the select transistor ST1 and the well region 202 as shown in FIG. 16. Thus, the potential of the bit line rises by about 8.3V as a result of the coupling of the forward bias with the p-well region 202. The state before the erase operation is as shown in FIG. 9, where the MOS transistor 43 is in the on state. Thus, the bit line potential in the erase operation is about 10.3V obtained by adding the 8.3V to the threshold voltage of the MOS transistor 43.

The bit lines BL0 to BLn whose potential is 10.3V are connected to the drains of the MOS transistors 43, 42 of the select circuits 41. VNEGPRG (=0V) and VPI (=3V) are applied to the sources of the MOS transistors 43, 42, respectively. Thus, when at least one of the MOS transistors 43, 42 is turned on, causing the potentials of the bit lines BL0 to BLn to drop, with the result that the potential of the p-well region 202 will possibly drop.

With the configuration of the first embodiment, however, as shown in FIG. 12, the high level (3V) is applied to the latch circuit 51 in the erase operation. Thus, nodes B0 to Bn are at Vcc1 and nodes A0 to An are at 0V. Accordingly, both of the MOS transistors are cut off. Thus, there is no current path extending from the bit line to the VNEGPRG node and VPI node, which prevents the potential of the bit line from dropping. As a result, the reliability of the erase operation is improved.

(4) Control of the Flash Memory can be simplified.

With the configuration of the first embodiment, the transfer gate that transfers the externally inputted write data to the latch circuit 51 is formed only of p-channel MOS transistors 91. Therefore, the circuit area can be reduced as compared with a case where the transfer gate is formed of a combination of n-channel MOS transistors and p-channel MOS transistors. In addition, the gate of the p-channel MOS transistor is always set to the ground potential, which makes it unnecessary to control the gate potential. Therefore, control of the flash memory can be simplified.

Figure 17:
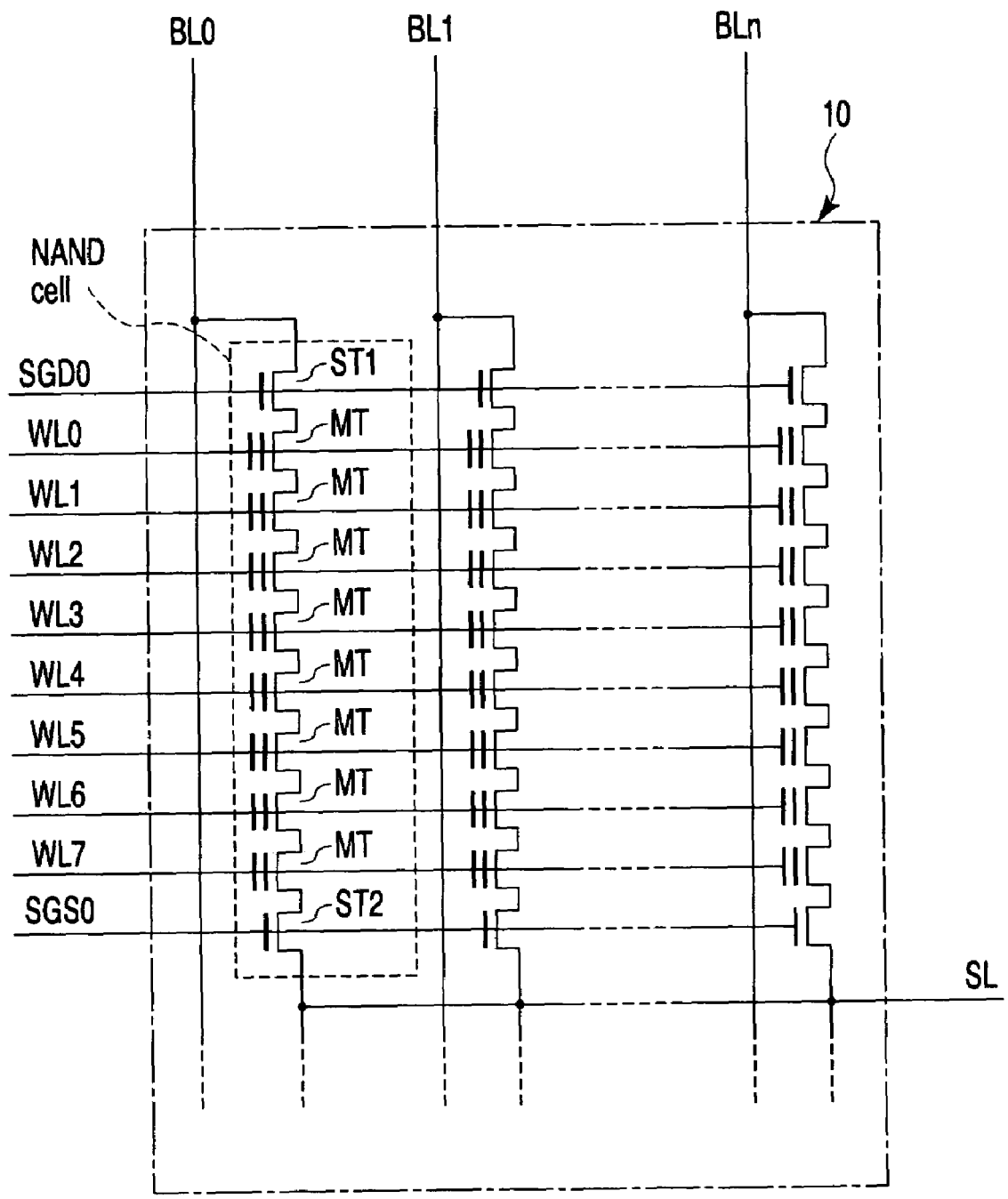
FIG. 17 is a circuit diagram of a memory cell array included in a NAND flash memory according to a second embodiment of the present invention.

Next, a semiconductor memory device according to a second embodiment of the present invention will be explained. The second embodiment is such that the first embodiment is applied to a NAND flash memory. Specifically, the memory cell array 10 of FIG. 1 is replaced with a NAND flash memory and the generated voltage of the voltage generator circuit 120 is changed. Therefore, an explanation of the configuration excluding the memory cell array 10 and the voltage generator circuit 120 will be omitted. FIG. 17 is a circuit diagram of the memory cell array 10 included in the flash memory 3 of the second embodiment.

As shown in FIG. 17, the memory cell array 10 has a plurality of NAND cells arranged in a matrix. Each of the NAND cells includes eight memory cell transistors MTs and select transistors ST1, ST2. A memory cell transistor MT has a stacked-gate structure that includes a floating gate formed on a semiconductor substrate with a gate insulating film interposed therebetween and a control gate formed on the floating gate with an inter-gate insulating film interposed therebetween. The number of memory cell transistors MTs is not limited to 8 and may be 16 or 32. The number is illustrative and not restrictive. The adjoining ones of the memory cell transistors MTs share their source and drain. They are arranged in such a manner that their current paths are connected in series between the select transistors ST1, ST2. The drain region at one end of the series connection of the memory cell transistors MTs is connected to the source region of the select transistor ST1. The source region at the other end is connected to the drain region of the select transistor ST2.

The control gates of the memory cell transistors MTs in a same row are connected commonly to any one of word lines WL0 to WLm. The gates of the select transistors ST1, ST2 in the same row are connected commonly to select gate lines SGD, SGS, respectively. The drains of the select transistors ST1 in a same column are connected commonly to any one of bit lines BL0 to BLn. The sources of the select transistors ST2 are connected commonly to a source line SL and then connected to a source line driver 15. Both of the select transistors ST1, ST2 are not necessarily needed. Only one of them may be used, provided that it can select a NAND cell.

Figure 18:
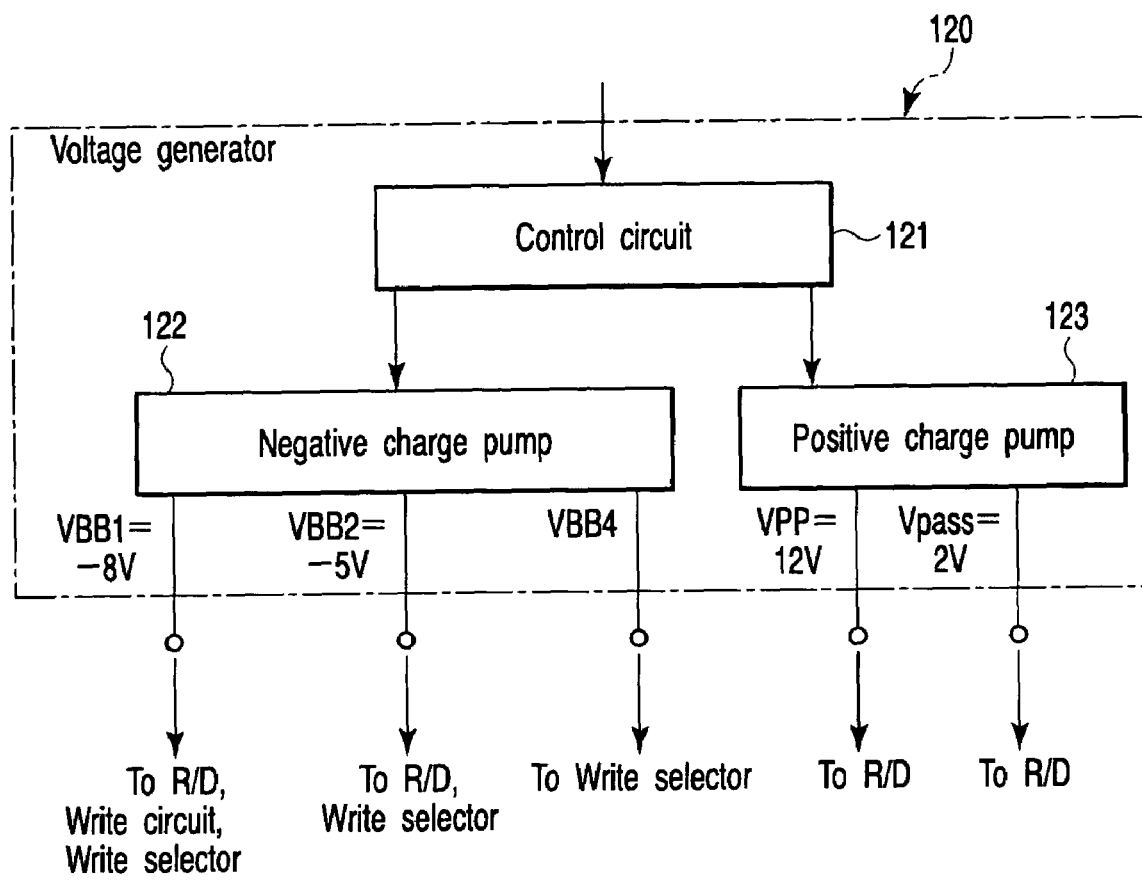
FIG. 18 is a circuit diagram of a voltage generator circuit included in the NAND flash memory according to the second embodiment.

The voltage generator circuit 120 generates a plurality of internal voltages on the basis of the voltage Vcc1 externally inputted. FIG. 18 is a circuit diagram of the voltage generator circuit 120. As shown in FIG. 18, the configuration of the voltage generator circuit 120 is as explained in the first embodiment. The charge pump circuit 122 generates the negative voltages VBB1 (=−8V), VBB2 (=−5V), and VBB4. The charge pump circuit 123 generates the positive voltages VPP (=12V) and Vpass (=2V). The negative voltages VBB1, VBB2 and the positive voltages VPP, Vpass are supplied to the row decoder 20. The negative voltages VBB1, VBB2, and VBB4 are supplied to the write selector 40. The negative voltage VBB1 is also supplied to the write circuit 50.

Figure 19:
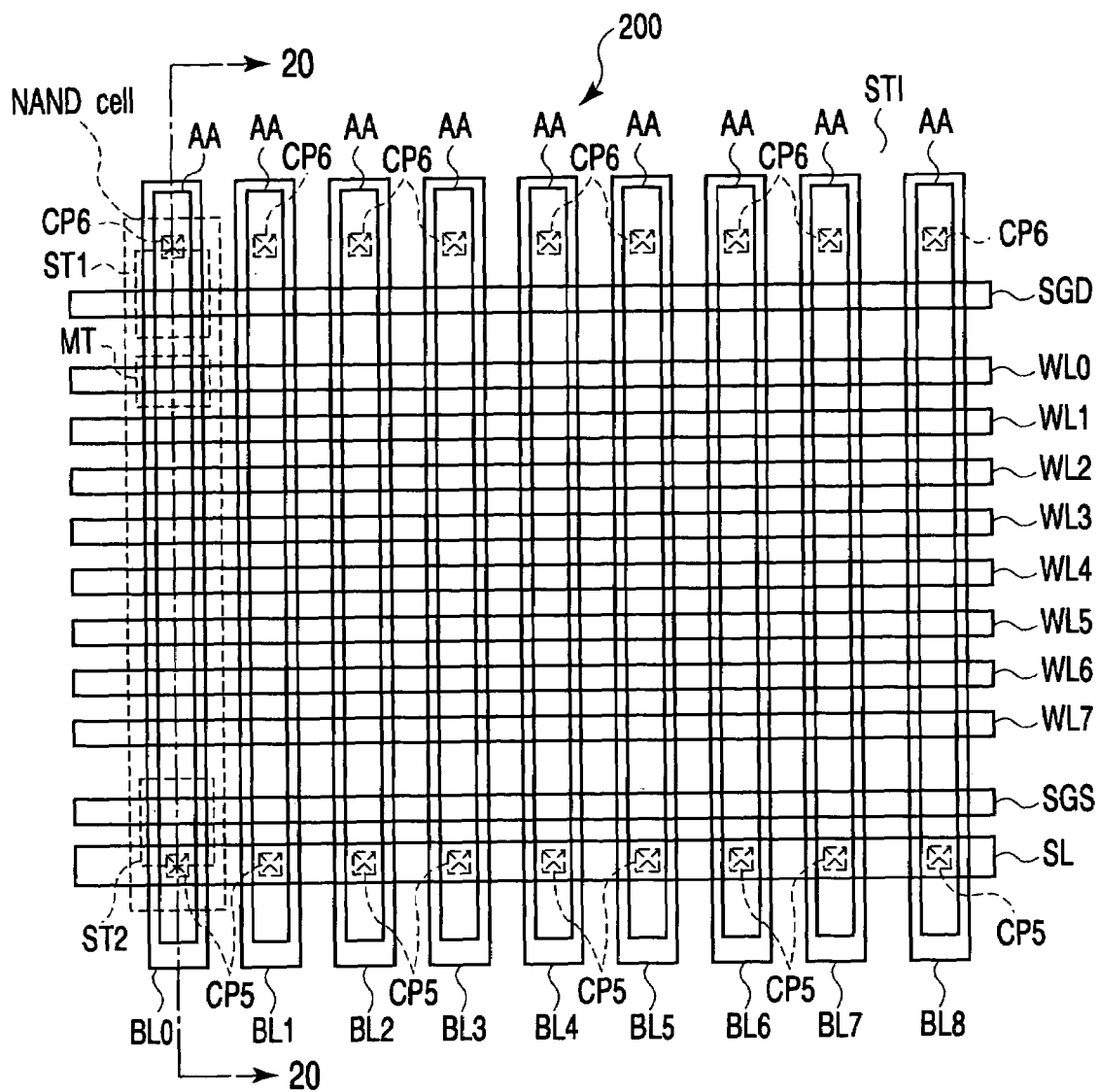
FIG. 19 is a plan view of the memory cell array included in the NAND flash memory according to the second embodiment.

Next, a plane configuration and a sectional configuration of the memory cell array 10 included in the NAND flash memory 3 will be explained. FIG. 19 is a plan view of a part of the memory cell array 10.

As shown in FIG. 19, in the semiconductor substrate 200, a plurality of strip-shaped element regions AAs extending in a first direction are formed in a second direction. Strip-shaped word lines WL0 to WLm, which extend in the second direction, are formed so as to cross the plurality of element regions AAs. In addition, strip-shaped select gate lines SGD, SGS, which extend in the second direction, are formed so as to sandwich eight word lines between them. In the regions where the word lines WL0 to WLm cross the element regions AAs, memory cell transistors MTs are formed. In the regions where the select gate lines SGD, SGS cross the element regions AAs, select transistors ST1, ST2 are formed. Furthermore, in the regions where the word lines WL0 to WLm cross the element regions AAs, floating gates (not shown) isolated on a memory cell transistor MT basis are formed. Like the memory cell transistor MT, each of the select transistors ST1, ST2 has a control gate and a floating gate. However, differently from the memory cell transistor MT, the floating gate is shared by the ones of the select transistors STs adjoining in the second direction. Then, in a shunt region (not shown), the floating gates of the select transistors ST1, ST2 are connected to their control gates.

On the source region of each of the select transistors ST2, a strip-shaped source line SL extending in the second direction is formed. The source line SL is connected to the source regions of the select transistors ST2 via contact plugs CP5. The source line SL is connected to a source line driver 80.

On the element regions AAs, strip-shaped bit lines BL0 to BLn extending in the first direction are formed. The bit line BL0 to BLn are connected to the drain regions of the select transistors ST1 via contact plugs CP6.

Figure 20:
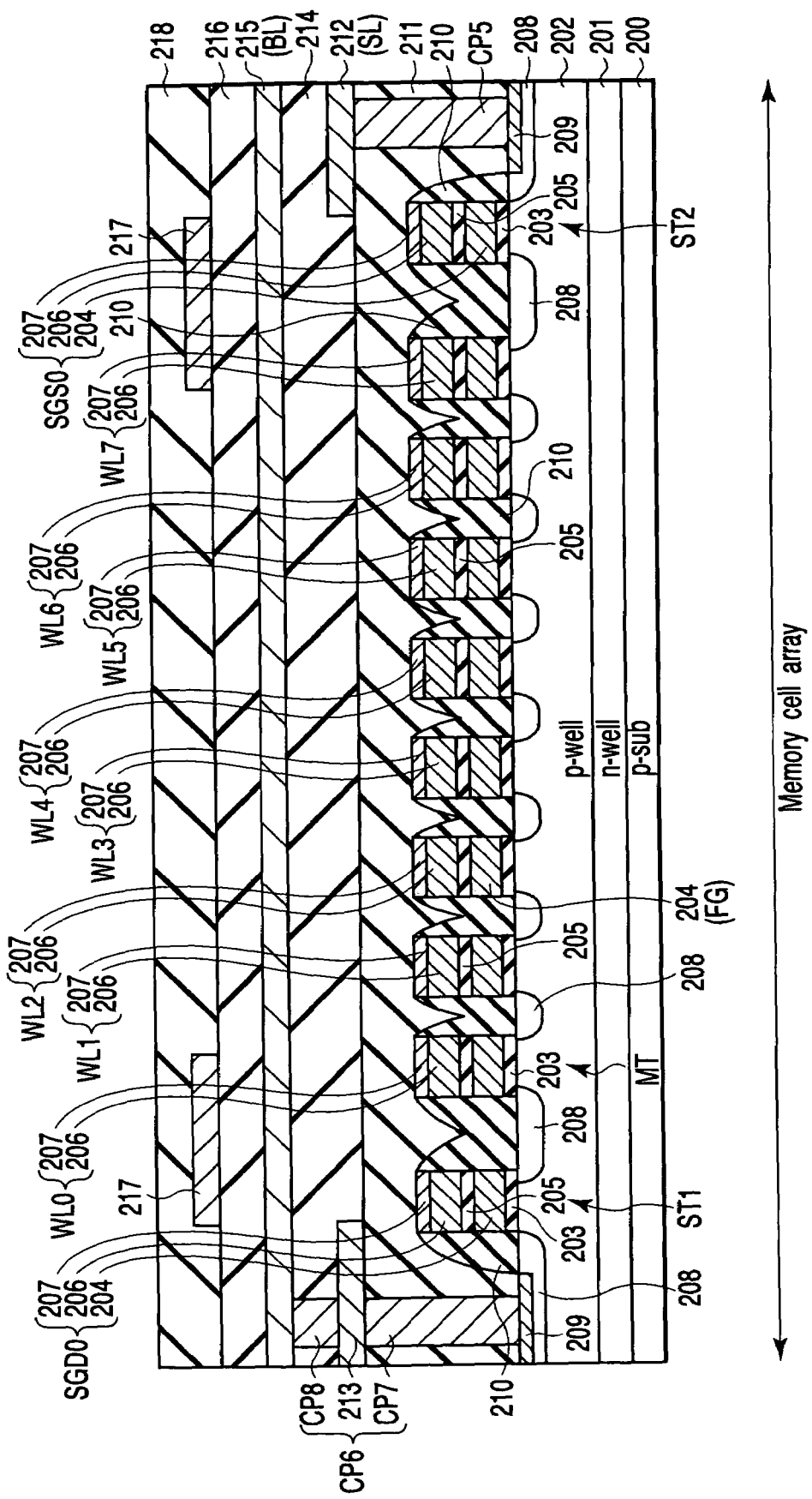
FIG. 20 is a sectional view taken along line 20—20 of FIG. 19.

FIG. 20 is a sectional view taken along line 20—20 of FIG. 3.

As shown in FIG. 20, at the surface of the element region AA of the p-type semiconductor (silicon) substrate 200, an n-well region 201 is formed. At the surface of the n-well region 201, a p-well region 202 is formed. On the p-well region 202, a gate insulating film 203 is formed. On the gate insulating film 203, the gate electrodes of memory cell transistors MTs and select transistors ST1, ST2 are formed. Each of the gate electrodes of the memory cell transistors MT and select transistors ST1, ST2 includes a polysilicon layer 204 formed on the gate insulating film 203, an inter-gate insulating film 205 formed on the polysilicon layer 204, a polysilicon layer 206 formed on the inter-gate insulating film 205, and a silicide layer 207 formed on the polysilicon layer 206. The inter-gate insulating film 205 is formed of, for example, a silicon oxide film, or an ON film, an NO film, or an ONO film which has a stacked structure of a silicon oxide film and a silicon nitride film. In the memory cell transistor MT, the polysilicon layers 204, which are separated from one another between element regions AAs adjoining in the word line direction, function as floating gates (FG). In addition, the polysilicon layer 206 and silicide layer 207 function as control gates (word lines WLs). The polysilicon layers 206 are connected to one another between element regions AAs adjoining in the word line direction. In the select transistors ST1, ST2, a part of the inter-gate insulating film 205 is removed in a shunt region (not shown) and the polysilicon layers 204, 206 are connected electrically. Then, the polysilicon layers 204, 206 and the silicide layer 207 function as select gate lines SGD, SGS. In the select transistors ST1, ST2, the polysilicon layer 204 and polysilicon layer 206 are not separated between element regions AAs adjoining in the word line direction and are connected to each other.

At the surface of the semiconductor substrate 200 located between adjoining gate electrodes, impurity diffused layers 208 functioning as source and drain regions are formed. Each impurity diffused layer 208 is shared by adjoining transistors. Specifically, an impurity diffused layer 208 between two adjoining select transistors ST1 functions as a drain region for the two select transistors ST1. An impurity diffused layer 208 between two adjoining select transistors ST2 functions as a source region for the two select transistors ST2. An impurity diffused layer 208 between two adjoining memory cell transistors MTs functions as a source or drain region for the two memory cell transistors MTs. Moreover, an impurity diffused layer 208 between a memory cell transistor MT and a select transistor ST1 adjacent to each other functions as the drain region of the memory cell transistor MT and the source region of the select transistor ST1. On the other hand, an impurity diffused layer 208 between a memory cell transistor MT and a select transistor ST2 functions as the source region of the memory cell transistor MT and the drain region of the select transistor ST2. At the surface of the drain region 208 of the select transistor ST1 and at the surface of the source region 35 of the select transistor ST2, a silicide layer 209 is formed. In the source and drain regions 208 of the memory cell transistor MT, in the source region 208 of the select transistor ST1, and in the drain region 208 of the select transistor ST2, no silicide layer is formed. On the side of the gate electrode (stacked gate) of each of the memory cell transistor MT and select transistors ST1, ST2, a sidewall insulating film 210 is formed. The sidewall insulating film 210 is formed on the side facing the source region of the stacked gate and on the side facing the drain region. The region between the stacked gates of the memory cell transistor MT and select transistors ST1, ST2 is filled with the sidewall insulating film 210. Thus, the top of the source and drain regions of the memory cell transistor MT, the top of the select transistor ST1, and the top of the drain region of the select transistor ST2 are covered with the sidewall insulating film 210.

On the semiconductor substrate 200, an interlayer insulating film 211 is formed so as to cover the memory cell transistors MTs and select transistors ST1, ST2. In the interlayer insulating film 211, a contact plug CP1 is formed which reaches the silicide layer 209 formed in the source region 208 of the select transistor ST2. On the interlayer insulating film 211, a metal wiring layer 212 to be connected to the contact plug CP1 is formed. The metal wiring layer 212 functions as a source line SL. In the interlayer insulating film 211, a contact plug CP3 is formed which reaches the silicide layer 209 formed in the drain region 208 of the select transistor ST1. On the interlayer insulating film 211, a metal wiring layer 213 to be connected to the contact plug CP3 is formed.

On the interlayer insulating film 211, an interlayer insulating film 214 is formed so as to cover the metal wiring layers 212, 213. In the interlayer insulating film 214, a contact plug CP4 reaching the metal wiring layer 213 is formed. On the interlayer insulating film 214, a metal wiring layer 215 connected commonly to a plurality of contact plugs CP4 is formed. The metal wiring layer 215 functions as a bit line BL. The contact plugs CP3, CP4, and metal wiring layer 213 correspond to the contact plugs CP2 in FIG. 3.

On the interlayer insulating film 214, an interlayer insulating film 216 is formed so as to cover the metal wiring layer 215. On the interlayer insulating film 216, a metal wiring layer 217 is formed. The metal wiring layer 217, which is connected to the silicide layers 207 of the select transistors ST1, ST2 in a region (not shown), functions as the shunt wiring lines of the select gate lines SGD, SGS. On the interlayer insulating film 216, an interlayer insulating film 218 is formed so as to cover the metal wiring layer 217.

The sectional structure in the column direction of the memory cell array 10, write selector 40, latch circuit 50, and switch group 90 is almost the same as that of FIG. 7 explained in the first embodiment. Since the sectional structure is the same, except that the configuration of the memory cell array 10 is replaced with that of FIG. 20, its explanation will be omitted.

Next, the operation of the NAND flash memory 3 configured as described above will be explained by reference to FIG. 8. FIG. 8 is a timing chart of a reset signal RESET, a data signal, VPI, and VNEGPRG explained in the first embodiment, except that VBB1 and VBB2 are set to −8V and −5V, respectively.

<Initial Operation>

An initial operation is the same as explained in the first embodiment by reference to FIG. 9. Specifically, 0V is applied to one end of the current path of each of the MOS transistors 91, thereby initializing the data in the latch circuits 51. As a result, the potentials of nodes A0 to An are at Vcc1 and the potentials of nodes B0 to Bn are at 0V.

<Data Latch Operation>

A data latch operation is the same as explained in the first embodiment by reference to FIG. 10. Specifically, the write data is inputted to one end of the current path of each of the MOS transistors 91. In the second embodiment, too, an explanation will be given using a case where "0" data is written into the memory cell connected to the bit line BL0 and "1" data is written into the memory cell connected to the bit line BL1. Thus, the data in the latch circuit 51 corresponding to the bit line BL0 remains in the initialized state, whereas the data in the latch circuit 51 corresponding to the bit line BL1 is reversed. As a result, the potentials of node A0 and node B0 are Vcc and 0V, respectively, and the potentials of node A1 and node B1 are 0V and Vcc1, respectively.

<Write Operation>

Figure 21:
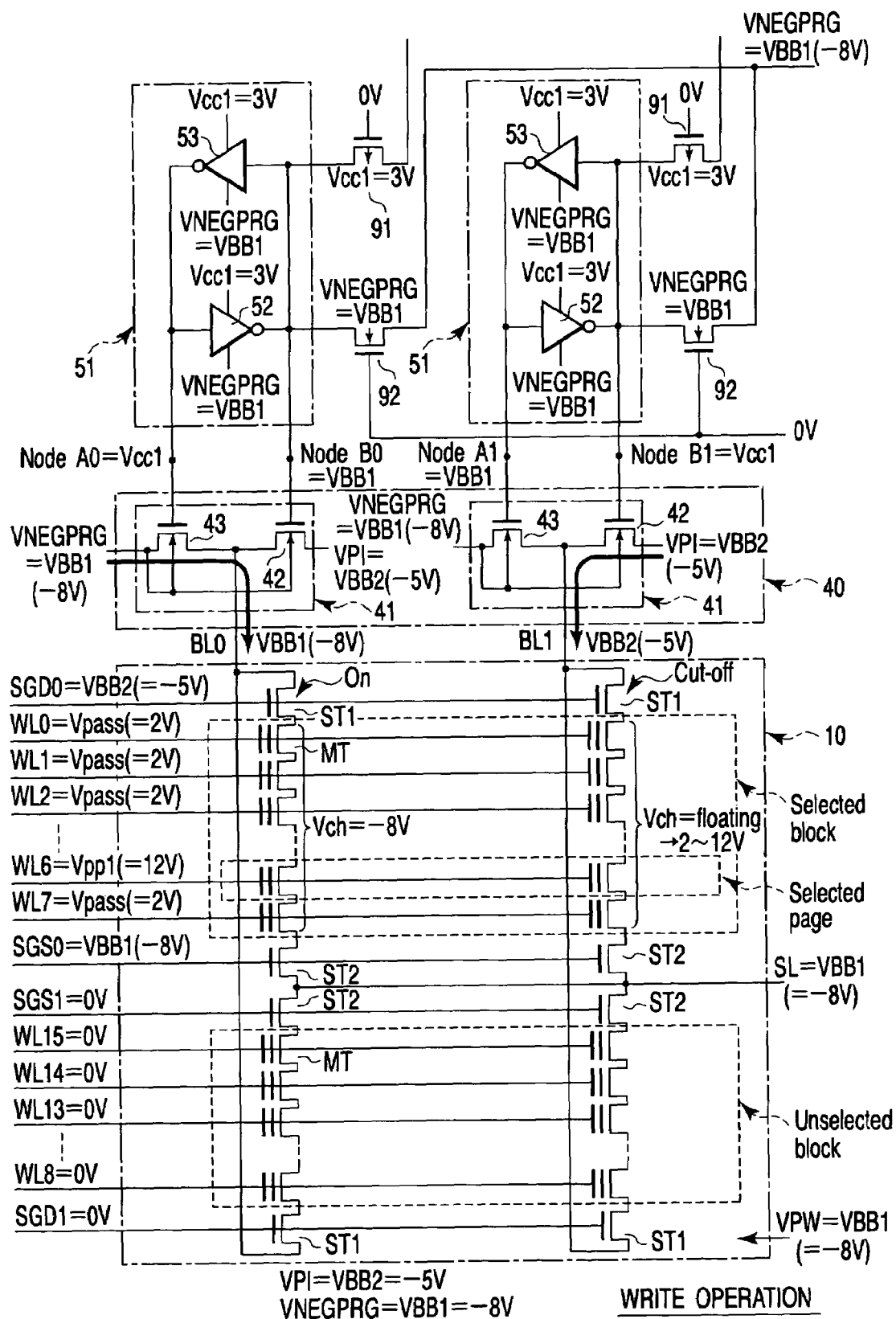
FIG. 21 is a circuit diagram of the memory cell array, write selector, write circuit, and switch group when the NAND flash memory of the second embodiment is written into.

A write operation will be explained by reference to FIG. 21. Data is written simultaneously into all of the memory cell transistors connected to any one of the word lines. Either "0" data or "1" data is written, depending on whether electrons are injected into the floating gate of the memory cell transistor MT. Electrons are injected into the floating gate by FN tunneling. In FIG. 8, a write operation is carried out at time t4 or later. FIG. 21 is a circuit diagram of the memory cell array 10, write selector 40, write circuit 50, and switch group 90 in a write operation. In FIG. 21, it is assumed that data is written into the memory cell transistors MTs connected to the word line WL6 and that, of the memory cell transistors MTs, "0" data is written into the one connected to the bit line BL0 and "1" data is written into the one connected to the bit line BL1. In other words, the memory cell connected to the bit line BL0 is selected and the memory cell connected to the bit line BL1 is unselected.

First, before a write operation, the reset signal RESET remains at 0V. Then, VNEGPRG is set to VBB1 (=−8V) at time t3 and VPI is set to VBB2 (=−5V) at time t4. The charge pump circuit 122 outputs the negative potentials VBB1 and VBB2 under the control of the write state machine 110. VPI may be set to another negative potential of VBB4, not VBB2. In this case, the charge pump circuit 122 outputs the negative potential VBB4 under the control of the write state machine 110.

Then, the low-voltage-side power supply voltages of the inverters 52, 53 in the latch circuit 51 change from 0V to VBB1, with the result that the potentials of node B0 and node A1 change from 0V to VBB1. Then, in the select circuit 41 corresponding to the bit line BL0, the MOS transistor 43 is in the on state. In the select circuit 41 corresponding to the bit line BL1, the MOS transistor 42 is in the on state. Since the source potentials of the MOS transistors 42, 43 are VPI=VBB2 and VNEGPRG=VBB1, respectively, VBB1 and VBB2 are supplied to the bit lines BL0 and BL1, respectively.

Then, the row decoder 20 selects the block including the memory cell transistor into which the data is to be written. A "block" is defined as a set of NAND cells sharing the select gate lines SGD, SGS. Specifically, the row decoder 20 selects the select gate lines SGD0, SGS0 connected to the selected block, applies VBB2 and VBB1 to the selected select gate lines SGD0, SGS0, respectively. In addition, the row decoder 20 makes unselected all of the select gate lines SGD1 to SGDm and select gate lines SGS1 to SGSm connected to the unselected blocks and applies 0V to them. That is, as shown in FIG. 21, the block connected to the word lines WL0 to WL7 is selected and the other blocks are unselected.

As a result, the select transistor ST1 connected to the bit line BL1 applied with VBB2 and to the selected select gate line SGD0 is cut off. On the other hand, the select transistor ST1 connected to the bit line BL0 applied with VBB1 and to the selected select gate line SGD0 is turned on.

In the selected block, the row decoder 20 selects the word line WL6 and applies VPP (12V) to the selected word line WL6 and Vpass (2V) to the other unselected word lines WL0 to WL5, WL7, thereby forming channel regions in all of the memory cell transistors MTs included in the selected block. Moreover, the row decoder 20 applies 0V to all of the word lines WLs in the unselected blocks. Since the select transistor ST1 connected to the selected select gate line SGD and bit line BL1 is in the cut off state, the channel potentials of the memory cell transistors MTs in the NAND cell including the select transistor ST1 go floating. As a result of coupling with the word lines WLs, the channel potentials rise to about the word line potential. On the other hand, since the select transistor ST1 connected to the selected select gate line SGD0 and bit line BL0 is in the on state, the channel potentials of the memory cell transistors MTs in the NAND cell including the select transistor ST1 are at VBB1.

Furthermore, the row decoder 20 applies VBB1 to the substrate (p-well region 202) in which memory cells are formed.

As a result, in the memory cell transistors MTs in the NAND cell including the select transistor ST1 cut off, since the potential difference between the gate and channel is insufficient, no electrons are injected into the floating gate. That is, the threshold value of the memory cell connected to the bit line BL1 and the selected word line WL6 (or the memory cell into which "1" data is to be written) remains negative.

On the other hand, in the memory cell transistors MTs connected to the unselected word lines WLs in the NAND cell including the select transistor ST1 connected to the selected select gate line SGD0 and to the bit line BL0, since the potential difference between the gate and channel is insufficient, no electrons are injected. That is, no data is written. In the memory cell transistors MTs connected to the select word line WL6, the potential difference between the gate and channel is 20V (=VPP−VBB1), electrons are injected into the floating gate by FN tunneling. As a result, the threshold value of the memory cell transistor MT changes to positive. That is, "0" data is written.

As described above, the data is written into one page of memory cell transistors simultaneously.

<Erase Operation>

Figure 22:
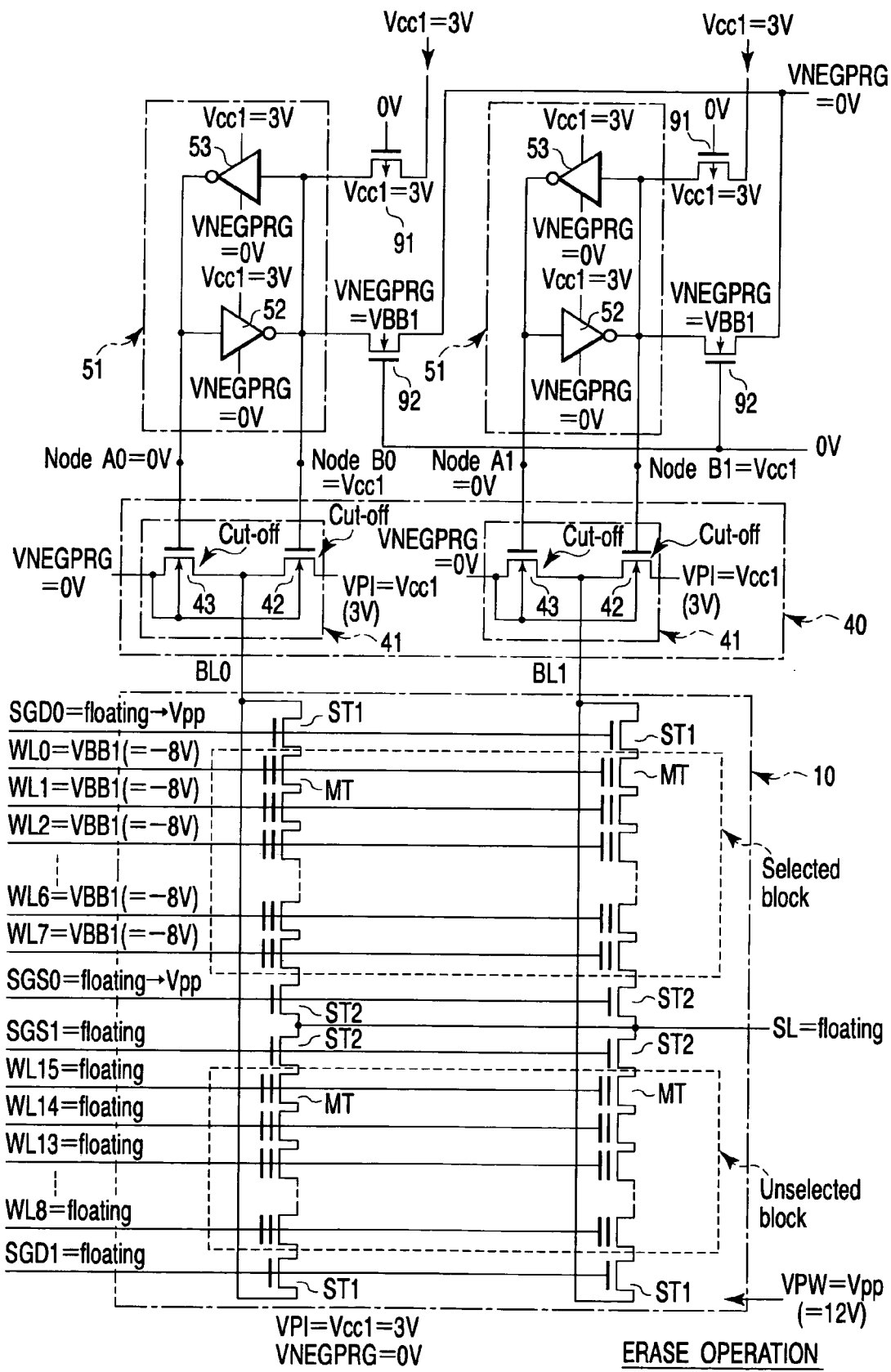

Next, an erase operation will be explained by reference to FIG. 22. FIG. 22 is a circuit diagram of the memory cell array 10, write selector 40, write circuit 50, and switch group 90 in an erase operation. Data is erased in blocks. An erase operation is carried out by pulling electrons out of the floating gate by FN tunneling. FIG. 22 shows a case where the data is erased from the block connected to select gate lines SGD0, SGS0.

Before an erase operation, the reset signal RESET is set to 0V and 3V is applied to one end of the current path of each of the MOS transistors 91 corresponding to all the bit lines. VPI is at Vcc1 and VNEGPRG is at 0V. Setting the reset signal RESET to 0V brings all of the MOS transistors 92 into the off state. All of the MOS transistors 91 are in the on state. As a result, 3V is applied to the input nodes of the latch circuits 51. Since VNEGPRG=0V, the potentials of nodes A0 to An are 0V and the potentials of nodes B0 to Bn are Vcc1. Accordingly, in all of the select circuits 41, the MOS transistors 42, 43 are cut off. Therefore, the bit lines BL0 to BLn are separated electrically from the latch circuits 51 and VNEGPRG and VPI and therefore go into the floating state.

Then, the row decoder 20 brings all of the select gate lines SGD0 to SGDm, SGS0 to SGSm into the floating state. In addition, the row decoder 20 not only selects any one of the blocks and applies VBB1 to all of the word lines WLs included in the selected block but also brings all of the word lines WLs included in the unselected blocks into the floating state. Furthermore, the row decoder 20 applies VPP2 (12V) to the semiconductor substrate (p-well region 202) in which NAND cells are formed. Specifically, as shown in FIG. 22, VBB1 is applied to all of the word lines WL0 to WL7 connected to the selected block and brings all of the word lines connected to the unselected blocks into the floating state.

Then, the potential difference between all the memory cell transistors MTs and the semiconductor substrate is 20V (=VPP−VBB1), causing electrons in the floating gates to be pulled out into the semiconductor substrate by FN tunneling. As a result, the data is erased from all of the memory cell transistors MTs in the selected block, with the result that the threshold values of the memory cell transistors MTs become negative. That is, as shown in FIG. 22, electrons are pulled out of the floating gates of all of the memory cell transistors MTs connected to the word lines WL0 to WL7 into the semiconductor substrate, thereby erasing the data.

In the unselected bocks, the potentials of the word lines WLs rise to about VPP as a result of coupling with the semiconductor substrate. Thus, no electrons are pulled out of the floating gates, with the result that the data is not erased. In addition, the potentials of the select gate lines SGS0 to SGSm, SGD0 to SGDm rise to about VPP as a result of coupling with the semiconductor substrate, preventing stress from being applied to the gate oxide film of the select transistor ST.

As described above, the data is erased from the selected block simultaneously.

<Read Operation>

Figure 23:
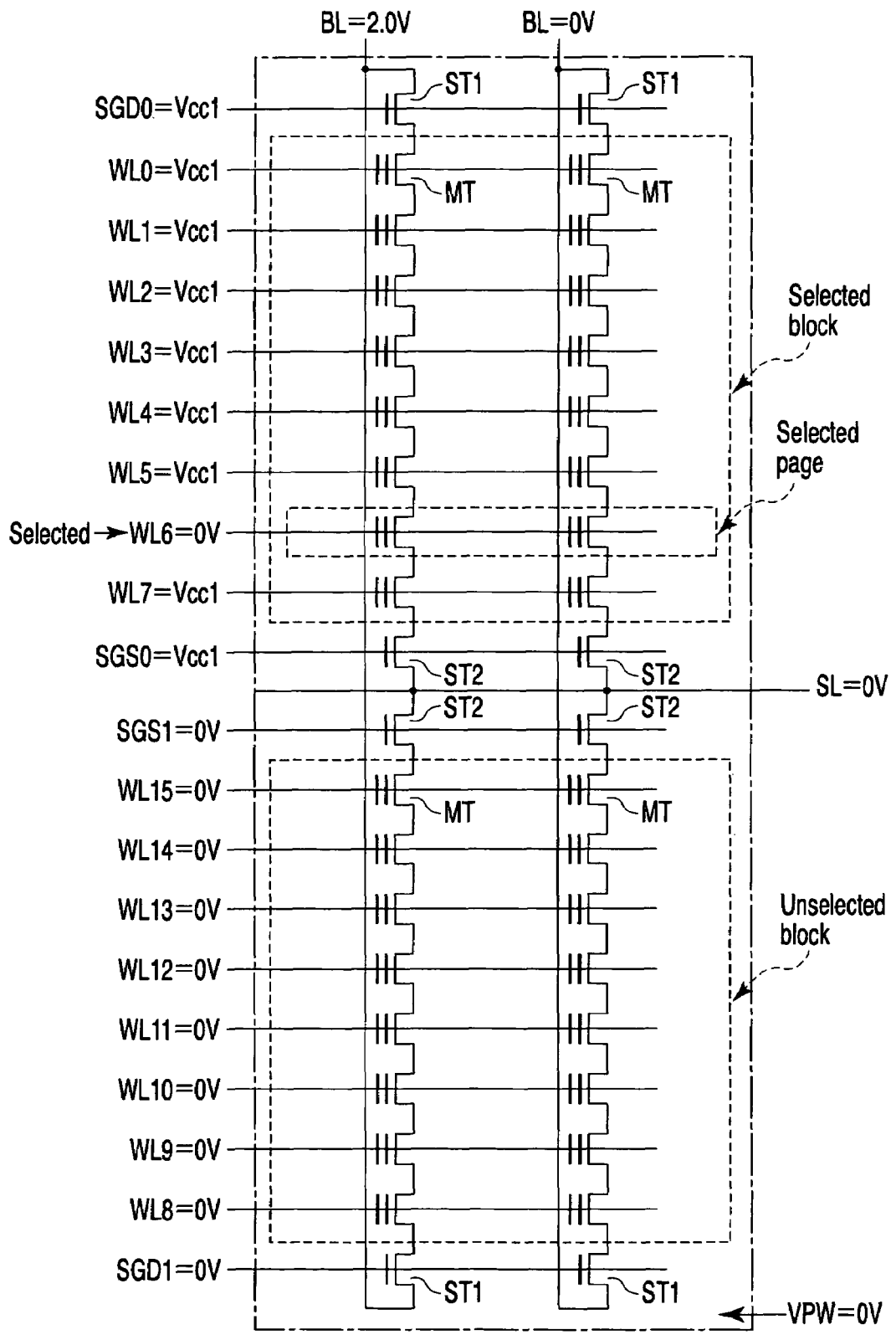

Next, a read operation will be explained by reference to FIG. 23. FIG. 23 is a circuit diagram of the memory cell array 10 of the NAND flash memory 3. FIG. 23 shows a case where the data is read from the memory cell transistor MT connected to the bit line BL0 and to the word line WL6.

First, the row decoder 20 selects the block including the memory cell transistor from which the data is to be read. Then, the row decoder 20 selects the select gate lines SGD0, SGS0 connected to the selected block and applies, for example, Vcc1 to the selected select gate lines SGD0, SGS0. In addition, the row decoder 20 unselects the select gate lines SGD1 to SGDm and SGS1 to SGSm connected to the unselected blocks and applies 0V to the unselected select gate lines. As a result, the select transistors ST1, ST2 connected to the selected select gate lines SGD0, SGS0 are brought into the on state. Then, the row decoder 20 selects the word line WL6 in the selected block. The row decoder 20 then applies 0V to the selected word line WL6 and Vcc1 to the unselected word lines in the selected block. The row decoder 20 applies 0V to all of the word lines WLs in the unselected blocks.

Then, the memory cell transistors MTs connected to the unselected word lines in the selected block are all turned on, regardless of whether the written data is "0" or "1." On the other hand, when the memory cell connected to the word line WL6 holds "1" data, the memory cell MC is in the on state. When the memory cell MC connected to the word line WL6 holds "0" data, the memory cell is in the off state.

In this state, the bit lines are connected to the sense amplifier 70 via the read selector 60, with the result that, for example, 2.0V is applied to the selected bit line BL0. Then, if the data written in the memory cell transistor MT connected to the selected word line WL6 and selected bit line BL0 is "1," current flows from the bit line to the source line. In contrast, if the written data is "0," no current flows.

As described above, the bit line potential varying with the current flowing from the bit line to the source line is amplified by the sense amplifier 140, thereby reading the data. While in the example of FIG. 23, the data has been written from one bit line, the data may be read simultaneously from a plurality of memory cell transistors by applying a potential to a plurality of bit lines. In the read operation, the MOS transistors 42, 43 in all of the select circuits 41 are turned off and the bit lines BL0 to BLn are separated electrically from the latch circuits 51 and VPI and VNEGPRG.

As described above, the NAND flash memory produces the effects in items (1) to (4) explained in the first embodiment.

Figure 24:
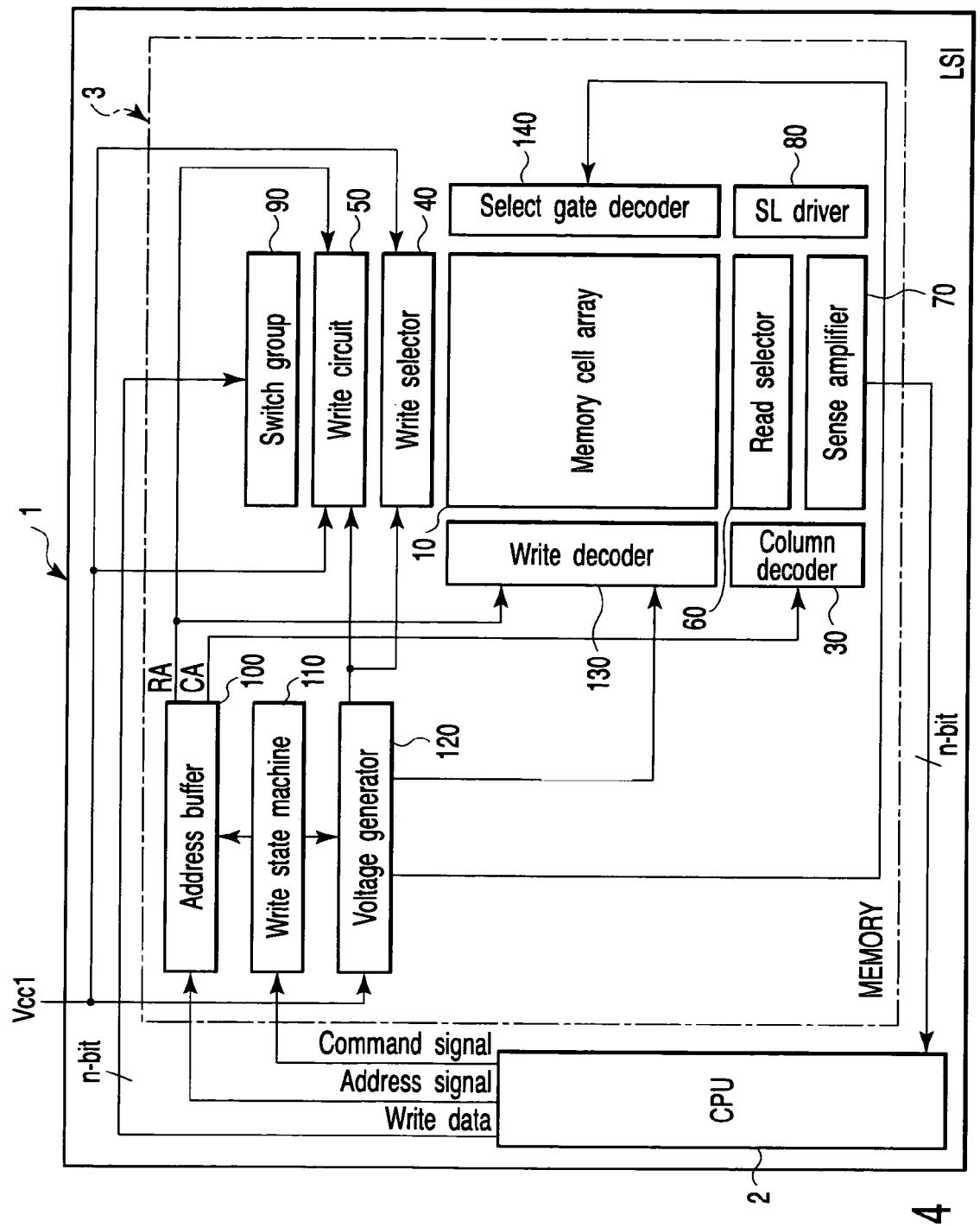
FIG. 24 is a block diagram of a system LSI according to a third embodiment of the present invention.

Next, a semiconductor memory device according to a third embodiment of the present invention will be explained by reference to FIG. 24. The third embodiment is such that the first embodiment is applied to a 2Tr flash memory. FIG. 24 is a block diagram of a system LSI including a 2Tr flash memory according to the third embodiment.

As shown in FIG. 24, a flash memory 3 of the third embodiment is such that the memory cell array 10 of FIG. 1 explained in the first embodiment is replaced with a 2Tr flash memory, the generated voltage of the voltage generator circuit 120 is changed, the row decoder 330 is eliminated, and a write decoder 130 and a select gate decoder 140 are added. In other words, the row decoder 20 includes the write decoder 130 and the select gate decoder 140. Hereinafter, only the points at which the third embodiment differs from the first embodiment will be explained.

Figure 25:
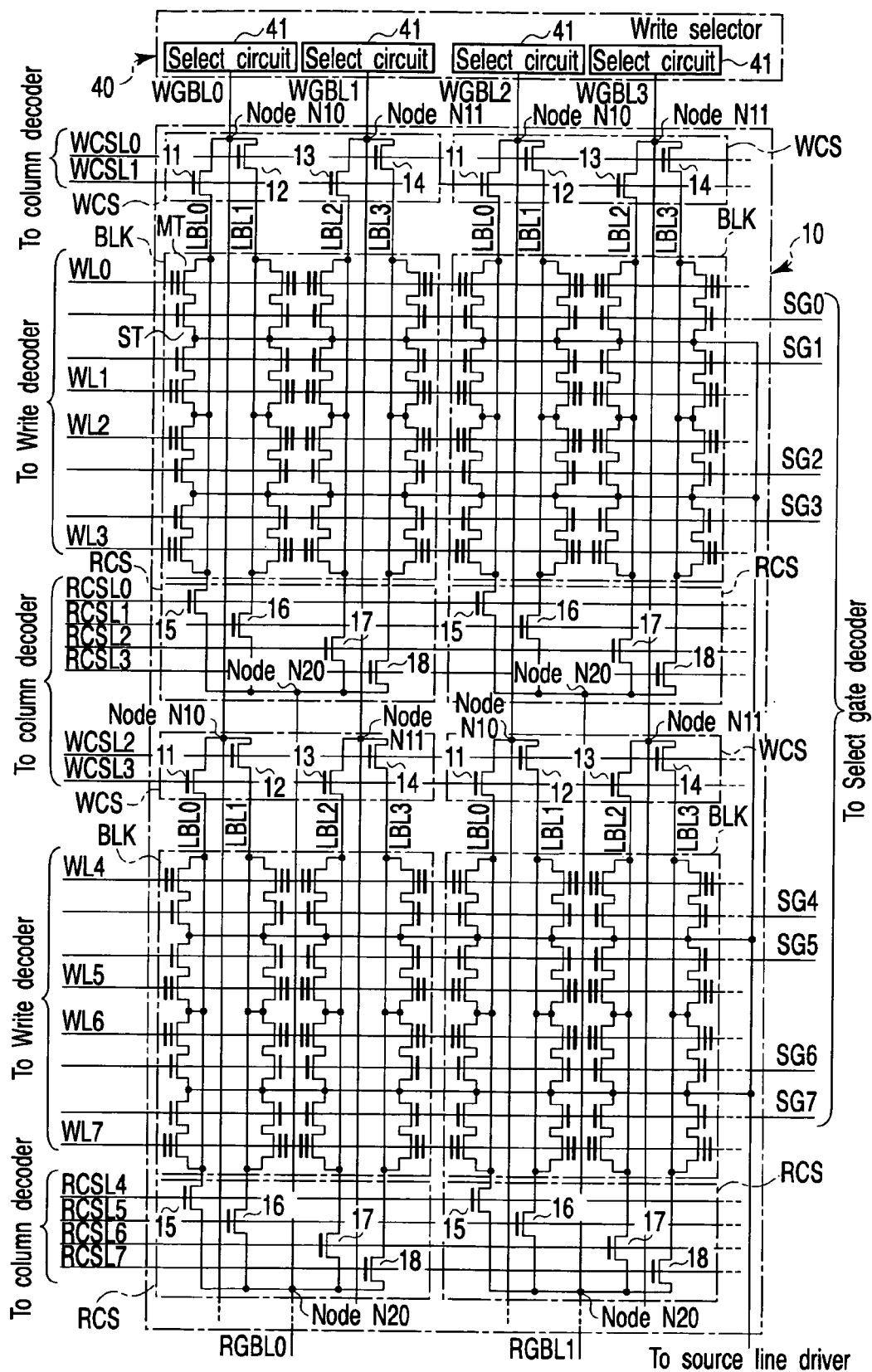
FIG. 25 is a circuit diagram of a memory cell array included in a 2Tr flash memory according to the third embodiment.

FIG. 25 is a circuit diagram of the memory cell array 10 included in the 2Tr flash memory 3 of the third embodiment and its peripheral circuitry.

As shown in FIG. 25, the memory cell array 10 has ((m+1)×(n+1)) memory cell blocks BLKs (m and n are natural numbers) and first column selectors WCSs and second column selectors RCSs which are provided for the memory cell blocks BLKs in a one-to-one correspondence. Although only (2×2) memory cell blocks BLKs are shown in FIG. 25, the number is illustrative and not restrictive.

Each of the memory cell blocks BLKs includes a plurality of memory cells MCs. The memory cells MCs are the memory cells MCs of the 2Tr flash memory explained in the first embodiment. Each of the memory cell blocks BLKs includes (4×4) memory cells. Although the number of memory cells MCs arranged in the column direction is 4 in FIG. 25, the number is illustrative and not restrictive and may be 8 or 16, for example. The memory cells MCs adjoining in the column direction share the source region of the select transistor ST or the drain region of the memory cell transistor MT. The drain regions of the memory cell transistors MTs in four columns of memory cells are connected to four local bit lines LBL0 or LBL3, respectively. One end of each of the local bit lines LBL0 to LBL3 is connected to the first column selector WCS and the other ends are connected to the second column selector RCS.

In the memory cell array 10, the control gates of the memory cell transistors MTs in a same row are connected commonly to any one of word lines WL0 to WL(4m−1). The gates of the select transistors STs in a same row are connected commonly to any one of select gate lines SG0 to SG(4m−1). The local bit lines LBL0 to LBL3 are connected commonly to the memory cell transistors in each of the memory cell blocks BLKs, whereas the word lines WLs and select gate lines SGs are connected commonly to the memory cell transistors and select transistors in a same row across the memory cell blocks. The word lines WL0 to WL(4m−1) are connected to the write decoder 370 and the select gate lines SG0 to SG(4m−1) are connected to the select gate decoder 380. The source regions of the select transistors STs are connected commonly to a plurality of memory cell blocks BLKs and then are connected to the source line driver 80.

Next, the configuration of the first column selector WCS will be explained. Each of the first column selectors WCSs includes four MOS transistors 11 to 14. One end of the current path of each of the MOS transistors 11 to 14 is connected to one end of the corresponding one of the local bit lines LBL0 to LBL 3. The other ends of the current paths of the MOS transistors 11 and 12 are connected to each other. The other ends of the current paths of the MOS transistors 13 and 14 are connected to each other. Hereinafter, the common junction node of the MOS transistors 11 and 12 is referred to as node N10 and the common junction node of the MOS transistors 13 and 14 is referred to as node N11. The gate of each of the MOS transistors 11 to 14 is connected to any one of the write column select lines WCSL0 to WCSL(2m−1). The MOS transistors 11, 13 included in the first column selectors WCSs in a same row are connected to the same write column select line WCSLi (i: 1, 3, 5, . . . ). The MOS transistors 12, 14 included in the first column selectors WCSs in a same row are connected to the same write column select line WCSL(i−1). The write column select lines WCSL0 to WCSL(2m−1) are selected by a column decoder 300 in a write operation.

Each of the nodes N10, N11 in the first column selector WCS is connected to any one of the write global bit lines WGBL0 to WGBL(2n−1). Each of the write global bit lines WGBL0 to WGBL(2n−1) connects commonly the nodes N10 or nodes N11 in the first column selectors in a same column. The write global bit lines WGBL0 to WGBL(2n−1) are connected by write selector 40 to the select circuits 41 provided for the write global bit lines in a one-to-one correspondence. The configuration of the select circuit 41 is as explained in the first embodiment. The write global bit lines are connected to the sources of the MOS transistors 42, 43 in the select circuits 41.

Next, the configuration of the second column selector RCS will be explained. Each of the second column selectors RCSs includes four MOS transistors 15 to 18. One end of the current path of each of the MOS transistors 15 to 18 is connected to one end of the corresponding one of the local bit lines LBL0 to LBL 3. The other ends of the current paths of the MOS transistors 15 to 18 are connected to one another. Hereinafter, the common junction node of the MOS transistors 15 to 18 is referred to as node N20. The gates of the MOS transistors 15 to 18 are connected to any one of read select lines RCSL0 to RCSL(4m−1) in a one-to-one correspondence. The MOS transistors 15 to 18 included in the second column selectors RCSs in a single row are connected to the same one of the read column select line RCSL0 to RCSL(4m−1). The read column select lines RCSL0 to RCSL(4m−1) are selected by the column decoder 30 in a read operation.

The node N20 in the second column selector RCS is connected to any one of the read global bit lines RGBL0 to RGBL(n−1). Each of the read global bit lines RGBL0 to RGBL(n−1) connects commonly the nodes N20 in the second column selectors RCSs in a same column. The read global bit lines RGBL0 to RGBL(n−1) are connected to the sense amplifier 70 via the read selector 60.

The configuration of the memory cell array 10 according to the third embodiment can also be explained as follows. In the memory cell array 10, a plurality of memory cells MCs are arranged in a matrix. The control gates of the memory cell transistors MTs of the memory cells in a same row are connected commonly to a word line. The gates of the select transistors of the memory cells in a same row are connected commonly to a select gate line. The drains of the memory cell transistors MTs of four memory cells MCs in a same column are connected commonly to any one of the local bit lines LBL0 to LBL3. Specifically, the memory cells MCs in the memory cell array 10 are connected to the local bit lines LBL0 to LBL3 in such a manner that a column of four memory cells MCs is connected to a different one of the local bit lines. Then, one end of each of the local bit lines LBL0 in a same column is connected via the MOS transistor 11 commonly to any one of the write global bit lines WGBL0 to WGBL(2n−1). One end of each of the local bit lines LBL1 in a same column is connected via the MOS transistor 12 commonly to any one of the write global bit lines WGBL0 to WGBL(2n−1). In addition, one end of each of the local bit lines LBL2 in a same column is connected via the MOS transistor 13 commonly to any one of the write global bit lines WGBL0 to WGBL(2n−1). One end of each of the local bit lines LBL3 in a same column is connected via the MOS transistor 14 commonly to any one of the write global bit lines WGBL0 to WGBL(2n−1). The other end of each of the local bit lines LBL0 to LBL3 is connected via the corresponding one of the MOS transistors 15 to 18 commonly to any one of the read global bit lines RGBL0 to RGBL(n−1). The sources of the select transistors STs of the memory cells MCs are connected to one another and then are connected to a source line driver. In the memory cell array with the above configuration, four columns each of which includes four memory cells MCs connected to the same local bit line form a same memory block BLK. The memory cell blocks in a same column are connected to a common write global bit line and a common read global bit line. The memory cell blocks BLKs in a different column are connected to a different write global bit line and a different read global bit line. The number of memory cells in the memory cell block, the number of read global bit lines RGBLs, and the number of write global bit lines WGBLs are not limited to the values in the third embodiment.

Figure 26:
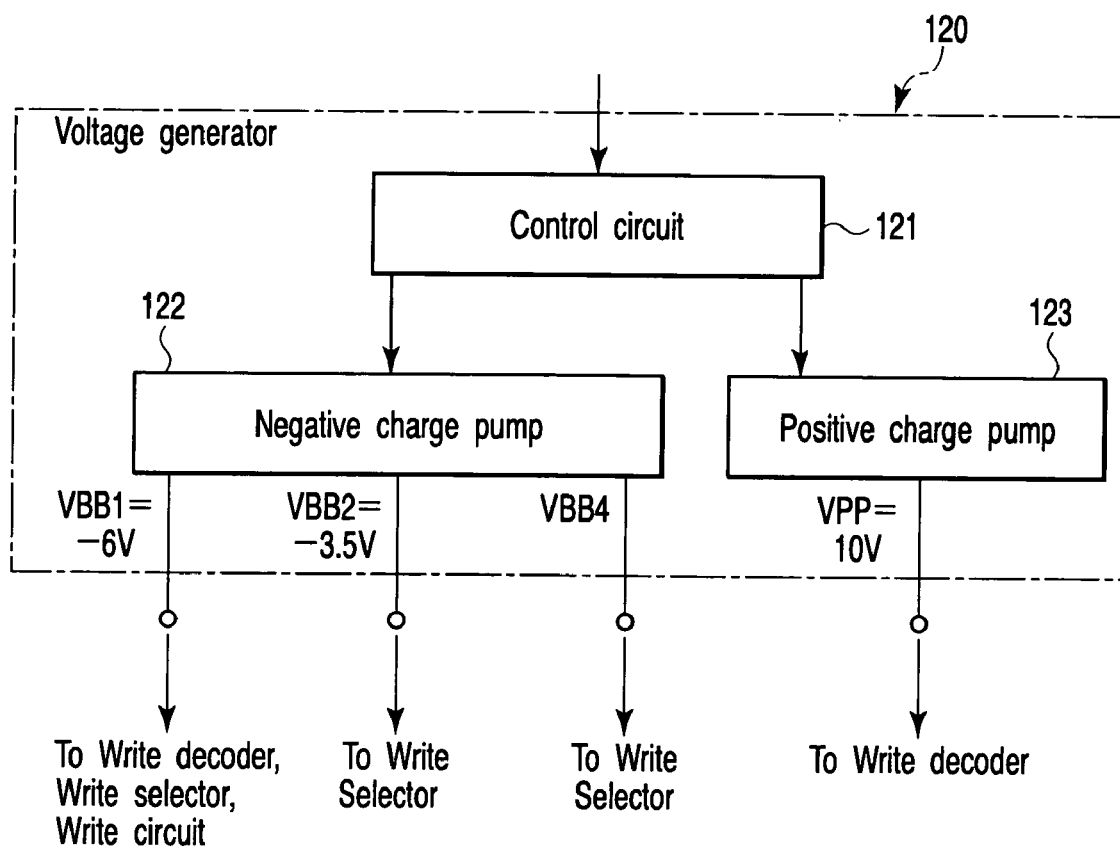
FIG. 26 is a circuit diagram of a voltage generator circuit included in the 2Tr flash memory according to the third embodiment.

Next, the voltage generator circuit 120 will be explained by reference to FIG. 26. FIG. 26 is a circuit diagram of the voltage generator circuit 120. The voltage generator circuit 120 generates a plurality of internal voltages on the basis of the voltage Vcc1 externally inputted. As shown in FIG. 26, the voltage generator circuit 120 has the same configuration as explained in the first embodiment. The charge pump circuit 122 generates negative voltages of VBB1 (=−6V), VBB2 (=−3.5V), and VBB4. The charge pump circuit 123 generates a positive voltage of VPP (=10V). The negative voltage VBB1 and the positive voltage VPP are supplied to the write decoder 130. The negative potentials VBB1, VBB2, and VBB4 are supplied to the write selector 40. The negative voltage VBB1 is also supplied to the write circuit 50.

Figure 27:
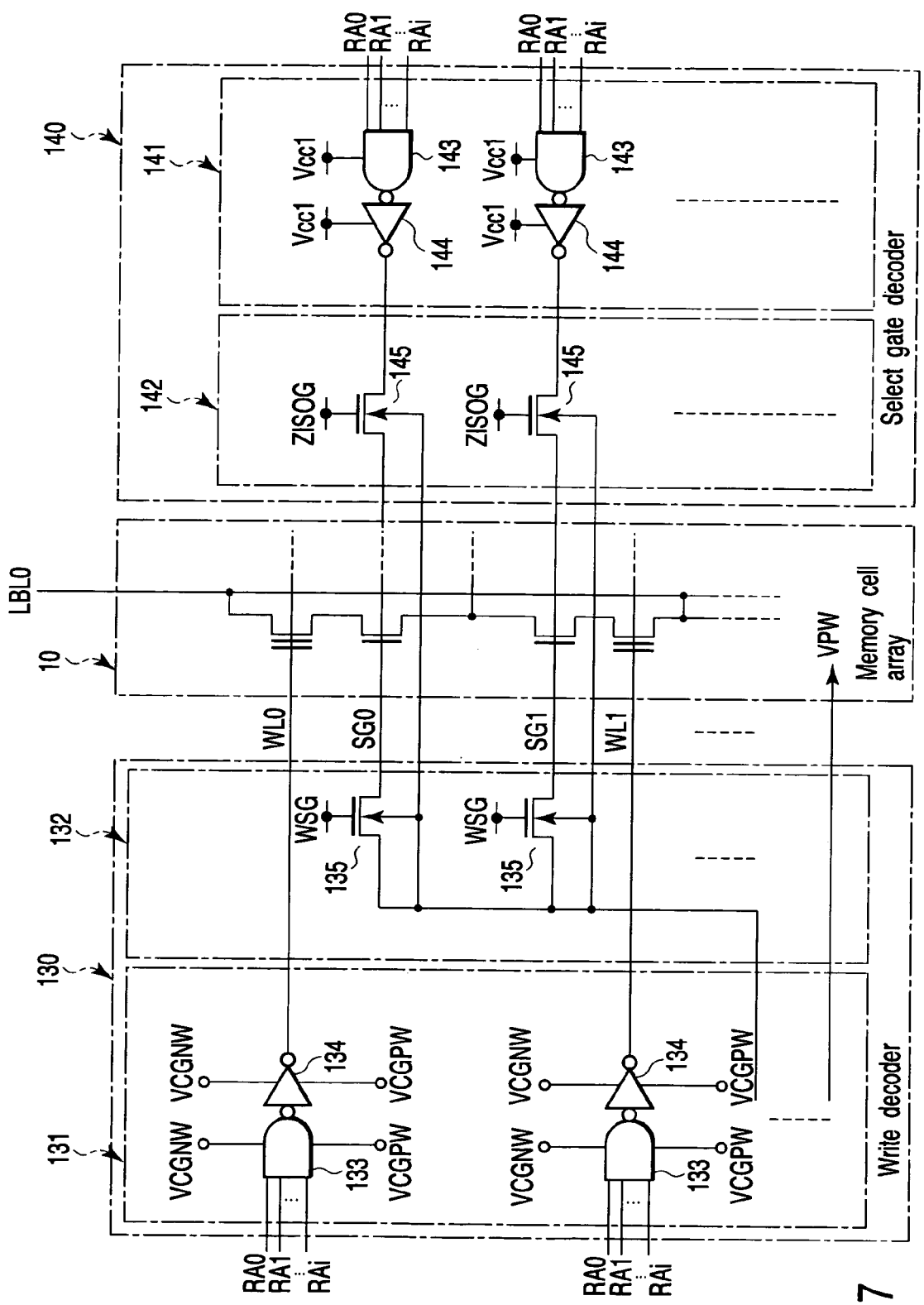
FIG. 27 is a circuit diagram of the memory cell array, a write decoder, and a select gate decoder included in the 2Tr flash memory according to the third embodiment.

Next, the configuration of the write decoder 130 and select gate decoder 140 will be explained by reference to FIG. 27. The write decoder 130 selects any one of the word lines WL0 to WLm and applies the positive voltage VPP (10V) to the selected word line and the negative voltage VBB1 (−6V) to all of the select gate lines SG0 to SGm in a write operation. Moreover, in an erase operation, the write decoder 130 applies the negative potential VBB1 to all of the word lines and the positive potential VPP to all of the select gate lines SG0 to SGm.

The select gate decoder 140 selects any one of the select gate lines SG0 to SGm and applies the positive voltage Vcc1 to the selected select gate line in a read operation.

First, the configuration of the select gate decoder 140 will be explained. The select gate decoder 140 includes a row address decode circuit 141 and a switch element group 142. The row address decode circuit 141, which operates on the power supply voltage Vcc1, decodes (i+1)-bit row address signals RA0 to RAi, thereby producing a row address decode signal. The row address decode circuit 141 has NAND circuits 143 and inverters 144 provided for the select gate lines SG0 to SGm in a one-to-one correspondence. The NAND circuit 143 performs NAND operation on each bit in the row address signals RA0 to RAi. Then, the inverter 144 inverts the result of the NAND operation and outputs the inverted result as a row address decode signal.

The switch element group 142 has n-channel MOS transistors 145. The n-channel MOS transistors 145 are provided for the select gate lines SG0 to SGm in a one-to-one correspondence. The output of the inverter 144 is supplied to the select gate lines SG0 to SGm via the current path of the corresponding n-channel MOS transistor 145. A control signal ZISOG is inputted to the gate of the n-channel MOS transistor 145. The control signal ZISOG turns off the MOS transistor 145 in a write operation and turns on the MOS transistor 145 in a read operation.

Next, the configuration of the write decoder 130 will be explained. The write decoder 130 includes a row address decode circuit 131 and a switch element group 132. The row address decode circuit 131 decodes (i+1)-bit row address signals RA0 to RAi, thereby producing a row address decode signal. The row address decode signal is supplied to the word lines WL0 to WLm. The row address decode circuit 131 has NAND circuits 133 and inverters 134 provided for the word lines WL0 to WLm in a one-to-one correspondence. The NAND circuits 133 and inverters 134 have their positive power-supply voltage nodes connected to a power-supply voltage node VCGNW and their negative power-supply voltage nodes connected to a power supply voltage node VCGPW. The NAND circuits 133 perform NAND operation on each bit in the row address signals RA0 to RAi. The positive voltage VPP and negative voltage VBB1 generated by the voltage generator circuit 120 or 0V are applied to the power-supply voltage nodes VCGNW, VCGPW. The inverters 134 invert the result of the NAND operation and output the inverted result as a row address decode signal.

The switch element group 132 has n-channel MOS transistors 135. The n-channel MOS transistors 135 are provided for the select gate lines SG0 to SGm in a one-to-one correspondence. One end of the current path of each of the n-channel MOS transistors 135 is connected to the corresponding one of the select gate lines SG0 to SGm. The negative potential VBB1 or the positive potential VPP is applied to the other end. The control signal WSG is inputted to the gate. Then, the control signal WSG turns on the MOS transistor 135 in a write operation or in an erase operation.

The select circuits 41 in the write selector 40, the latch circuits 51 in the write circuit 50, and the MOS transistors 91, 92 in the switch group 90 are provided for the write global bit lines in a one-to-one correspondence.

Figure 28:
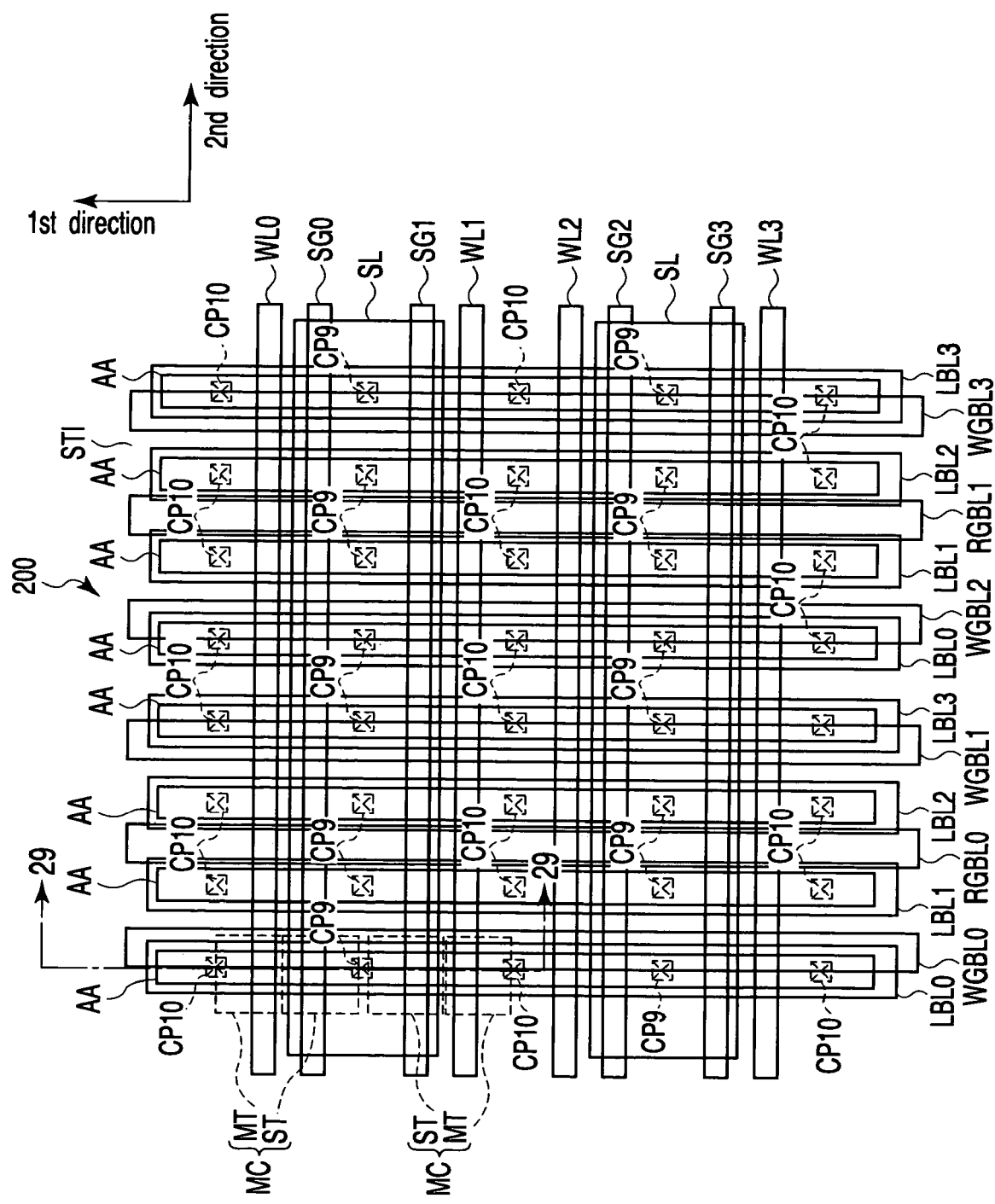
FIG. 28 is a plan view of the memory cell array included in the 2Tr flash memory according to the third embodiment.

Next, a plane configuration and a sectional configuration of the memory cell array 10 included in the 2Tr flash memory 3 will be explained. FIG. 28 is a plan view of a part of the memory cell array 10.

As shown in FIG. 28, in the semiconductor substrate 200, a plurality of strip-shaped element regions AAs extending in a first direction are formed in a second direction. Strip-shaped word lines WL0 to WLm and select gate lines SGD0 to SGDm, which extend in the second direction, are formed so as to cross the plurality of element regions AAs. In the regions where the word lines WL0 to WLm cross the element regions AAs, memory cell transistors MTs are formed. In the regions where the select gate lines SG0 to SGm cross the element regions AAs, select transistors STs are formed. Furthermore, in the regions where the word lines WL0 to WLm cross the element regions AAs, floating gates (not shown) isolated on a memory cell transistor MT basis are formed. Like the memory cell transistor MT, each of the select transistors STs has a control gate and a floating gate. However, differently from the memory cell transistor MT, the floating gate is connected to both of the select transistors STs adjacent to each other in the second direction. Then, in a shunt region (not shown), the floating gate of the select transistors STs is connected to their control gates.

Between adjoining select lines SGs (i.e., between SG0 and SG1, between SG2 and SG3, . . . ), a strip-shaped source line SL extending in the second direction is formed. The source line SL is connected to the source regions of the select transistors STs via contact plugs CP9. The individual source lines SLs are connected to one another in a region (not shown) and are further connected to a source line driver 80.

On the element regions AAs, strip-shaped local bit lines LBL0 to LBL3 extending in the first direction are formed. The local bit lines LBL0 to LBL3 are connected to the drain regions of the memory cell transistors MTs via contact plugs CP10.

Furthermore, at a level higher than that of the local bit lines LBL0 to LBL3, strip-like write global bit lines WGBL(2n−1) and read global bit lines RGBL(n−1) extending in the first direction are formed.

Figure 29:
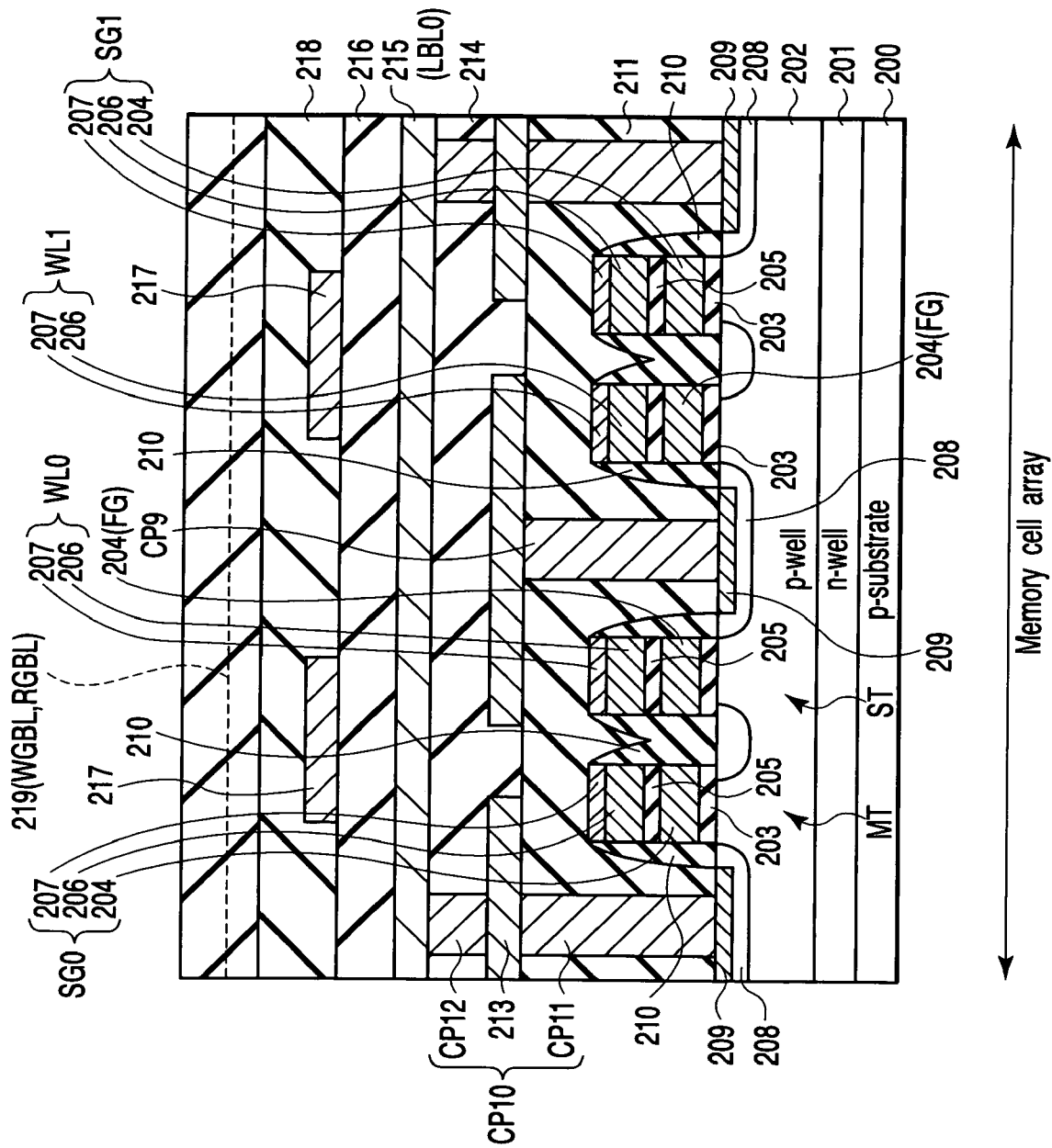
FIG. 29 is a sectional view taken along line 29—29 of FIG. 28.

FIG. 29 is a sectional view taken along line 29—29 of FIG. 28.

As shown in FIG. 29, at the surface of the element region AA of the p-type semiconductor (silicon) substrate 200, an n-well region 201 is formed. At the surface of the n-well region 201, a p-well region 202 is formed. On the p-well region 202, a gate insulating film 203 is formed. On the gate insulating film 203, the gate electrodes of memory cell transistors MTs and select transistors STs are formed. Each of the gate electrodes of the memory cell transistors MTs and select transistors STs includes a polysilicon layer 204 formed on the gate insulating film 203, an inter-gate insulating film 205 formed on the polysilicon layer 204, a polysilicon layer 206 formed on the inter-gate insulating film 205, and a silicide layer 207 formed on the polysilicon layer 206. The inter-gate insulating film 205 is formed of, for example, an ON film, an NO film, or an ONO film. In the memory cell transistor MT, the polysilicon layers 204, which are separated from one another between element regions AAs adjoining in the word line direction, function as floating gates (FG). In addition, the polysilicon layer 206 and silicide layer 207 function as control gates (word lines WLs). The polysilicon layers 206 are connected to one another between element regions AAs adjoining in the word line direction. In the select transistors STs a part of the inter-gate insulating film 205 is removed in a shunt region (not shown) and the polysilicon layers 204, 206 are connected electrically in the shut region. Then, the polysilicon layers 204, 206 and the silicide layer 207 function as select gate lines SGs. In the select transistors STs, the polysilicon layer 204 and polysilicon layer 206 are not separated between element regions AAs adjoining in the word line direction and are connected to each other. That is, the floating gates are not separated on a cell basis differently from the memory cell transistor MT, but are all connected to one another.

The memory cells MC including memory cell transistors MTs and select transistors STs are formed so as to have the following relationship. Adjoining memory cells MC, MC have their select transistors adjacent to each other and their memory cell transistors MTs adjacent to each other. The adjoining transistors share the impurity diffused layer 208. Therefore, when their select transistors STs are adjacent to each other, the two adjoining memory cells MC, MC are arranged so as to be symmetric with respect to the impurity diffused layer 208 shared by the two select transistors ST, ST. Conversely, when the memory cell transistors MTs are adjacent to each other, the two adjoining memory cells MC, MC are arranged so as to be symmetric with respect to the impurity diffused layer 208 shared by the two memory cell transistors MT, MT.

At the surface of the semiconductor substrate 200 located between adjoining gate electrodes, impurity diffused layers 208 functioning as source and drain regions are formed. Each impurity diffused layer 208 is shared by adjoining transistors. Specifically, an impurity diffused layer 208 between two adjoining select transistors STs functions as a source region for the two select transistors STs. An impurity diffused layer 208 between two adjoining memory cell transistors MTs functions as a drain region for the two memory cell transistors MTs. Furthermore, an impurity diffused layer 208 between a memory cell transistor MT and a select transistor ST adjacent to each other functions as the source region of the memory cell transistor MT and the drain region of the select transistor ST. At the surface of the drain region 208 of the memory cell transistor MT and at the surface of the source region 208 of the select transistor ST, a silicide layer 209 is formed. In the source region 208 of the memory cell transistor MT and in the drain region 208 of the select transistor ST, no silicide layer is formed. On the side of the gate electrode (stacked gate) of each of the memory cell transistors MTs and select transistors STs, a sidewall insulating film 210 is formed. The sidewall insulating film 210 is formed on the side facing the source region 208 of the stacked gate and on the side facing its drain region 208. The region between the stacked gates of the memory cell transistor MT and select transistors ST is filled with the sidewall insulating film 210. Thus, the top of the source region of the memory cell transistor MT and the top of the drain region of the select transistor ST are covered with the sidewall insulating film 210.

On the semiconductor substrate 200, an interlayer insulating film 211 is formed so as to cover the memory cell transistors MTs and select transistors STs. In the interlayer insulating film 211, a contact plug CP9 is formed which reaches the silicide layer 209 formed in the impurity diffused layer (source region) 208 shared by two select transistors ST, ST. On the interlayer insulating film 211, a metal wiring layer 212 to be connected to the contact plug CP9 is formed. The metal wiring layer 212 functions as a source line SL. In the interlayer insulating film 211, a contact plug CP11 is formed which reaches the silicide layer 209 formed in the impurity diffused layer (drain region) 208 shared by two memory cell transistors MT, MT. On the interlayer insulating film 211, a metal wiring layer 213 to be connected to the contact plug CP11 is formed.

On the interlayer insulating film 211, an interlayer insulating film 214 is formed so as to cover the metal wiring layers 212, 213. In the interlayer insulating film 214, a contact plug CP12 reaching the metal wiring layer 213 is formed. On the interlayer insulating film 214, a metal wiring layer 215 connected commonly to a plurality of contact plugs CP12 is formed. The metal wiring layer 215 functions as a bit line BL. The contact plugs CP11, CP12, and metal wiring layer 213 correspond to the contact plugs CP10 in FIG. 9.

On the interlayer insulating film 214, an interlayer insulating film 216 is formed so as to cover the metal wiring layer 215. On the interlayer insulating film 216, a metal wiring layer 217 is formed. The metal wiring layer 217, which is connected to the silicide layers 207 of the select transistor ST in a region (not shown), functions as the shunt wiring lines of the select gate lines SGs. On the interlayer insulating film 216, an interlayer insulating film 218 is formed so as to cover the metal wiring layer 217.

On the interlayer insulating film 218, a metal wiring layer 219 extending in the direction of the local bit line is formed. The metal wiring layer 219 functions as a write global bit line and a read global bit line. On the interlayer insulating film 218, an interlayer insulating film 220 to cover the metal wiring layer 219 is formed.

Next, the operation of the 2Tr flash memory configured as described above will be explained by reference to FIG. 8.

<Initial Operation>

An initial operation is the same as explained in the first embodiment by reference to FIG. 9. Specifically, 0V is applied to one end of the current path of each of the MOS transistors 91, thereby initializing the data in the latch circuits 51. As a result, the potentials of the nodes A0 to An are at Vcc1 and the potentials of the nodes B0 to Bn are at 0V.

<Data Latch Operation>

A data latch operation is the same as explained in the first embodiment by reference to FIG. 10. Specifically, the writing data is inputted to one end of the current path of each of the MOS transistors 91. In the third embodiment, an explanation will be given using a case where "0" data is written into the memory cells connected to the write global bit line WGBL0 and "1" data is written into the memory cells connected to the write global bit line WGBL1. Thus, the data in the latch circuit 51 corresponding to the write global bit line WGBL0 remains in the initialized state, whereas the data in the latch circuit 51 corresponding to the write global bit line WGBL1 is reversed. As a result, the potentials of node A0 and node B0 are Vcc1 and 0V, respectively, and the potentials of node A1 and node B1 are 0V and Vcc1, respectively.

<Write Operation>

Figure 30:
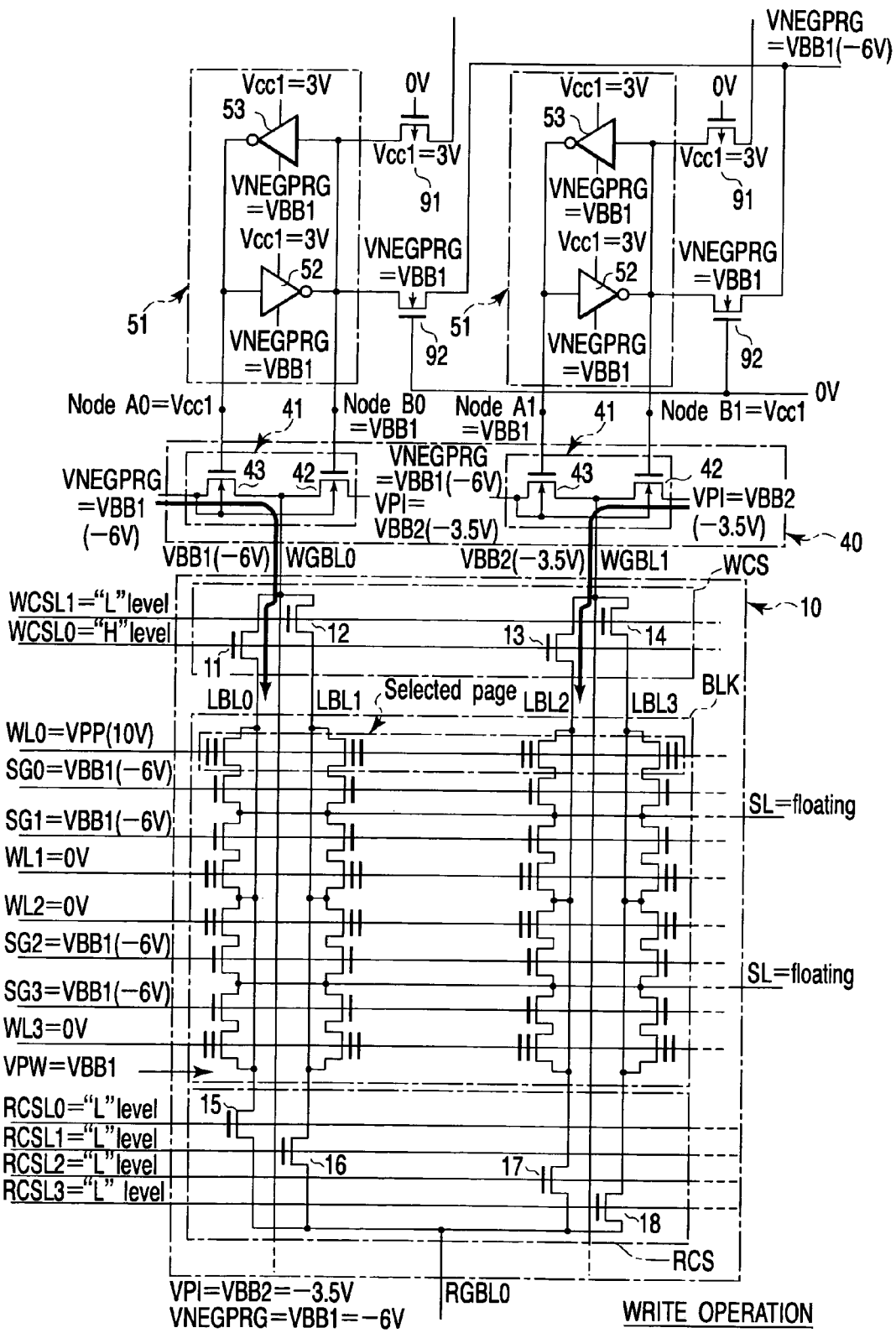
FIG. 30 is a circuit diagram of the memory cell array, write selector, write circuit, and switch group when the 2Tr flash memory of the third embodiment is written into.

A write operation will be explained by reference to FIG. 30. Data is written simultaneously into all of the memory cell blocks in a same row. In each memory cell block, the memory cells written into at the same time are only two, the memory cell connected to one of the local bit lines LBL0 and LBL1 and the memory cell connected to one of the local bit lines LBL2 and LBL3.

In FIG. 8, a write operation is carried out at time t4 or later. FIG. 30 is a circuit diagram of the memory cell array 10, write selector 40, write circuit 50, and switch group 90 in a write operation. In FIG. 30, it is assumed that data is written into the memory cell transistors MTs connected to the word line WL0 and the local bit lines LBL0, LBL2 and that, of the memory cell transistors MTs, "0" data is written into the one connected to the local bit line LBL0 and "1" data is written into the one connected to the local bit line LBL1. In other words, the memory cell connected to the local bit line LBL0 is selected and the memory cell connected to the local bit line LBL1 is unselected.

First, before a write operation, the reset signal RESET remains at 0V. Then, VNEGPRG is set to VBB1 (=−6V) at time t3 and VPI is set to VBB2 (=−3.5V) at time t4. The charge pump circuit 122 outputs the negative potentials VBB1 and VBB2 under the control of the write state machine 110. VPI may be set to another negative potential of VBB4, not VBB2. In this case, the charge pump circuit 122 outputs the negative potential VBB4 under the control of the write state machine 110.

Then, the low-voltage-side power supply voltage of the inverters 52, 53 in the latch circuit 51 changes from 0V to VBB1, with the result that the potentials of node B0 and node A1 change from 0V to VBB1. Then, in the select circuit 41 corresponding to the write global bit line WGBL0, the MOS transistor 43 is in the on state. In the select circuit 41 corresponding to the write global bit line WGBL1, the MOS transistor 42 is in the on state. Since the source potentials of the MOS transistors 42, 43 are VPI=VBB2 and VNEGPRG=VBB1, respectively, VBB1 and VBB2 are supplied to the write global bit lines WGBL0 and WGBL1, respectively.

Then, the write decoder 130 selects the word line WL0 and applies the positive voltage VPP (10V) to the selected word line WL0 and the negative potential VBB1 (−6V) to all of the select gate lines SG0 to SGm. In addition, the write decoder 130 applies VBB1 to the substrate (p-channel region 202) in which memory cells are formed.

Furthermore, the column decoder 30 selects WCSL0 from the two write column select lines connected to the first column selector WCS corresponding to the memory cell block BLK including the selected word line WL0. This brings the MOS transistors 11, 13 in the first column selector WCS into the on state. As a result, the write global bit line WGBL0 and the local bit line LBL0 are connected electrically and the write global bit line WGBL1 and the local bit line LBL2 are connected electrically.

All of the write column select lines connected to the write selector WSEL corresponding to the memory cell block BLK not including the selected word line WL0 are unselected. Consequently, the MOS transistors 11 to 14 in the first column selector WCS corresponding to the memory cell block BLK not including the selected word line are turned off. Moreover, the column decoder 30 unselects all of the read column select lines RCSL0 to RCSL(4m−1). This brings the MOS transistors 15 to 18 in all of the second column selectors RCS into the off state. Thus, the read global bit line RGBL is separated electrically from the local bit line LBL0 to LBL3.

As a result, the write voltage (VBB1) is supplied from the write global bit line WGBL0 via the MOS transistor 11 in the first column selector WCS to the local bit line LBL0 of the memory cell block BLK including the selected word line WL0. In addition, the write inhibit voltage VPI (VBB2) is supplied from the write global bit line WGBL1 via the MOS transistor 13 to the local bit line LBL2 of the memory cell block BLK including the selected word line WL0.

As a result, in the memory cell transistor MT connected to the write global bit line WGBL1 and word line WL0, since the potential difference between the gate and channel is insufficient (VPP−VBB2=13.5V), no electrons are injected into the floating gate. That is, the threshold value of the memory cell remains negative.

On the other hand, in the memory cell transistor MT connected to the write global bit line WGBL0 and word line WL0, since the potential difference between the gate and channel is sufficient (VPP1−VBB1=16V), electrons are injected into the floating gate by FN tunneling. As a result, the threshold value of the memory cell transistor MT changes to positive. That is, "0" data is written.

As described above, the data is written into one page of memory cell transistors simultaneously.

<Erase Operation>

Figure 31:
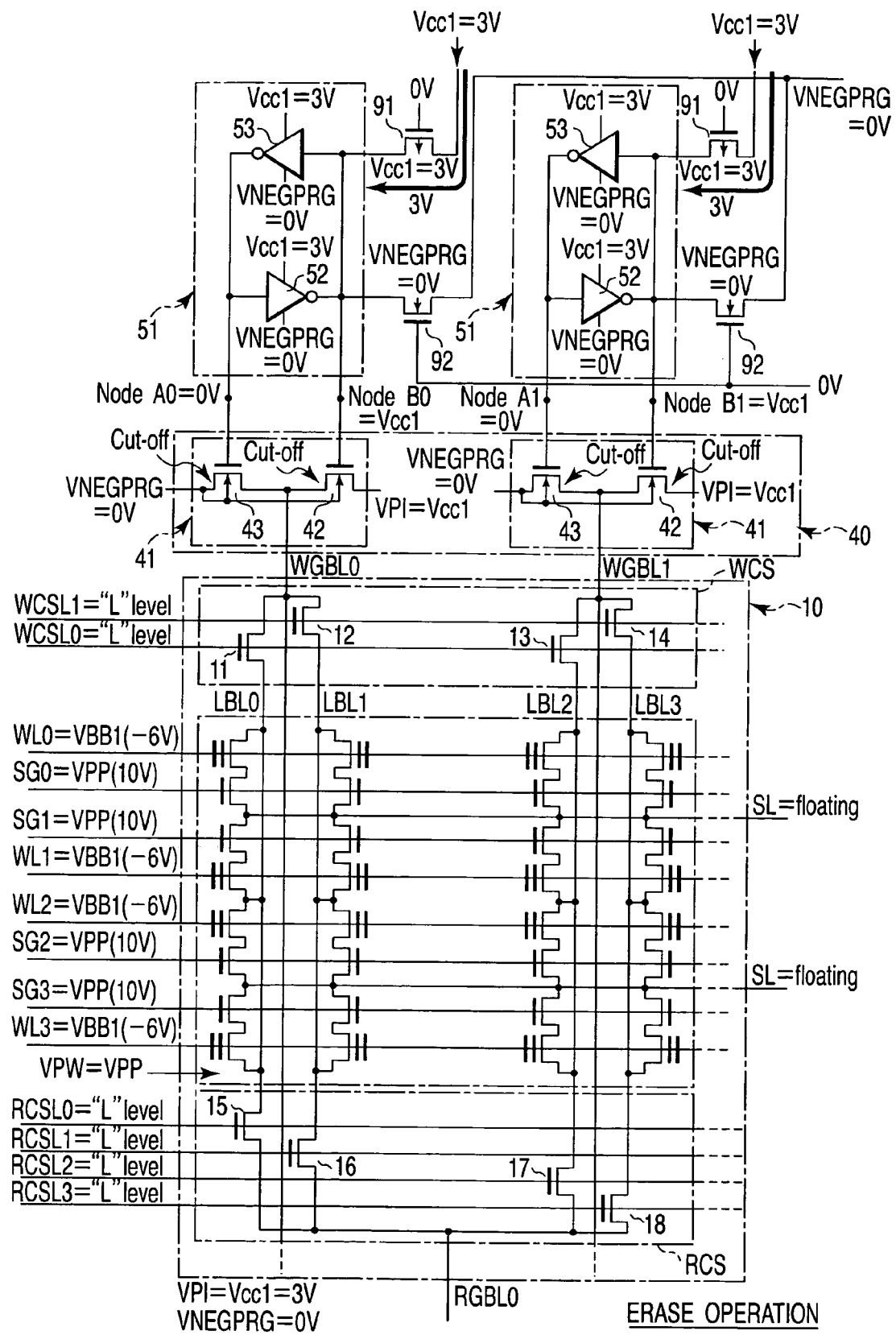

Next, an erase operation will be explained by reference to FIG. 31. FIG. 31 is a circuit diagram of the memory cell array 10, write selector 40, write circuit 50, and switch group 90 in an erase operation. Data is erased simultaneously from all of the memory cells sharing a well. An erase operation is carried out by pulling electrons out of the floating gate by FN tunneling.

Before an erase operation, the reset signal RESET is set to 0V and 3V is applied to one end of the current path of each of the MOS transistors 91 corresponding to all the write global bit lines. VPI is at Vcc1 and VNEGPRG is at 0V. Then, setting the reset signal RESET to 0V brings all of the MOS transistors 92 into the off state. All of the MOS transistors 91 are in the on state. As a result, 3V is applied to the input node of each of the latch circuits 51. Since VNEGPRG=0V, the potentials of nodes A0 to An are 0V and the potentials of nodes B0 to Bn are Vcc1. Accordingly, in all of the select circuits 41, the MOS transistors 42, 43 are cut off. Therefore, the write global bit lines WGBL0 to WGBL(2n−1) are separated electrically from the latch circuits 51 and VNEGPRG and VPI and therefore go into the floating state.

Then, the column decoder 30 unselects all of the write column select lines WCSL0 to WCSL(2m−1) and read column select lines RCSL0 to RCSL(4m−1) and applies the low level to them. This brings all of the MOS transistors 11 to 18 into the off state.

In addition, the write decoder 130 applies the negative voltage VBB1 to all of the word lines WL0 to WLm in the selected block, the positive potential VPP to all of the select gate lines SG0 to SGm, and VPP to the p-well region 202 in which the memory cell array is formed.

As a result, electrons are pulled out of the floating gates of the memory cell transistors of the memory cells MCs by FN tunneling. This makes negative the threshold voltages of all the memory cells MCs connected to the word lines WL0 to WLm, thereby erasing the data.

As described above, the data is erased simultaneously.

<Read Operation>

Figure 32:
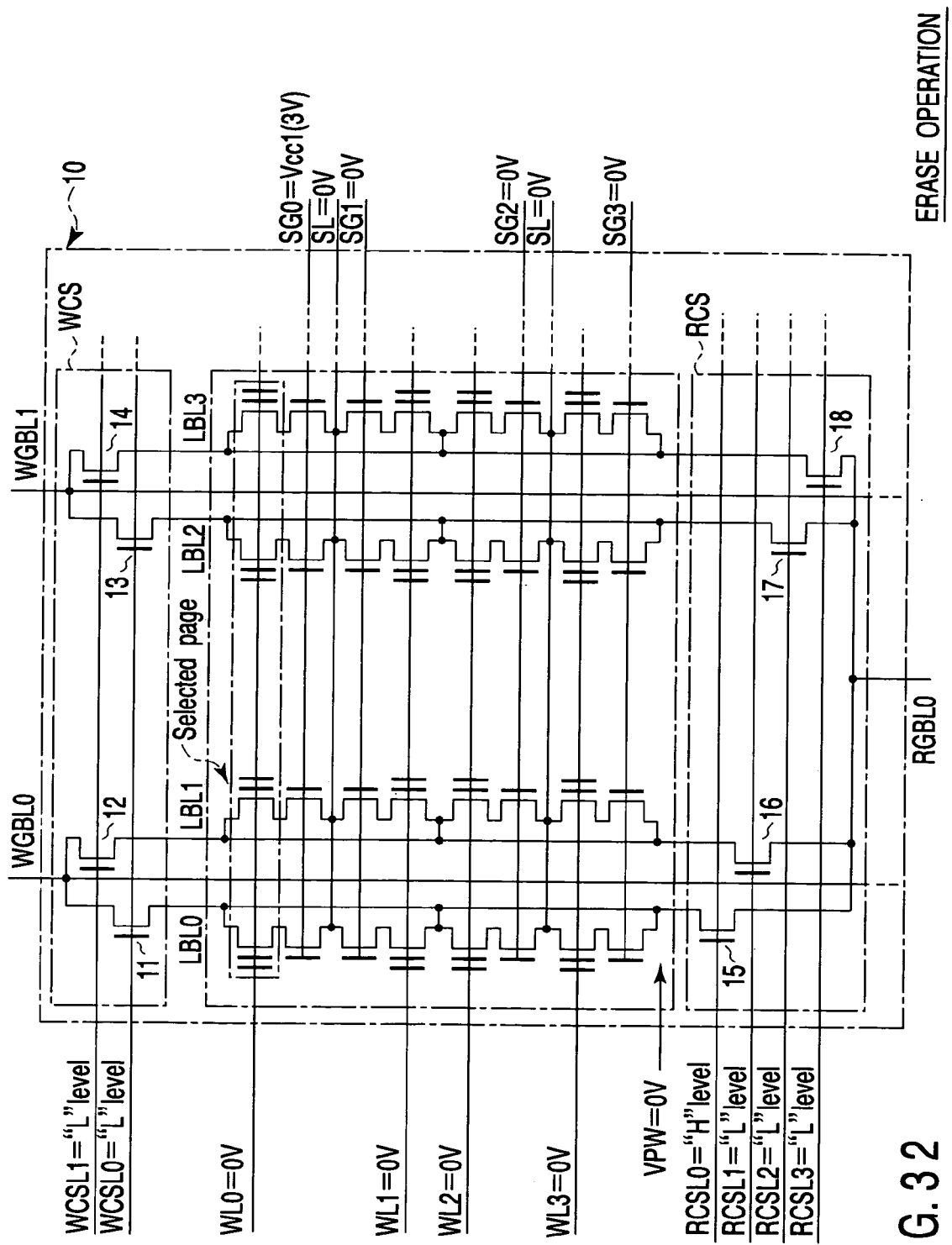

Next, a read operation will be explained by reference to FIG. 32. FIG. 32 is a circuit diagram of the memory cell array 20 of the 2Tr flash memory 3. FIG. 32 shows a case where the data is read from the memory cell transistor MT connected to the local bit line LBL0 and to the word line WL0.

In the third embodiment, data is read from one memory cell per memory cell block. When there are a plurality of read global bit lines in each memory cell block, as much data as there are read global bit lines is read.

First, the select gate decoder 140 selects the select gate line SG0 (or brings the select gate line into the high level). The write decoder 130 unselects all of the word lines WL0 to WLm (or sets all of the word lines to 0V). In addition, the source line driver 360 sets the potential of the source line to 0V.

Then, the column decoder 30 selects RCSL0 from the four read column select lines RCSL0 to RCSL3 connected to the second column selector RCS corresponding to the memory cell block BLK including the selected select gate line SG0. This turns on the MOS transistor 15 in the second column selector RCS corresponding to the memory cell block BLK including the selected select gate line SG0. As a result, the read global bit line RGBL0 is connected electrically to the local bit line LBL0. All of the read column select lines connected to the second column selector RCS corresponding to the memory cell block BLK not including the selected select gate line SGS0 are unselected.

In addition, the column decoder 30 unselects all of the write column select lines WCSL0 to WCSL(2m−1). This turns off all of the four MOS transistors 11 to 14 in all of the write column select lines WCSL0 to WCSL(2m−1). As a result, the write global bit line WGBL is separated electrically from the local bit lines LBL0 to LBL3.

As a result, any one of the local bit lines LBL0 to LBL3 in each memory cell block is connected to the sense amplifier 70 via the second column selector RCS, read global bit line, and read selector 60.

Then, the change of the potential on the read global bit line RGBL is amplified by the sense amplifier 70, thereby reading the data. Specifically, for example, 2.0V is applied to the read global bit line RGBL0. Then, if the data written in the memory cell transistor MT connected to the selected word line WL0 and selected local bit line LBL0 is "1," current flows from the read global bit line RGBL0 to the source line. In contrast, if the written data is "0," no current flows.

As described above, the bit-line potential varying with the current flowing from the read global bit line RGGL0 to the source line is amplified by the sense amplifier 70, thereby reading the data. While in FIG. 32, the data has been read from one bit line, the data may be read from a plurality of read global bit lines simultaneously. In the read operation, the MOS transistors 42, 43 in all of the select circuits 41 are turned off and the bit lines BL0 to BLn are separated electrically from the latch circuits 51 and VPI and VNEG-PRG.

As described above, the 2Tr flash memory produces not only the effects in items (1) to (4) explained in the first embodiment but also the effects in the following items (5) to (7).

(5) The Operating Speed of the Flash Memory can be Improved.

With the configuration of the third embodiment, the bit lines are hierarchized into the local bit lines and the global bit lines (read global bit lines and write global bit lines). That is, a plurality of memory cells are connected to each of a plurality of local bit lines and a plurality of local bit lines are connected to each of a plurality of global bit lines. In the example of FIG. 25, 2(m−1) local bit lines (LBL0 and LBL1 or LBL2 and LBL3) are connected to a single write global bit line WGBL via the first column selector WCS. Then, four memory cells are connected to each of the local bit lines LBLs. In addition, 4(m−1) local bit lines (LBL0 to LBL3) are connected to a single read global bit line RGBL via the second column selector RCS. Then, four memory cells are connected to each of the local bit lines.

In a write operation, only the local bit line LBL connected to the selected memory cell is connected to the write global bit line WGBL. The local bit lines LBLs unconnected to the selected cell are separated electrically from the write global bit line WGBL by the write selector WSEL. What can be seen from a single write global bit line WGBL is only a single local bit line including the selected memory cell or only four memory cells. Thus, only the four memory cells MCs contribute to a parasitic capacitance on the write global bit line WGBL. The unselected memory cells which are in the same column as that of the selected memory cell and are connected to a different local bit line LBL do not contribute to the parasitic capacitance of the write global bit line. Thus, the parasitic capacitance on the write global bit line can be reduced remarkably. The same holds true for a read operation.

As described above, since the parasitic capacitances on the write global bit lines and read global bit lines are reduced, the operating speed of the flash memory is improved.

(6) The Reading Speed can be Improved.

In the flash memory, relatively high voltages, including VPP, VBB1 and VBB2, have to be used in a write operation. To meet this requirement, high-withstand-voltage MOS transistors with a thick gate insulating film have to be used. On the other hand, the voltage used in a read operation is lower than in a write operation. Thus, when only a read operation is considered, it is desirable that low-withstand-voltage MOS transistors with a thin gate insulating film should be used. From the viewpoint of operating speed, it is desirable to use low-withstand-voltage MOS transistors.

In this respect, with the configuration of the third embodiment, the local bit lines are connected to the write global bit line and read global bit line. Then, the memory cells are connected to the write circuit 50 via the write global bit line and to the sense amplifier 70 via the read global bit line. That is, the signal path in a write operation differs from the signal path in a read operation. Thus, in the signal path in a read operation, all of the circuits excluding the second column selector RCS connecting the read global bit line to the local bit lines can be formed of transistors with a thin gate insulating film. As a result, the reading speed can be improved.

(7) The Reliability of the Write Operation can be Improved.

As explained in item (5), the bit lines are hierarchized. When attention is particularly paid to the write path, a plurality of local bit lines are connected to a single write global bit line. Then, in a write operation, only a single local bit line including the selected memory cell is connected electrically to the write global bit line, and the remaining local bit lines are separated electrically from the write global bit line. Thus, the voltage corresponding to the writing data is not applied to the local bit lines unconnected to the selected memory. Therefore, the memory cells connected to the local bit lines are prevented from being written into erroneously, which helps improve the reliability of the write operation.

Figure 33:
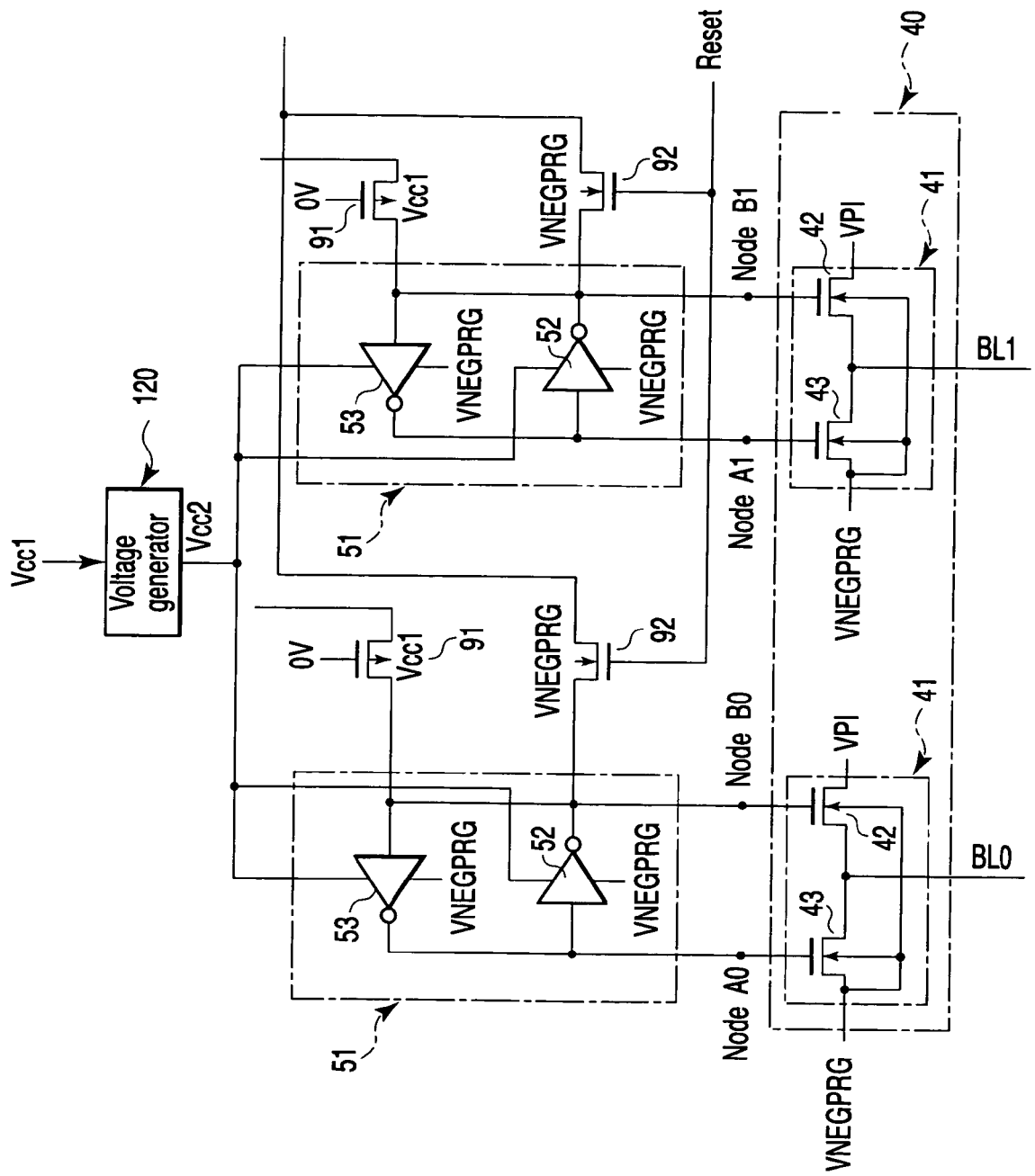
FIG. 33 is a circuit diagram of a write selector, a write circuit, a switch group, and a voltage generator circuit included in a flash memory according to a fourth embodiment of the present invention.

Next, a semiconductor memory device according to a fourth embodiment of the present invention will be explained. The fourth embodiment is such that the voltage of the high-voltage-side power supply for the inverters in the latch circuits in each of the first to third embodiments is generated inside an LSI. FIG. 33 is a circuit diagram of a part of the LSI according to the fourth embodiment, showing the write selector 40, write circuit 50, switch group 90, and voltage generator circuit 120.

As shown in FIG. 33, in the fourth embodiment, the voltage generator circuit 120 generates the positive voltage Vcc2 on the basis of the voltage Vcc1 inputted from the outside. The voltage Vcc2 is used as the high-voltage-side power supply for the inverters 52, 53.

The configuration of the fourth embodiment produces not only the effects in items (1) to (7) explained above but also the effects in the following item (8).

(8) The Reliability of the Write Operation can be Further Improved.

The externally inputted voltage Vcc1 is generally liable to vary significantly according to surrounding factors and therefore be unstable. In the fourth embodiment, the internal voltage Vcc2 generated by the voltage generator circuit 120 is used as the power-supply voltage for the inverters 52, 53. Therefore, the operation of the inverters becomes more stable and therefore the reliability of the write operation is improved.

Figure 34:
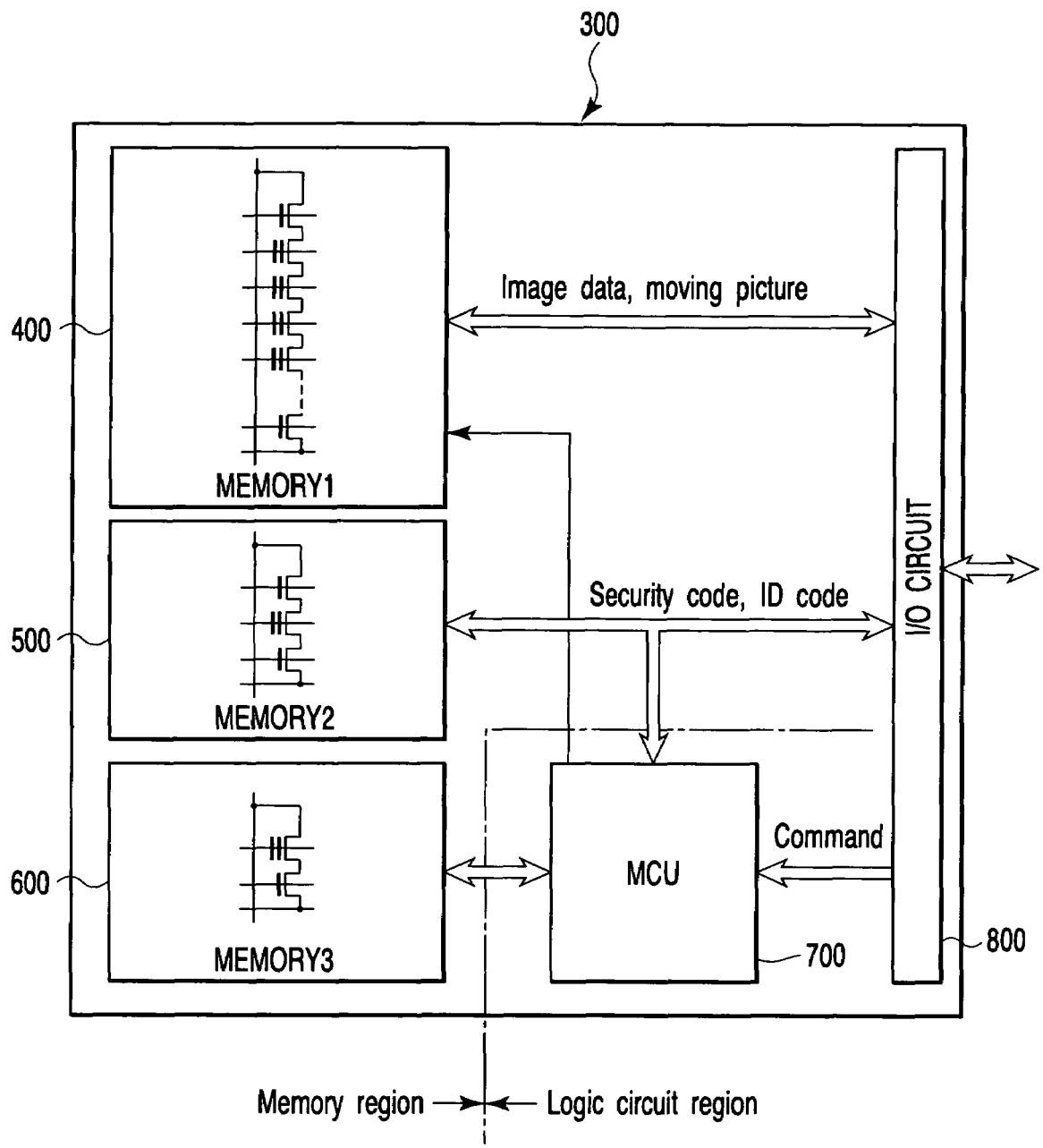
FIG. 34 is a block diagram of a system LSI according to a fifth embodiment of the present invention.

Next, a semiconductor memory device according to a fifth embodiment of the present invention will be explained. The fifth embodiment relates to a system LSI including a flash memory according to each of the first to fourth embodiments. FIG. 34 is a block diagram of the system LSI according to the fifth embodiment.

As shown in FIG. 34, the system LSI 300 comprises a NAND flash memory 400, a 3Tr-NAND flash memory 500, a 2Tr flash memory 600, an MCU 700, and an I/O (input/output) circuit 800 formed on a single semiconductor substrate.

The NAND flash memory 400 is used as a storage memory for storing image data or video data. Its configuration is as explained in the second embodiment.

The 3Tr-NAND flash memory 500 holds an ID code or a security code required to access the LSI 400. Its configuration is as explained in the first embodiment.

The 2Tr flash memory 600 holds program data required for the MCU 700 to operate. Its configuration is as explained in the third embodiment.

The MCU 700 does processing on the basis of the program read from the 2Tr flash memory 600, in response to various externally inputted commands. At this time, the MCU 700 accesses the 2Tr flash memory 600 directly without intervention of an SRAM (Static Random Access Memory) or the like. The processing done by the MCU 700 includes the compression or decompression of the data inputted to the NAND flash memory 400 and control of an external device. In addition, the MCU 700 reads specific data from the 3Tr-NAND flash memory 500, when the data held in the NAND flash memory 400 is accessed from the outside. Then, the MCU 700 checks the read-out data against the externally inputted ID code or security data. If they coincide with each other, the MCU 700 permits access to the NAND flash memory 400. When access to the NAND flash memory 400 is permitted, the data in the NAND flash memory 400 is accessed from the outside (host). Specifically, the MCU 700 triggers the NAND flash memory 400 in response to the command received from the outside, thereby reading (writing) the data.

The I/O circuit 800 controls the exchange of signals between the LSI 1 and the outside.

The LSI of the fifth embodiment produces not only the effects in items (1) to (8) but also the following effect.

(9) It is Possible to Embed a Plurality of Types of Flash Memories on a Single Chip, While Reducing the Manufacturing Cost.

The memory cell transistors MTs and select transistors ST1, ST2, ST included in the NAND flash memory 400, 3Tr-NAND flash memory 500, and 2Tr flash memory 600 are formed in the same processes. That is, the individual MOS transistors are formed in the same oxidizing process, film-forming process, impurity implanting process, and photolithographic etching process. As a result, the gate insulating film 240, the inter-gate insulating film 260, the floating gates 204 and control gates 206 of the memory cell transistors MTs, and the select gates 204, 206 of the select transistors are the same in the three flash memories 400, 500, 600. In such a manufacturing method, the memory cell arrays of the three flash memories can be formed by the number of processes required to form a single flash memory. Therefore, the manufacturing cost of the system LSI including three types of semiconductor memories can be reduced.

As described above, with a semiconductor memory device according to each of the first to fifth embodiments, use of the select circuits 41 enables a negative voltage to be used as the write inhibit voltage. The negative voltage can be changed according to the situation, which eliminates the necessity of measures against erroneous writing. As a result, the occurrence of erroneous writing can be suppressed effectively without decreasing the operating speed.

Figure 35:
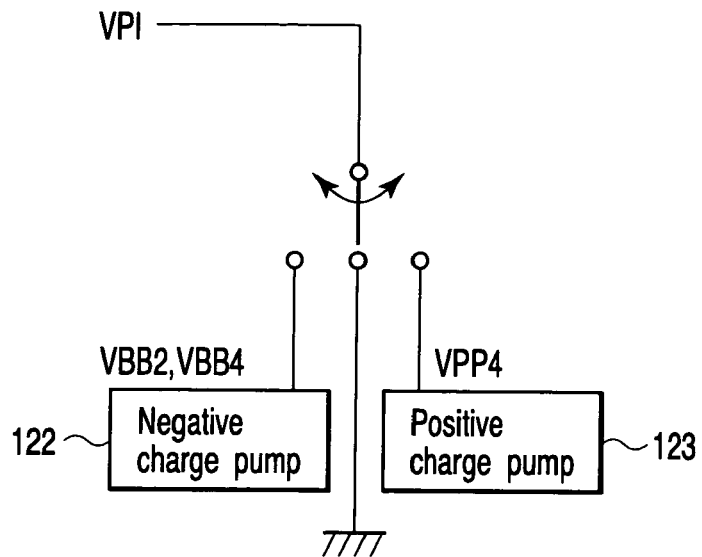
FIG. 35 is a block diagram of a charge pump circuit included in a flash memory according to a first modification of the first to fifth embodiments.
Figure 36:
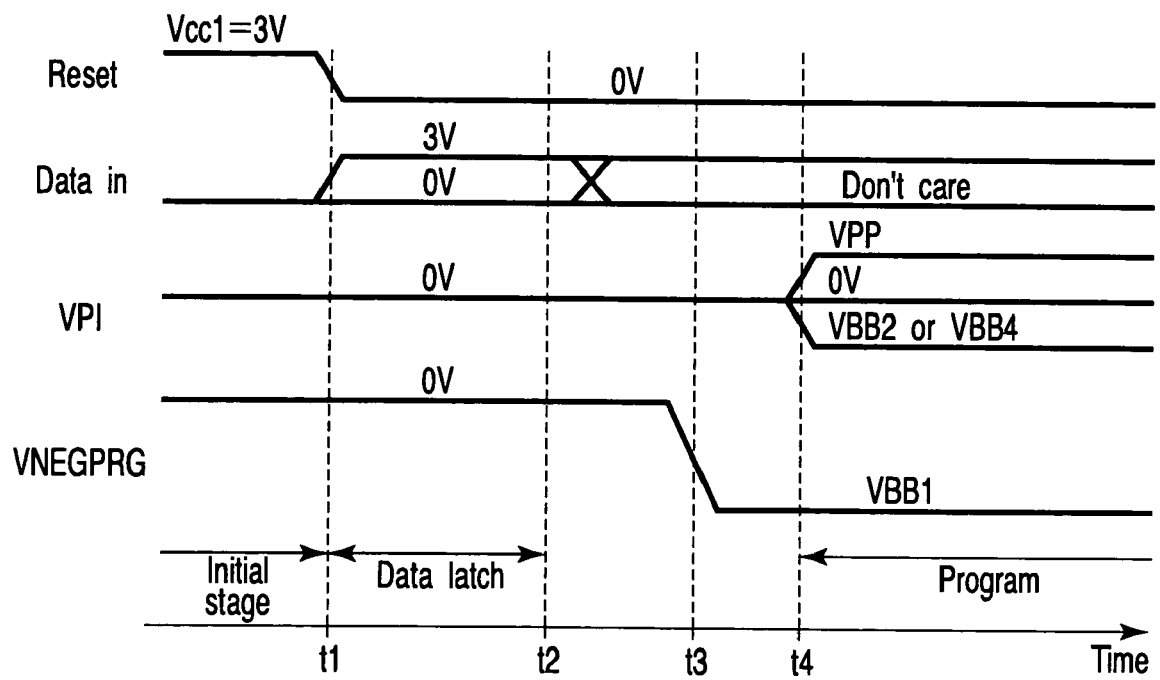
FIG. 36 is a timing chart for various signals in the flash memory according to the first modification of the first to fifth embodiments.

While in the first to fifth embodiments, only the negative voltage has been used as the write inhibit voltage VPI, not only the negative voltage but also a positive voltage or 0V may be used as the write inhibit voltage VPI. FIG. 35 shows a circuit configuration for such a case. FIG. 36 is a timing chart for VPI and VNEGPRG.

As shown in FIG. 35, the charge pump circuit 122 generates the negative potentials VBB2, VBB4. The charge pump circuit 123 generates the positive VPP4. The output nodes of the voltages and the ground potential are connected to the VPI node by a switch, which enables the suitable voltage for the situation to be used as the write inhibit voltage VPI.

Figure 37:
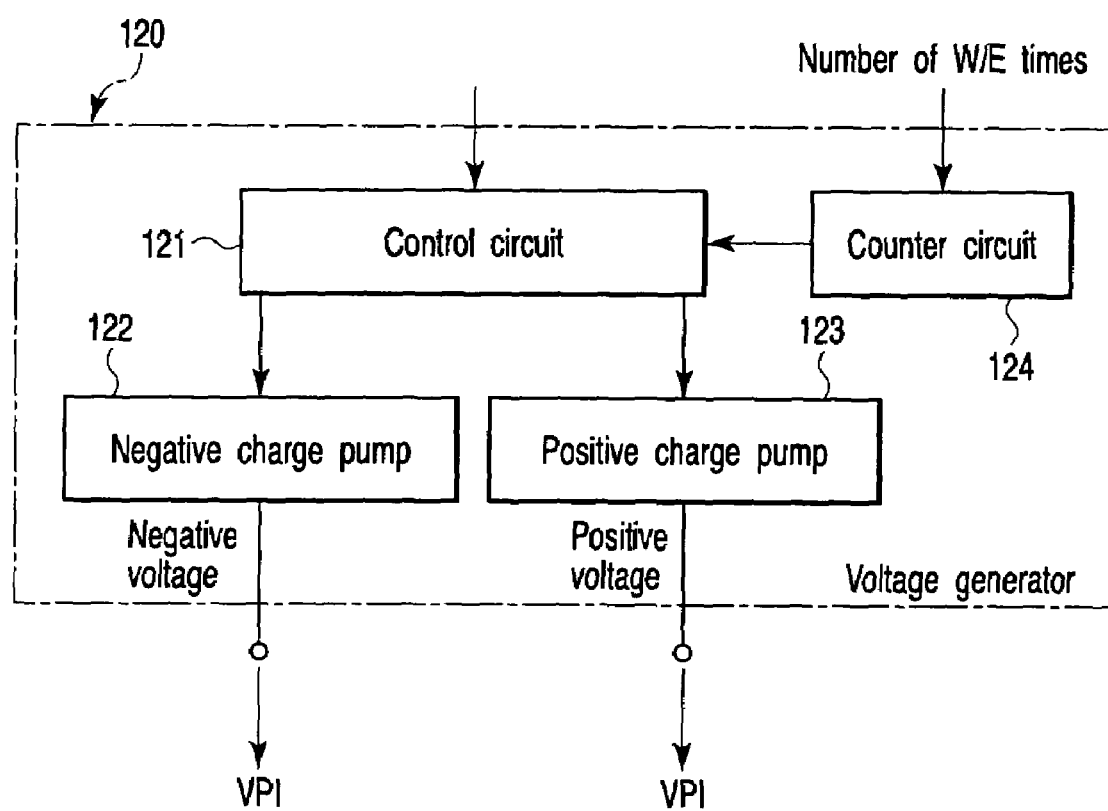
FIG. 37 is a block diagram of a voltage generator circuit included in a flash memory according to a second modification of the first to fifth embodiments.

The voltage used as the write inhibit voltage VPI may be determined on the basis of the number of times writing or erasing was done in the past. FIG. 37 shows the voltage generator circuit 120 having such a mechanism. As shown in FIG. 37, the voltage generator circuit 120 includes a counter circuit 124 as well as the control circuit 121 and the charge pump circuits 122, 123. The counter circuit 124 counts the number of times writing or erasing was done in the past. The control circuit 121 controls the charge pump circuits 122, 123 according to the count in the counter circuit 124 so as to generate a negative or positive voltage used as the write inhibit voltage VPI.

Figure 38:
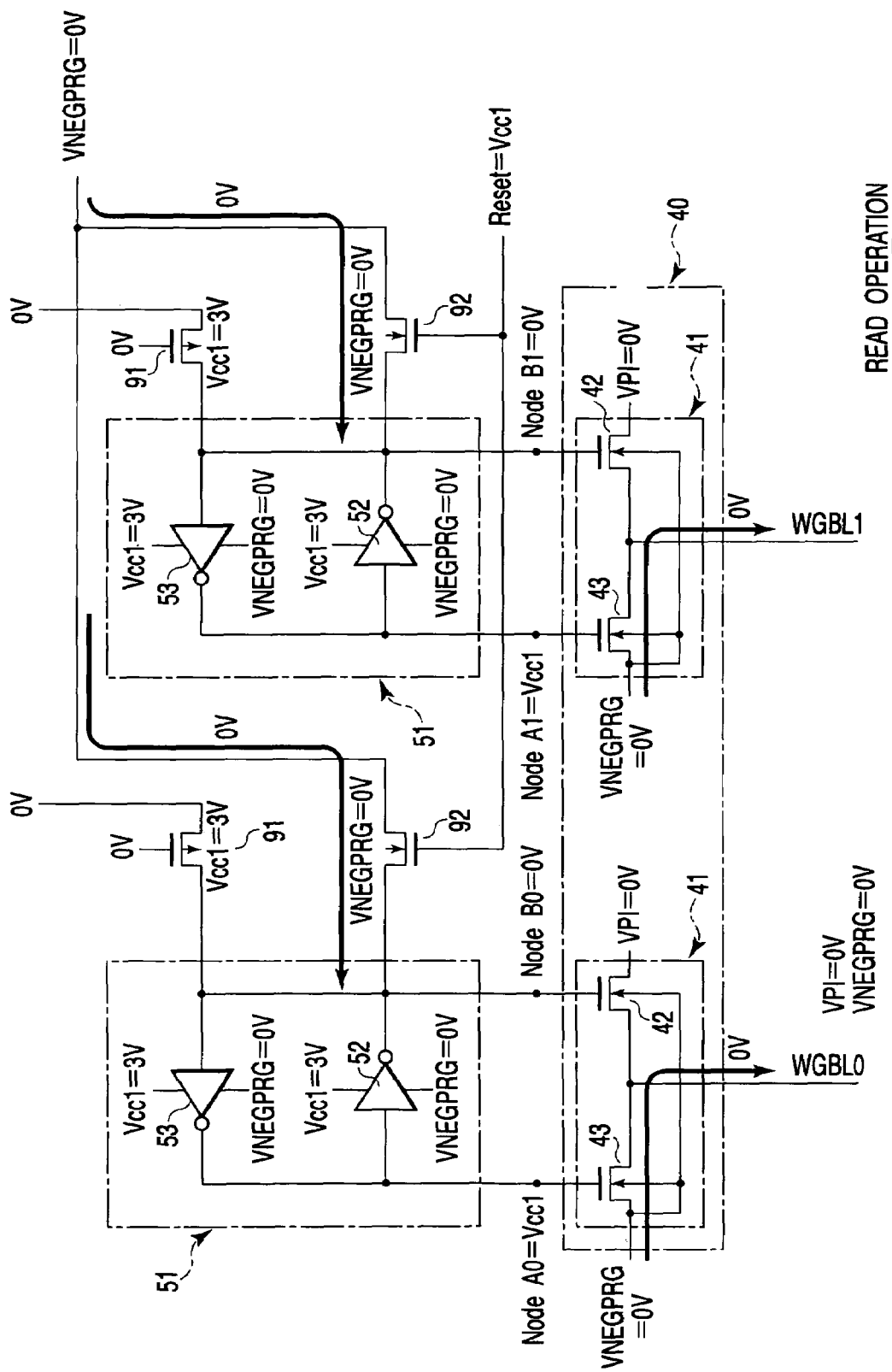
FIG. 38 is a circuit diagram of a write selector, a write circuit, and a switch group included in a flash memory according to a third modification of the first to fifth embodiments.

As explained in the third embodiment, when the bit lines are hierarchized, it is desirable that the write global bit lines should be set at 0V in a read operation. Therefore, as shown in FIG. 38, it is desirable that the write selector 40, write circuit 50, and switch group 90 should be set in the initial state. Setting them in the initial state enables the potentials of the write global bit lines to be set to 0V via the current paths of the MOS transistors 43. Keeping the write global bit lines at 0V prevents the read global bit lines from being affected by noise, which further stabilizes the read operation. Accordingly, the reliability of the read operation of the flash memory is improved.

In the third embodiment, the bit lines have been hierarchized into the global bit lines and the local bit lines. It goes without saying that the embodiment may be applied to a case where the bit lines are not hierarchized.

Figure 39:
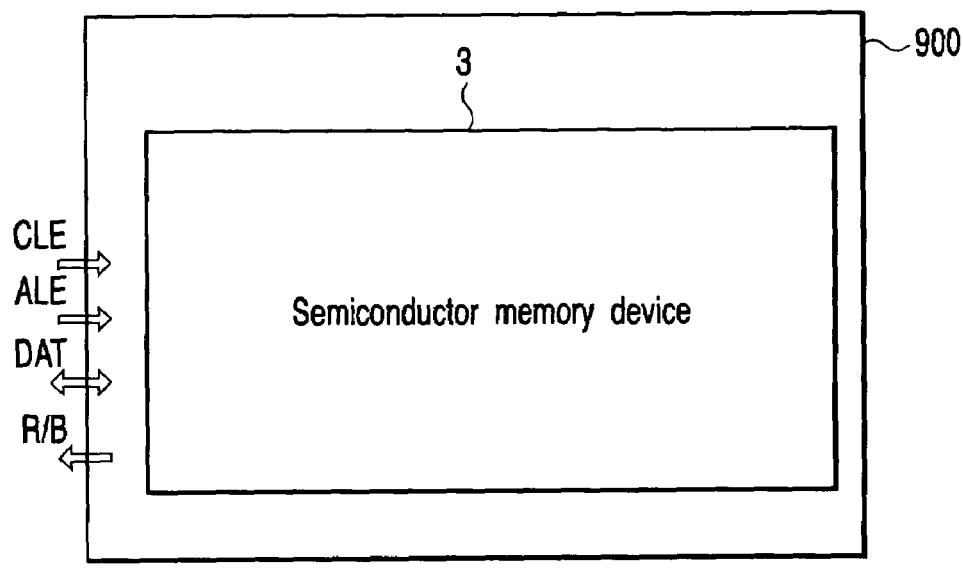
FIG. 39 is a block diagram of a memory card including a flash memory according to the first to fifth embodiments.

Next, an application of the semiconductor memory devices will be explained. FIG. 39 shows an example of a memory card. As shown in FIG. 39, the memory card 900 includes a flash memory 3 (3Tr-NAND flash memory, NAND flash memory, or 2Tr flash memory) explained in the first to fifth embodiments. The flash memory 3 receives specific control signals and data from an external unit (not shown). In addition, the flash memory 3 outputs specific control signals and data to the external unit.

A signal line (DAT), a command line enable signal line (CLE), an address line enable signal line (ALE) and a ready/busy signal line (R/B) are connected to the memory card 10 having the flash memory 3. The signal line (DAT) transfers data, address or command signals. The command line enable signal line (CLE) transfers a signal, which indicates that a command signal is transferred on the signal line (DAT). The address line enable signal line (ALE) transfers a signal, which indicates that an address signal is transferred on the signal line (DAT). The ready/busy signal line (R/B) transfers a signal, which indicates whether the memory device is ready, or not.

Figure 40:
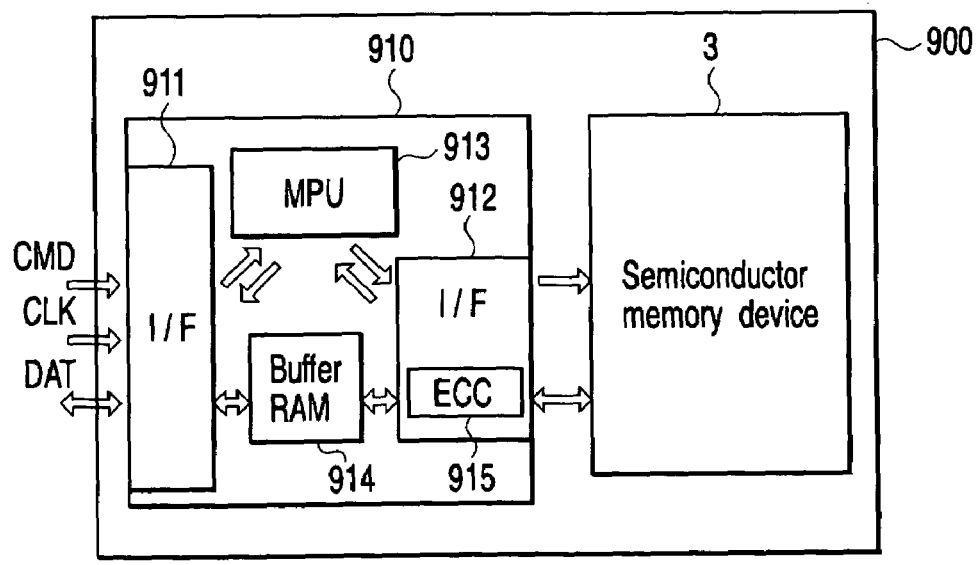
FIG. 40 is a block diagram of a memory card including a flash memory according to the first to fifth embodiments.

Another exemplary implementation is shown in FIG. 40. The memory card shown in FIG. 40 differs from the memory card presented in FIG. 39 in that the memory card of FIG. 40 includes, in addition to the memory device, a controller 910 which controls the flash memory 10 and receives/transfers predetermined signals from/to an external device (not shown).

The controller 910 includes interface units (I/F) 911, 912, a microprocessor unit (MPU) 913, a buffer RAM 914 and an error correction code unit (ECC) 915. The interface units (I/F) 911, 912 receives/outputs predetermined signals from/to an external device (not shown). The microprocessor unit 913 converts a logical address into a physical address. The buffer RAM 914 stores data temporarily. The error correction code unit 915 generates an error correction code. A command signal line (CMD), a clock signal line (CLK) and a signal line (DAT) are connected to the memory card 900. It should be noted that the number of the control signal lines, bit width of the signal line (DAT) and a circuit construction of the controller could be modified suitably.

Figure 41:
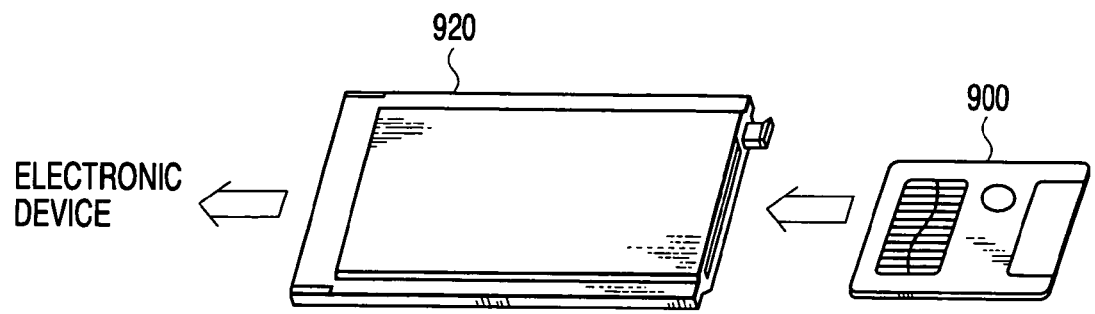
FIG. 41 shows the outward appearance of a memory card including a flash memory according to the first to fifth embodiments and a card holder.

FIG. 41 shows another application. As shown in FIG. 41, the memory card 900 is inserted into a cardholder 920, which is then connected to electronic equipment (not shown). The cardholder 920 may have a part of the function of the controller 910.

Figure 42:
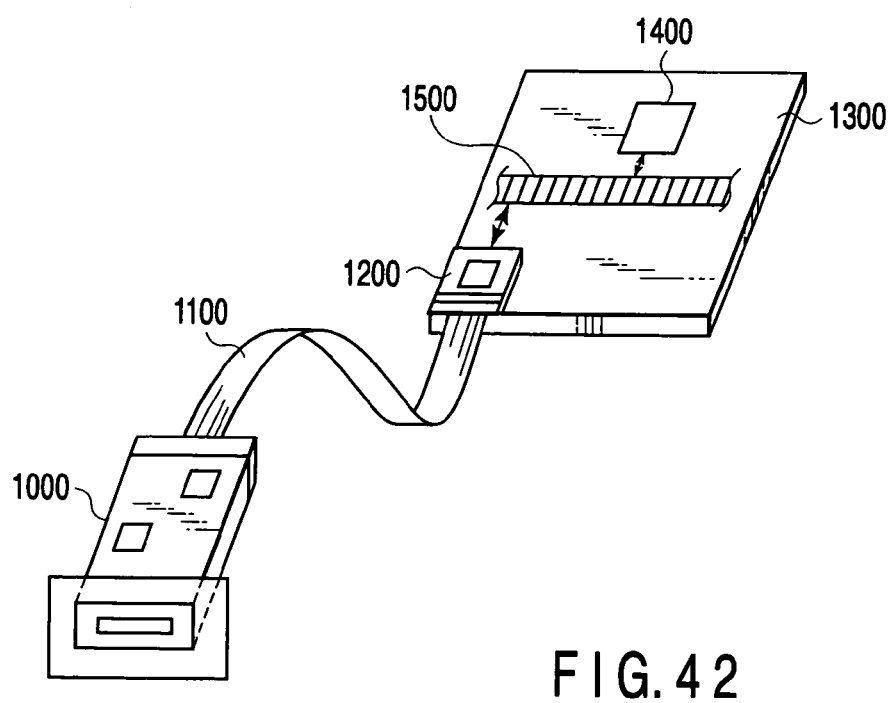
FIG. 42 shows the outward appearance of a connection unit which connects with a memory card including a flash memory according to the first to fifth embodiments.

FIG. 42 shows another application. As shown in FIG. 42, the memory card 900 or the cardholder 920 in which the memory card 900 has been inserted is inserted into a connection unit 1000. The connection unit 1000 is connected to a board 1300 via a connection cable 1100 and an interface circuit 1200. The board 1300 includes a CPU 1400 and a bus 1500.

FIG. 43 shows another application. The memory card 900 or the cardholder 920 in which the memory card 900 has been inserted is inserted into the connection unit 1000. The connection unit 1000 is connected to a personal computer 2000 via the connection cable 1100.

FIGS. 44 and 45 show another application. As shown in FIGS. 44 and 45, an IC card 2100 includes an MCU 2200. The MCU 2200 includes the flash memory 3 according to any one of the above embodiments, other circuits, including ROM 2300 and RAM 2400, and a CPU 2500. The IC card 2100 is connectable to the MCU 2200 via a plane connecting terminal 2600 connected to the MCU 2200 and provided on the IC card 2100. The CPU 2500 includes a computing section 2510 and a control section 2520 connected to the flash memory 3, ROM 2300, and RAM 2400. For example, the MPU 2200 is provided on one side of the IC card 2100 and the plane connecting terminal 2600 is provided on the other side.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   memory cells each of which has a first MOS transistor including a floating gate and a control gate and a second MOS transistor which has a drain connected to the source of a first MOS transistor;
   bit lines which are connected electrically to drains of the first MOS transistors, with a write inhibit voltage settable to be less than or equal to zero being applied to the bit lines unconnected to a selected memory cell in a write; and
   word lines which are connected to the control gates of the first MOS transistors, an electric potential of the word line connected to a selected memory cell being higher than an electric potential of a bit line connected to the selected memory cell in the write operation.

2. The semiconductor memory device according to claim 1, wherein the write inhibit voltage has a variable voltage value.

3. The semiconductor memory device according to claim 2, wherein the voltage value of the write inhibit voltage is variable according to at least one of the number of the write operations and the number of erase operations.

4. The semiconductor memory device according to claim 1, wherein each of the memory cells further includes a third MOS transistor which has a source connected to the drain of the first MOS transistor and a drain connected to the corresponding bit line, and
   the write inhibit voltage has a value that brings the third MOS transistors included in unselected memory cells into the cut-off state.

5. The semiconductor memory device according to claim 1, wherein the bit lines are brought electrically into the floating state in the erase operation.

6. A memory card comprising a semiconductor memory device recited in claim 1.

7. The memory card according to claim 6, further comprising a control circuit which controls the semiconductor memory device.

8. A semiconductor memory device comprising:
   memory cells each of which has a first MOS transistor including a floating gate and a control gate and a second MOS transistor which has a drain connected to a source of the first MOS transistor;
   a memory cell array in which the memory cells are arranged in a matrix;
   word lines each of which connects commonly the control gates of the first MOS transistors in a same row in the memory cell array;
   bit lines each of which connects commonly the drains of the first MOS transistors in a same column electrically in the memory cell array;
   latch circuits which are provided for the bit lines in a one-to-one correspondence and which hold write data, each of the latch circuit having an input node and an output node; and
   select circuits which are provided for the latch circuits in a one-to-one correspondence and which apply either a negative write voltage or a negatively settable write inhibit voltage to the bit lines according to the write data held in the latch circuits in the write operation.

9. The semiconductor memory device according to claim 8, wherein the write inhibit voltage has a variable voltage value.

10. The semiconductor memory device according to claim 9, wherein the voltage value of the write inhibit voltage is variable according to at least one of the number of write operations and the number of erase operations.

11. The semiconductor memory device according to claim 8, wherein
    each of the memory cells further includes a third MOS transistor which has a source connected to the drain of the first MOS transistor and a drain connected to the corresponding bit line,
    the write voltage has a value that brings the third MOS transistor included in a selected memory cell into the on state, and
    the write inhibit voltage has a value that brings the third MOS transistors included in unselected memory cells into the cut-off state.

12. The semiconductor memory device according to claim 8, wherein the select circuits separate the bit lines electrically from the latch circuits in an erase operation.

13. The semiconductor memory device according to claim 8, wherein
each of the select circuits includes a fourth MOS transistor which has a gate connected to the input node of the corresponding one of the latch circuits and a source applied with the write inhibit voltage, and
a fifth MOS transistor which has a gate connected to the output node of the corresponding one of the latch circuits, a source applied with the write voltage, and a drain connected to the drain of the fourth MOS transistor and to the corresponding one of the bit lines.

14. The semiconductor memory device according to claim 13, further comprising:
switch elements which transfer "1" data to the latch circuits; and
sixth MOS transistors which force the values of the input nodes of the latch circuits to be reset to specific values when the latch circuits are caused to hold "0" data,
wherein the write inhibit voltage is applied to the bit lines when the latch circuits hold "1" data and the write voltage is applied to the bit lines when the latch circuits hold "0" data.

15. A semiconductor memory device comprising:
memory cells each of which has a first MOS transistor including a floating gate and a control gate and a second MOS transistor which has a drain connected to a source of the first MOS transistor;
a memory cell array in which the memory cells are arranged in a matrix;
word lines each of which connects commonly the control gates of the first MOS transistors in a same row in the memory cell array;
bit lines each of which connects commonly drains of the first MOS transistors in a same column electrically in the memory cell array;
latch circuits which are provided for the bit lines in a one-to-one correspondence and which hold write data, each latch circuit having an input node and an output node;
a voltage conversion circuit which converts a first voltage capable of being externally applied into a second voltage and which supplies the second voltage as a power-supply voltage to the latch circuits; and
select circuits which are provided for the latch circuits in a one-to-one correspondence and which apply either a write voltage or a write inhibit voltage to the bit lines according to the write data held in the latch circuits in a write operation.

16. The semiconductor memory device according to claim 15, wherein the write inhibit voltage has a variable voltage value.

17. The semiconductor memory device according to claim 16, wherein the voltage value of the write inhibit voltage is variable according to at least one of the number of write operations and the number of erase operations.

18. The semiconductor memory device according to claim 15, wherein each of the memory cells further includes a third MOS transistor which has a source connected to the drain of the first MOS transistor and a drain connected to the corresponding bit line,
the write voltage has a value that brings the third MOS transistor included in a selected memory cell into the on state, and
the write inhibit voltage has a value that brings the third MOS transistors included in unselected memory cells into the cut-off state.

19. The semiconductor memory device according to claim 15, wherein the select circuits separate the bit lines electrically from the latch circuits in an erase operation.

20. The semiconductor memory device according to claim 15, wherein each of the select circuits includes a fourth MOS transistor which has a gate connected to the input node of the corresponding one of the latch circuits and a source applied with the write inhibit voltage, and
a fifth MOS transistor which has a gate connected to the output node of the corresponding one of the latch circuits, a source applied with the write voltage, and a drain connected to the drain of the fourth MOS transistor and to the corresponding one of the bit lines.

21. The semiconductor memory device according to claim 20, further comprising:
switch elements which transfer "1" data to the latch circuits; and
sixth MOS transistors which force the values of the input nodes of the latch circuits to be reset to specific values when the latch circuits are caused to hold "0" data,
wherein the write inhibit voltage is applied to the bit lines when the latch circuits hold "1" data and the write voltage is applied to the bit lines when the latch circuits hold "0" data.

* * * * *